(12) United States Patent
Oda et al.

(10) Patent No.: US 6,724,019 B2
(45) Date of Patent: Apr. 20, 2004

(54) MULTI-LAYERED, SINGLE CRYSTAL FIELD EFFECT TRANSISTOR

(75) Inventors: Katsuya Oda, Hachioji (JP); Katsuyoshi Washio, Tokorozawa (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 09/824,225

(22) Filed: Apr. 3, 2001

(65) Prior Publication Data

US 2001/0045604 A1 Nov. 29, 2001

(30) Foreign Application Priority Data

May 25, 2000 (JP) .......................... 2000-159544

(51) Int. Cl.[7] .................. H01L 31/0328; H01L 31/0336; H01L 31/117
(52) U.S. Cl. ................... 257/195; 257/616; 257/194
(58) Field of Search ................... 257/338, 192, 257/194, 195, 616

(56) References Cited

U.S. PATENT DOCUMENTS 6,350,993 B1 * 2/2002 Chu et al. .............. 257/192

FOREIGN PATENT DOCUMENTS

EP 0307850 * 3/1989 ............ 257/195

OTHER PUBLICATIONS

König et al., "p–Type SiGe Channel Modulation Doped Field–Effect Transistors with Post–Evaporation Patterned Submicrometre Schottky Gates," IEEE Electronics Letters, vol. 29, No. 5, Mar. 4, 1993, pp. 486–488.

König et al., "p–Type Ge–Channel MODFET's with High Transconductance Grown on Si Substrates," IEEE Electron Device Letters, vol. 14, No. 4, Apr. 1993, pp. 205–207.

König et al., "Enhancement Mode–n–Channel Si/SiGe MODFET with High Intrinsic Transconductance," IEEE Electronics Letters, vol. 28, No. 2, Jan. 16, 1992, pp. 160–162.

Sadek et al., "Design of Si/SiGe Heterojunction Complementary Metal–Oxide–Semiconductor Transistors," IEEE Transactions on Electron Devices, vol. 43, No. 8, Aug. 1996, pp. 1224–1232.

* cited by examiner

*Primary Examiner*—Steven Loke
(74) *Attorney, Agent, or Firm*—Reed Smith LLP; Stanley P. Fisher, Esq.; Juan Carlos A. Marquez, Esq.

(57) ABSTRACT

A semiconductor device having an MODFET and at least one other device formed on one identical semiconductor substrate, in which an intrinsic region for the MODFET is formed by selective growth in a groove formed on a semiconductor substrate having an insulation film on the side wall of the groove, and single-crystal silicon at the bottom of the groove, is disclosed. The step between the MODFET and the at least one other device mounted together on one identical substrate can be thereby decreased, and each of the devices can be reduced in the size and integrated to a high degree, and the interconnection length can be shortened to reduce power consumption.

8 Claims, 37 Drawing Sheets

MULTI-LAYERED, SINGLE CRYSTAL FIELD EFFECT TRANSISTOR

REFERENCE TO FOREIGN PRIORITY APPLICATIONS

This application claims priority to Japanese Patent Application No. P2000-159544.

BACKGROUND OF THE INVENTION

1. Field of the Invention

The present invention relates to a semiconductor device having a modulation doped field effect transistor and a manufacturing method thereof, and, more particularly, to a semiconductor device in which a modulation doped field effect transistor having a channel formed in a multi-layered film comprising single-crystal silicon and single-crystal silicon-germanium, and at least one MOSFET or a bipolar transistor, are realized on one identical substrate, and a manufacturing method thereof.

2. Description of the Background

Existing p-type modulation doped field effect transistors (pMODFET), in which a p-channel is formed in a multi-layered film comprising single-crystal silicon and single-crystal silicon-germanium, are described, for example, in Electronics Letters, 1993, vol. 29, p. 486 ("document 1"). A cross sectional structure of an existing pMODFET is shown in FIG. 45 of document 1.

In FIG. 45, reference numeral 101 denotes a silicon substrate, wherein a buffer layer 102 comprising single-crystal silicon is formed on the silicon substrate 101. A carrier supply layer 103 comprising p-type single-crystal silicon and a spacer layer 104 comprising single-crystal silicon are formed on the buffer layer 102, and a p-type channel layer 105 comprising single-crystal silicon-germanium and a cap layer 106 comprising single-crystal silicon are successively formed. Since the lattice constant of single crystal germanium is larger by about 4% than the lattice constant of single-crystal silicon, the single-crystal silicon-germanium layer undergoes compressive strain by being put between the single-crystal silicon layers. As a result, since it forms a well layer of lower energy relative to holes in a valance band, holes supplied from the carrier supply layer 103 are collected in the channel layer 105 to form a two-dimensional hole gas to conduct transistor operation. After forming gate electrodes 107 and 108, boron ion is selectively implanted to form a source 109 and a drain 110. Then, the periphery of the transistor is etched to form electrodes 111 to the source and the drain.

For pMODFET, an example of using a buffer layer comprising single-crystal silicon-germanium and forming a channel layer of higher germanium content than the buffer layer is also reported, for example, in IEEE Electron Device Letters 1993, vol. 14, p. 205, wherein a buffer layer with a germanium content of 70% is formed, on which a channel layer comprising single crystal germanium is formed between the carrier supply layer and the barrier layer. Improvement for the mobility in the channel is intended by increasing the germanium content as described above.

In the same manner, an existent n-type modulation doped field effect transistor, (nMODFET) in which an n-channel is formed in a multi-layered film comprising single-crystal silicon and single-crystal silicon-germanium, is described, for example, in Electronics Letters, 1992, vol. 28, p. 160. FIG. 46 shows the cross sectional structure of the existent nMODFET.

In FIG. 46, reference numeral 101 denotes a silicon substrate, wherein a buffer layer 112 comprising single-crystal silicon-germanium is formed on the silicon substrate 101. The buffer layer 112 constitutes a virtual substrate having a lattice constant inherent to silicon-germanium at the surface, for which good crystallinity is required on the surface. When single-crystal silicon-germanium is epitaxially grown on a single-crystal silicon substrate, since it tends to grow at an identical atom distance with that in the substrate, the single-crystal silicon-germanium layer undergoes compressive strain and the lattice constant in the grown plane is the same as the lattice constant of single-crystal silicon. Then, it is necessary to positively introduce dislocation for relieving the strain in order to eliminate the effect of single-crystal silicon of the substrate. For example, when the germanium content is changed so as to be 5% on the side of the silicon substrate and 30% on the side of the surface with the thickness of the silicon-germanium layer of 1.5 $\mu$m, dislocation can be confined only within the inside of the buffer layer 112 to make the crystallinity favorable at the surface. A second buffer layer 113 comprising single-crystal silicon-germanium and having the same germanium content as that on the surface of the buffer layer 112 is formed on the buffer layer 112 to form a barrier layer to carriers. Then, a channel layer 114 comprising single-crystal silicon, a spacer layer 115 comprising single-crystal silicon-germanium, and a carrier supply layer 116 comprising n-type single-crystal silicon-germanium, are formed. With such a multi-layered film structure, since the single-crystal silicon layer 114 grows with the lattice constant of single-crystal silicon-germanium, it undergoes tensile strain. As a result, the energy to electrons in the conduction band is lowest in the single-crystal silicon channel layer 114, and electrons supplied from the carrier supply layer 116 formed by way of the spacer layer 115 are stored in the channel layer 115 to form two-dimensional electron gas. A cap spacer layer 117 comprising single-crystal silicon-germanium, and a cap layer 118 comprising single-crystal silicon as the surface protection film, are formed on the surface. Gate electrodes 119 and 120 are formed, and a source 111 and a drain 112 are formed by implantation of phosphorus ion. Finally, by etching the periphery of the transistor, the multi-layered film comprising the single-crystal silicon and single-crystal silicon-germanium as the intrinsic region of the transistor, is fabricated into an island shape, and electrodes 123 to the source and the drain are formed adjacent to the island shape.

Further, nMODFET and pMODFET formed simultaneously in the multi-layered film of single-crystal silicon and single-crystal silicon-germanium in a complementary type is described, for example, in IEEE Transactions on Electron Devices, 1996, vol. 43, p. 1224. FIG. 47 shows a cross sectional shape of the existent complementary modulation doped field effect transistor (cMODFET).

In FIG. 47, reference numeral 101 denotes a silicon substrate, and a buffer layer 124 comprising p-type single-crystal silicon-germanium is formed on the silicon substrate 101. A virtual substrate of satisfactory crystallinity with the lattice constant being the same as that of the single-crystal silicon-germanium layer is formed by relaxing the strain due to the difference of the lattice constant between the silicon substrate 101 and the buffer layer 124 only at the inside of the buffer layer 124. An n-well 125 is formed by ion implantation of n-type dopant only in the region of the forming pMODFET. On the buffer layer 124, are successively laminated a spacer layer 126 comprising single-crystal silicon-germanium having the same germanium content as that of the buffer layer, an n-type carrier supply layer 127 comprising n-type single-crystal silicon-germanium also having the same germanium content, a second spacer layer 128 comprising single-crystal silicon-germanium, an n-type channel layer 129 comprising single-crystal silicon, and a p-type channel layer 130 comprising single-crystal silicon-germanium with a higher germanium content than that on the surface of the buffer layer 124. After covering the surface with a cap layer 131 comprising single-crystal silicon and a silicon oxide film 132, a gate electrode 133 is formed. Using the gate electrode as a mask, a p-type dopant is ion implanted into the region for forming the pMODFET deeper than the p-type channel layer 130, to form a source 134 and a drain 135 of pMODFET, while n-type dopant is ion implanted in the region forming nMODFET deeper than the n-type channel layer 129, to form a source 136 and a drain 137 of nMODFET.

Further, a field effect transistor (FET) forming a channel layer by selective epitaxial growth is described, for example, in Japanese Patent Laid-Open Hei 5-74812. FIG. 48 shows a cross sectional structure of this existent FET.

In FIG. 48, a reference numeral 101 denotes a silicon substrate, and a field oxide film 138 is formed on the silicon substrate 101. A high concentration n-type polycrystalline silicon layer 139, and a gate isolation insulation film 140, are selectively formed on the field oxide film 138, and an opening is disposed in a gate region. A silicon nitride film 141 is formed on the side wall of the opening, and the field oxide film 138 is side-etched to form an overhang of the high concentration n-type polycrystalline silicon 139. Since the silicon substrate 101 is exposed at the bottom of the opening, a channel layer 142 comprising single-crystal silicon-germanium is formed therein and, at the same time, a polycrystalline silicon-germanium layer 143 is deposited from the overhang bottom of the high concentration n-type polycrystalline silicon 139. Then, by selectively forming a single-crystal silicon layer 144 and a polycrystalline silicon layer 145 simultaneously and selectively, source and drain lead electrodes, and a channel layer 142 comprising high concentration n-type polycrystalline silicon, are automatically joined. After selectively forming an insulation film 146 on the side wall of the opening, a single-crystal silicon layer is epitaxially grown, and source and drain take out portions are opened to the gate isolation insulation film 140 and, finally, electrodes 148 are formed.

In a MODFET in which the channel layer is formed utilizing the heterostructure of single-crystal silicon and single-crystal silicon-germanium, a relatively thick buffer layer is necessary for relaxing the strain of silicon-germanium. In the existent MODFET described hereinabove, since a buffer layer or a multi-layered film comprising silicon and silicon-germanium is formed over the entire surface of the wafer, it is necessary to remove the buffer layer and the multi-layered film for mounting together with MOSFET or bipolar transistor in the method of the prior art. FIG. 49 and FIG. 50 show the result of a study on the process flow in a case of mounting an existent pMOD-FET with a silicon nMOSFET on one identical substrate. A p-well 151 and an n-well 152 are formed each by ion implantation to a portion of a silicon substrate 150 (refer to FIG. 49(a)). Then, a buffer layer 153 comprising a single-crystal silicon-germanium layer and a multi-layered film 154 comprising single-crystal silicon and single-crystal silicon-germanium, is epitaxially grown on the entire surface of the silicon substrate 150 (refer to FIG. 49(b)). In this case, since the single-crystal silicon surface is exposed on the entire surface of the silicon substrate 150, the buffer layer 153 and the multi-layered film 154 are grown as a single crystal layer for the entire surface. Then, the buffer layer 153 and the multi-layered film 154 are removed while leaving a region for forming the p-MODFET. In this case, a step between nMOSFET and pMODFET corresponds to the thickness of the buffer layer 153 and the multi-layered film 154 of silicon and silicon-germanium of pMODFET, plus a step formed to the silicon substrate 150 by etching (refer to FIG. 49(c)).

Then, a gate insulation film 155, a gate electrode 156, and a gate side wall insulation film 157 are formed to pMODFET, and a gate insulation film 158, a gate electrode 159, and a gate side wall insulation film 160 are formed to nMOSFET (refer to FIG. 50(a)). Finally, 1)-type dopant is selectively ion implanted to form a source 161 and a drain 162 of pMODFET, and n-type dopant is selectively ion implanted to form a source 163 and a drain 164 of nMOS-FET (refer to FIG. 50(b)).

Further, the result of study on the process flow in a case using a field insulation film and a device isolation insulation region is shown in FIG. 51 and FIG. 52. A field insulation film 165 in a region other than the region forming an intrinsic region for nMOSFET and pMODFET is formed on a silicon substrate 150, and a device isolation insulation film 166 is formed for isolation of the transistors (refer to FIG. 51(a)). Then, p-type and n-type dopants are ion implanted to the regions for forming nMOSFET and pMODFET, to form a p-well 151 and an n-well 152 respectively (refer to FIG. 51(b)). Then, a buffer layer 153 and a multi-layered film 154 comprising single-crystal silicon and single-crystal silicon-germanium are formed on the entire surface of the substrate by epitaxial growth. In this process, a multi-layered film of a single crystal silicon-germanium layer and a single-crystal silicon layer is formed on the silicon substrate, and a multi-layered film of a polycrystalline silicon-germanium layer and a polycrystalline silicon layer are formed on the field insulation film 165 and the device isolation insulation film 166 (refer to FIG. 51(c)). In the region forming nMOSFET, since the surface of the silicon substrate 150 has to be exposed, the multi-layered film 154 comprising silicon and silicon-germanium and the buffer layer 153 are removed while leaving the region forming pMODFET (refer to FIG. 52(d)). After forming a gate insulation film 155, a gate electrode 156 and a gate side wail insulation film 157 to pMODFET, and forming a gate insulation film 158, a gate electrode 159 and a gate side wall insulation film 160 to nMOSFET, p-type dopant is selectively ion implanted to form a source 161 and a drain 162 of pMODFET, and n-dopant is selectively ion implanted to form a source 163 and a drain 164 of nMOSFET (refer to FIG. 52(b)). As the result, the step between pMODFET and nMOSFET corresponds substantially to the thickness of the buffer layer 153 and the multi-layered film 154 comprising silicon amid silicon-germanium.

As can be seen from the processes hereinabove, when MODFET and other devices, such as a MOSFET, are mounted together on one identical substrate, a step at least for the thickness of the buffer layer and the multi-layered film comprising silicon and silicon-germanium is formed by the removal of the region other than the intrinsic region for MODFET. If the step increases, it results in a problem upon forming a pattern for gate electrodes or interconnections by photolithography, in that the focal point does not align and the pattern can be resolved depending on the wavelength of light and the pattern size used for exposure. In a case of using i-ray at a wavelength of 365 nm, since the focal depth is about 1.7 $\mu$m for the resolution of a pattern with a minimum size of 0.5 $\mu$m, and the focal depth is about 1.0 $\mu$m for the resolution of a pattern with a minimum size of 0.2

μm, the size for the gate has to be increased if a step such as that hereinabove is formed. Accordingly, this results in a difficulty for shortening the gate length, thereby bringing about a problem that high performance of transistors can not be attained. Further, when other devices are prepared after forming the buffer layer and the multi-layered film comprising silicon and silicon-germanium in MODFET, since the amount of heat treatment increases in the deposition of the insulation film or the like, the dopant diffuses from the carrier supply layer to the channel layer. As a result, since carriers scatter against dopant ions during operation of the transistor, a difficulty in increasing the operation speed and decreasing noise occurs. On the contrary, when MODFET is formed to a substrate on which MOSFET or bipolar transistor has been previously formed, when a thick buffer layer deposited on the entire surface of the substrate is removed, it results in a problem that damage due to etching applied to the previously formed device deteriorates device performance. As a counter measure, when a protection film to etching is formed, since steps such as deposition of the protection film, removal of the protection film in the region for forming MODFET and formation of an opening to the protection film for contact are additionally required, the number of steps increases, thereby dramatically increasing the cost.

Therefore, the need exists for a technique to reduce the resulting step size in MODFET formation, and to thereby relieve the problem of higher than desired effective gate length which limits transistor performance. It is also desirable to reduce the heat treatment used in devices other than MODFETs, and to thereby reduce the resulting dopant diffusion which limits MODFET device speed and increases device noise. Also, it is desirable to reduce damage and resulting performance loss which occurs during the steps of deposition and removal of protection films in formation of devices other than MODFETs, thereby improving MODFET performance and lowering costs.

SUMMARY OF THE INVENTION

The present invention is directed to a semiconductor device in which a modulation doped field effect transistor having a channel formed in a multi-layered film comprising single-crystal silicon and single-crystal silicon-germanium, and at least one MOSFET or a bipolar transistor, are realized on one identical substrate, and a manufacturing method thereof, wherein the step between each of the device forming regions on the substrate is small and the amount of heat treatment is reduced, so that high speed operation and reduction of noise is possible, and which one substrate device combination can be manufactured at a high throughput (yield).

In accordance with an embodiment of the present invention, the step between each of the devices can be eliminated, even in a case of mounting MOSFET and MODFET on one identical semiconductor substrate, by forming a groove to a semiconductor substrate and burying an intrinsic region of a modulation doped field effect transistor (MODFET) in the groove, so that gate electrodes or interconnections can be formed collectively in each of device forming regions with a reduced pattern size, without causing the problems in the photolithography described hereinabove.

Further, after forming the intrinsic region of MODFET, since the gate insulation film, the gate electrode and the like can be formed to each of the devices in one identical step, diffusion of dopant from the carrier supply layer to the channel layer can be suppressed, without increasing the amount of unnecessary heat treatment to increase the operation speed and decrease the noise of MODFET. Further, since the buffer layer is formed in the groove of the semiconductor substrate by selective growth while covering the portion other than the lateral side of the groove and the MOD-forming region with an insulation film, there is no requirement for removing the buffer layer in other device forming regions, and degradation of characteristics of other devices can be avoided.

Further, since a channel layer utilizing the carrier confinement effect by a heterojunction is disposed in the multi-layered film comprising single-crystal silicon and single-crystal silicon-germanium, and doping is not conducted to the channel layer but only to the carrier supply layer isolated by the spacer layer in the intrinsic region of MODFET, the carriers do not scatter against dopant ions, so that mobility of carriers can be improved. Further, since the channel is disposed at the heterojunction boundary, scattering with the boundary level caused by crystal defects is not formed by forming the heterojunction having good crystallinity, so that noise of MODFET can be reduced.

Further, since the channel is formed in the single-crystal silicon-germanium layer undergoing compressive strain in pMODFET and in the single-crystal silicon layer undergoing tensile strain in nMODFET, the energy level is divided due to the effect of strain to decrease interband scattering, so that mobility of carriers in the channel can be increased.

In a case wherein a silicon-germanium hetero bipolar transistor (SiGeHBT) and a modulation doped field effect transistor (MODFET) are mounted together on one identical semiconductor substrate, the same effect as in a case of mounting MOSFET together described hereinabove can be obtained by forming a plurality of grooves for each of the devices in a semiconductor substrate and burying the collector layer of SiGeHBT and the buffer layer of MODFET respectively into the grooves. Those and other advantages and benefits of the present invention will become apparent from the detailed description of the invention hereinbelow.

BRIEF DESCRIPTION OF THE SEVERAL VIEWS OF THE DRAWING

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in the typical construction of semiconductor devices. Those of ordinary skill in the art will recognize that other elements are desirable and/or required in order to implement the present invention. However, because such elements are well known in the art, and because they do not facilitate a better understanding of the present invention, a discussion of such elements is not provided herein.

Examples of a semiconductor device and a manufacturing method thereof according to the present invention are explained hereinbelow specifically with reference to the accompanying drawings.

<Embodiment 1>

Figure 1:
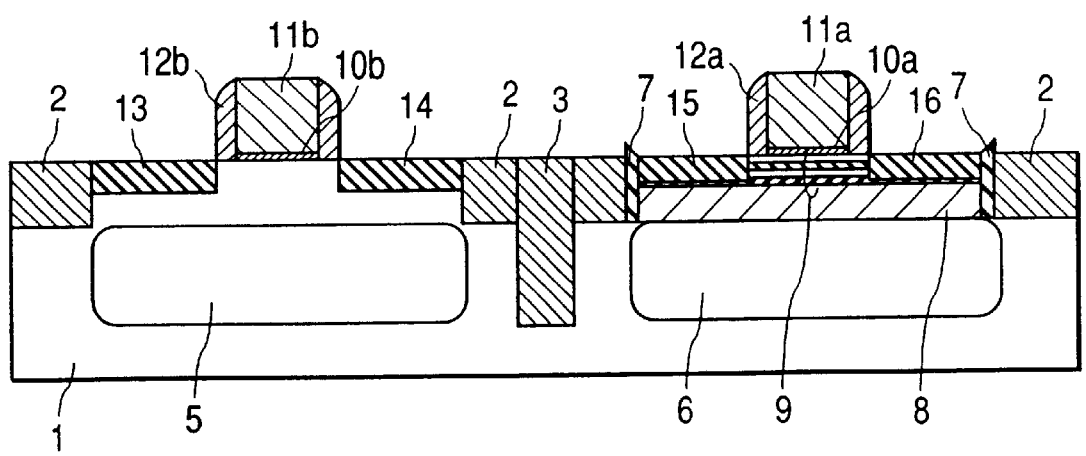
FIG. 1 is a cross sectional view illustrating a first embodiment of a semiconductor device according to the present invention.

FIG. 1 is a cross sectional structural view illustrating a first embodiment of a semiconductor device according to the invention, in which pMODFET and nMOSFET are formed on one identical substrate.

The pMODFET formed on the silicon substrate 1 comprises an n-well 6, a buffer layer 8, a multi-layered film 9 comprising single-crystal silicon and single-crystal silicon-germanium, a gate insulation film 10a, a gate electrode 11a, a source 15 and a drain 16. The nMOSFET comprises a p-well 5, a gate insulation film 10b, a gate electrode 11b, a source 13 and a drain 14.

A method of manufacturing the semiconductor device of the structure shown in FIG. 1 is explained with reference to FIG. 2.

Figure 2A:
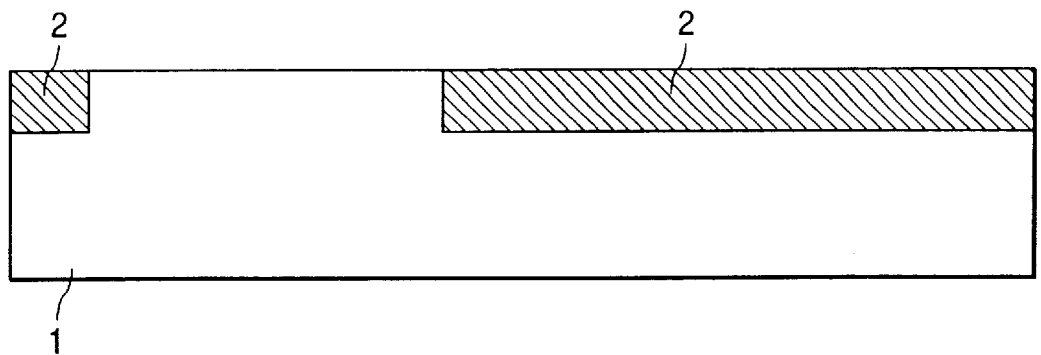
FIG. 2 is an enlarged cross sectional view illustrating a manufacturing method of a semiconductor device according to the present invention shown in FIG. 1 in the order of steps.
Figure 2B:
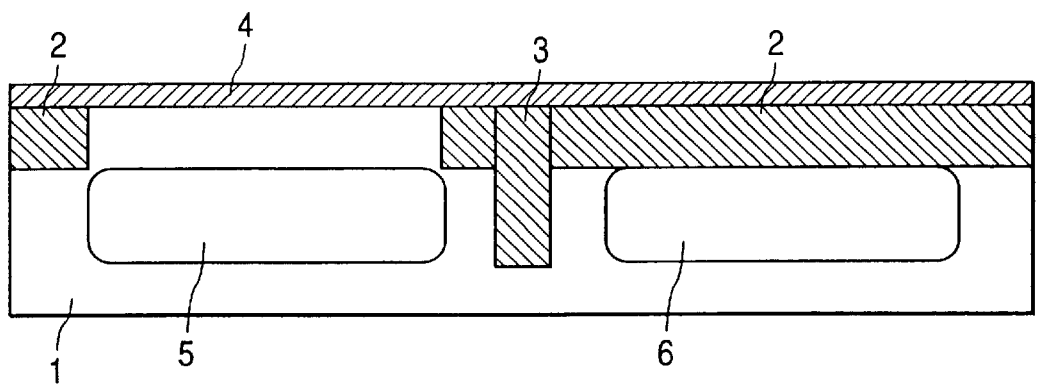

A field insulation film 2 is formed selectively on a silicon substrate 1 (refer to FIG. 2(a)). The field insulation film 2 can be formed, for example, by a method of etching the silicon substrate 1 to form a step, then depositing a silicon oxide film and partially exposing the surface of the silicon substrate 1 by using chemical mechanical polishing, or by a LOCOS method of forming a nitride film only on a portion of substrate 1 where a silicon surface is exposed, and oxidizing another portion of the substrate.

Then, a groove is formed as a boundary with an adjacent device, and an insulation material is buried in the groove to form a device isolation region 3. Other material buried in the groove of the device isolation region 3 may be a laminate of an insulation film and/or polycrystalline silicon.

The field oxide film 2 and the device isolation region 3 may be identical in additional exemplary embodiments described hereinbelow.

Then, an insulation film 4 is formed over the entire surface. Since the insulation film 4 is used as a mask material for selective epitaxial growth subsequently, it is preferably made of a silicon oxide film, which allows for high selectivity. Then, p-type dopant is selectively ion implanted into a region for forming nMOSFET, to thereby form a p-well 5, and an n-well 6 is formed by selectively ion implanting n-dopant in a region for forming pMODFET (refer to FIG. 2(b)).

Figure 2C:
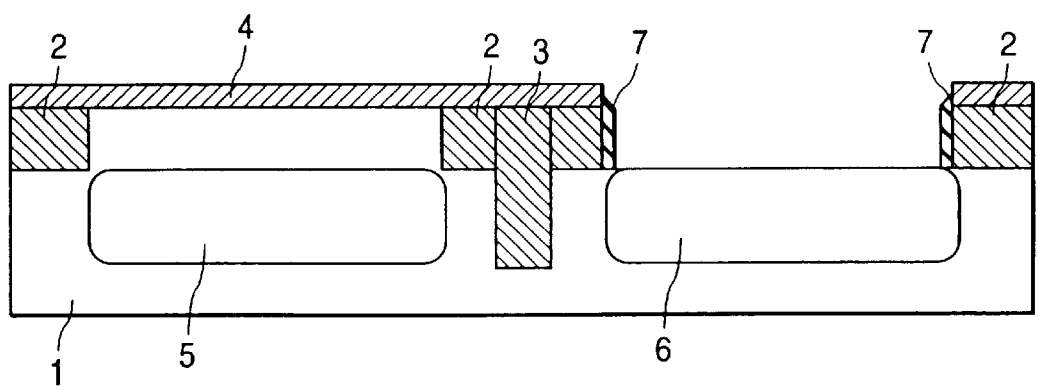

Then, an opening is formed to the insulation film 4 and the field oxide film 2 for forming an intrinsic region of pMODFET, and a silicon nitride film 7 is formed selectively on the side wall of the opening (refer to FIG. 2(c)).

Figure 3A:
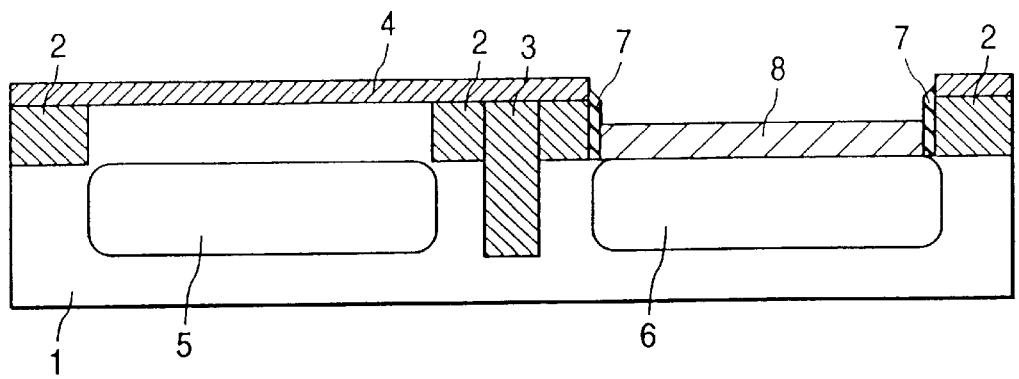
FIG. 3 is an enlarged cross sectional view illustrating the steps after FIG. 2 successively.

Then, a buffer layer 8, comprising single-crystal silicon-germanium, is formed by selective epitaxial growth on the silicon substrate 1 exposed at the bottom of the opening (refer to FIG. 3(a)). In the buffer layer 8, germanium content is increased from the silicon substrate 1 to the surface. A virtual substrate having favorable crystallinity at the surface and a lattice constant with a value of the single-crystal silicon-germanium layer is formed by relaxing strain due to the difference of the lattice constant between the single-crystal silicon and single-crystal silicon-germanium layer only ill the inside of the buffer layer 8. For example, when the germanium content is increased uniformly from 5% on the side of the silicon substrate 1 to 30% on the side of the surface, a crystal plane in which the strain is completely relaxed ill the inside is obtained at the thickness of the buffer layer 8 of about 1.5 μm. Further, when the germanium content is increased not uniformly, but stepwise, the thickness of the buffer layer 8 can be reduced to obtain a satisfactory crystal surface with a thickness of about 1.0 μm.

The shape of the single-crystal silicon layer or the single-crystal silicon-germanium layer formed by selective growth is explained hereinbelow. FIG. 4 shows a cross sectional shape of a single crystal layer formed by selective epitaxial growth.

Figure 4A:
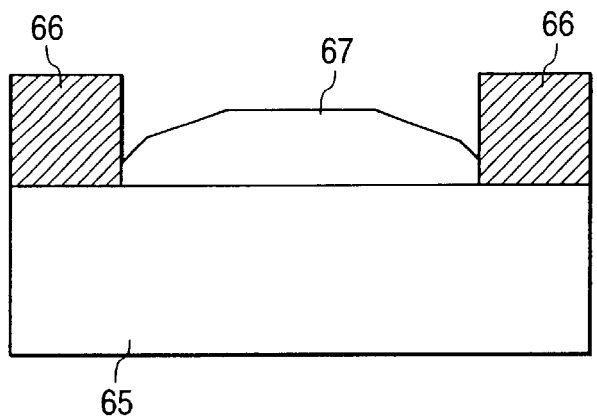
FIG. 4 is an enlarged cross sectional view illustrating the shape of a single-crystal silicon or single-crystal silicon-germanium layer formed by selective epitaxial growth.
Figure 4B:
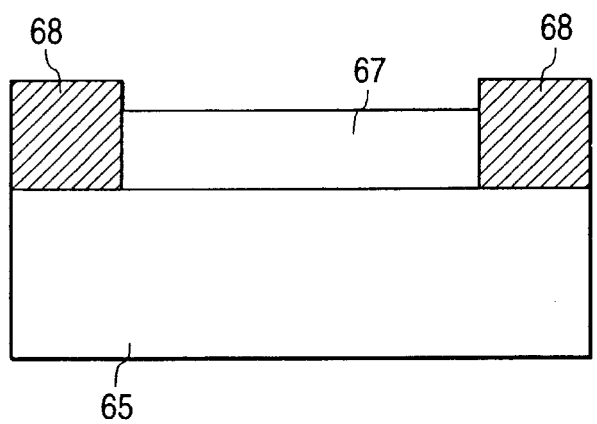

As shown in FIG. 4(a), when a single-crystal silicon layer or a single-crystal silicon-germanium layer 67 is formed by selective epitaxial growth in an opening of a silicon oxide film 66 formed on a silicon substrate 65, a crystal plane having a determined crystal orientation is formed from the boundary between the silicon substrate 65 and the silicon oxide film 66. The typical crystal planes can include (111) plane and (311) plane. On the silicon oxide film 66, source gas for silicon and the surface molecules are reacted to cause to take place the following reaction. For example, reduction reactions are caused such as:

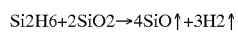
$$Si_2H_6 + 2SiO_2 \rightarrow 4SiO\uparrow + 3H_2\uparrow$$

when disilane (Si2H6) is used as the source gas for silicon,

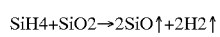
$$SiH_4 + SiO_2 \rightarrow 2SiO\uparrow + 2H_2\uparrow$$

when silane (SiH4) is used as the source gas for silicon and, further

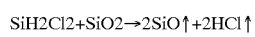
$$SiH_2Cl_2 + SiO_2 \rightarrow 2SiO\uparrow + 2HCl\uparrow$$

when dichlorosilane is used as the source gas. Further, this is similar for germane (GeH4) used as the source gas for germanium. The reduction reaction for the germane is:

$$GeH_4 + SiO_2 \rightarrow SiO\uparrow + GeO\uparrow + 2H_2\uparrow$$

The reduction reactions described above are a portion of various reactions and, in addition, a reduction reaction between radical molecules put into a high energy state by the decomposition of the source gas and the oxide film also exists. As a result, on the oxide film, etching by the reduction reaction and deposition caused by the decomposition of the source gas proceed simultaneously, and the relation between etching and deposition changes depending on the growing temperature and pressure. Since there is a limit for the film thickness for maintaining the selectivity only by the reduction reaction, in a case wherein a relatively thick single-crystal silicon layer or a single-crystal silicon-germanium layer is selectively grown epitaxially, a halogenous gas such as a chlorine gas (Cl) or hydrochloride gas (HCl) is added in addition to the source gas to etch the silicon layer itself. The reaction can include, in addition to the above results, for example,

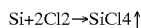

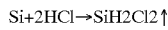

as a result of the simultaneous processing of the reactions, since silicon or silicon-germanium is not deposited on the silicon oxide film while the selectivity is maintained, growth does not occur at the boundary between the silicon substrate 65 and the silicon oxide film 66. When the growth does not proceed at the boundary, the (111) plane or (311) plane is stable due to reducing energy potential by the reconstruction of the surface atoms generated, and facet increases in accordance with the progress of growth on the (100) plane present at the center of the opening.

Since the reduction reaction by the source gas described above is a reduction reaction to the silicon oxide film, the reduction reaction is not present, for example, on a silicon nitride film. Accordingly, when an opening having a silicon nitride film 68 on the side wall is formed on the silicon substrate 65, the selectivity is lowered compared with the silicon oxide film, so that polycrystalline silicon or polycrystalline silicon-germanium tends to be deposited on the silicon nitride film. However, in view of the generation of the facet, since the selectivity is lowered, growth proceeds at the boundary between the silicon substrate 65 and the silicon nitride film 68 when epitaxial growth continues, so that a single-crystal silicon or a single-crystal silicon-germanium layer 67 is grown in contact with the silicon nitride film (refer to FIG. 4(b)). At the boundary with the silicon nitride film 68, the facet may sometimes occur due to the low surface energy and slow growth rate, but the size is extremely small compared with the opening of the silicon oxide film.

As described hereinabove, a buffer layer with retained generation of the facet can be formed by epitaxially growing single-crystal silicon-germanium selectively in the opening of the field oxide film 2 having the nitride film 7 on the side wall. Alternatively, the field insulation film 2 may be formed of a silicon nitride film. In this case, it is not necessary to form the silicon nitride layer on the side wall.

Conditions for selective epitaxial growth are explained hereinbelow. For epitaxial growth of single-crystal silicon or single-crystal silicon-germanium, a solid source MBE (Molecular Beam Epitaxy) method, CVD (Chemical Vapor Deposition) method or gas source MBE method can be used, and the CVD method or the gas source MBE method is more suitable for achieving selective growth.

In the CVD method, a source gas for silicon or germanium and a doping gas is supplied to the surface of a substrate, and the source gas and the doping gas are decomposed, for example, by heating or UV-rays, to form a single crystal layer on the substrate. As the source gas for silicon, a silicon hydride or chloride gas including monosilane (SiH4) or dichlorosilane (SiH2Cl2) can be used. As the source gas for germanium, germanium hydride and chloride gas such as germane (GeH4) can be used. Further, as the doping gas, a hydride gas of group III element and group V element such as diborane (B2H6) or phosphine (PH3) can be used. Further, the source gas and the doping gas can also be diluted with hydrogen or the like. Further, for conducting selective growth, it is necessary to add a halogenous gas, such as a chlorine gas (Cl2) or hydrogen chloride gas (HCl), for etching silicon nuclei deposited on a mask material for selective growth such as the silicon oxide film or silicon nitride film, as described above. When SiH2Cl2 is supplied at a flow rate of 20 ml/min, and the germane is supplied at a flow rate of 1 ml/min, under an epitaxial growth temperature of 750 degrees C., and a growth pressure of $5 \times 10^4$ Pa, the amount of HCl flow rate required for not depositing polycrystalline silicon-germanium on the silicon oxide film and the silicon nitride film is from 20 to 80 ml/min. If the HCl flow rate is less, the selectivity is lost, and polycrystalline silicon-germanium starts to deposit on the mask material. On the other hand, if the HCl flow rate is excessive, the single-crystal silicon-germanium layer is not grown. Further, at a temperature range of 600 degrees C. or higher, single-crystal silicon or single-crystal silicon-germanium starts to grow, and at an upper limit of about 900 degrees C., crystal defects start to be formed. Within the temperature range described above, the pressure for growth may be 1000 Pa or higher at which the gas is supplied uniformly on the substrate, and the upper limit for the pressure is 101,320 Pa or lower for growth while exhausting the gas. For attaining selective growth under the growth temperature and the growth pressure described above, it is necessary to select such a gas flow rate that provides a region wherein etching by the halogenous gas is more effective than deposition by the source gas on the mask material, and, simultaneously, deposition is more effective than etching on the single crystal substrate.

On the other hand, in the gas source MBE method, epitaxial growth is possible at a lower temperature, and with good controllability, as compared with the CVD method, for which a gas of higher reactivity, such as disilane (Si2H6), is suitable. The doping gas is identical with that in the CVD method. Further, for selective growth, halogenous gas, such as Cl2 or HCl, can be added, similarly to the CVD method. Under the epitaxial growth temperature of 575 degrees C., and the growth pressure of 1 Pa at a flow rate of disilane of 2 ml/min and a flow rate of germane of 4 ml/min, the flow rate of HCl required for not depositing polycrystalline silicon-germanium on the silicon oxide film and the silicon nitride film is from 5 to 10 ml/min. If the flow rate of HCl is lower than the level described above, the selectivity is lost and polycrystalline silicon-germanium starts to be deposited on the mask material. On the other hand, if the flow rate of HCl is more than the level described above, surface morphology of the single-crystal silicon-germanium layer is worsened. Further, the temperature range is 500 degrees C. or higher at which satisfactory selectivity is obtained for the silicon oxide film, and the silicon nitride film and polycrystalline silicon, and the upper limit is within a range of 800 degrees C. or lower wherein the surface morphology is favorable. The growing pressure within the temperature range described above is at 0.1 Pa or higher where the growing rate is restricted by the reaction at the surface, and the upper limit is at 100 Pa or lower at which reaction in the gas phase occurs.

In the embodiments hereinbelow, selective epitaxial growth conditions for single-crystal silicon or single-crystal silicon-germanium are preferably identical.

Figure 3B:
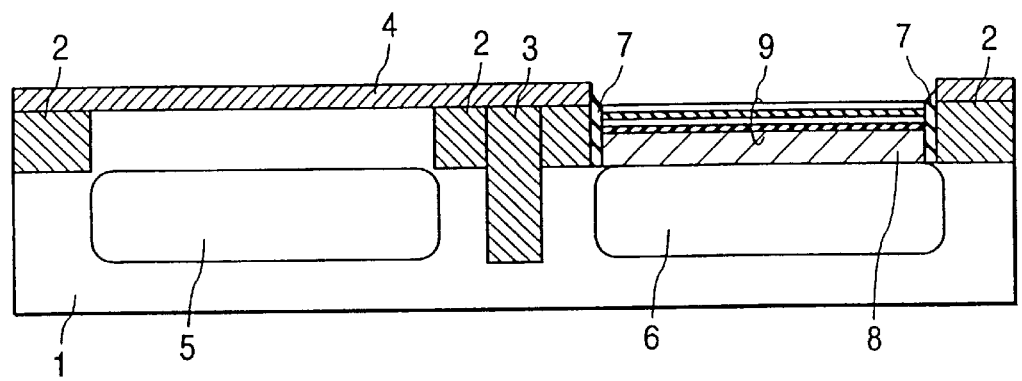
Figure 5:
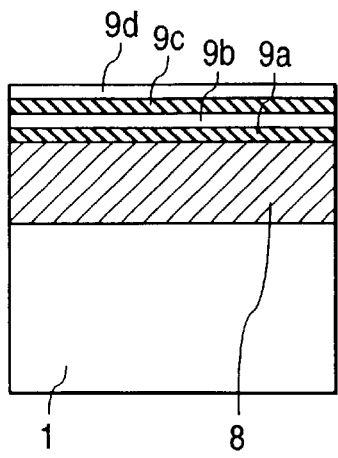
FIG. 5 is a fragmentary enlarged cross sectional view illustrating an intrinsic region of pMOSFET of the semiconductor device shown in FIG. 1.
Figure 6:
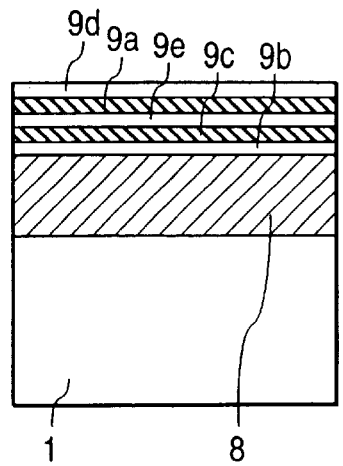
FIG. 6 is a fragmentary enlarged cross sectional view illustrating an intrinsic region of pMOSFET of the semiconductor device shown in FIG. 1.

Then, a multi-layered film 9 comprising Single-crystal silicon and single-crystal silicon-germanium is formed on the buffer layer 8 by selective epitaxial growth in the same manner as the method of forming the buffer layer 8 (refer to FIG. 3(b)). FIG. 5 shows an enlarged view of an intrinsic region in pMODFET. At first, a carrier supply layer 9a containing a p-type dopant is formed by selective epitaxial growth on the buffer layer 8. In the carrier supply layer 9a, the germanium content may be made equal with the value on the side of the surface of the buffer layer, and the concentration of the dopant may be $1 \times 10$ cm$-3$ or less ill order to suppress the diffusion to the channel layer. The thickness is suitable at 1 nm or more where the controllability for the epitaxial growth is preferred. A spacer layer 9b comprising single-crystal silicon-germanium as a barrier layer for confining carriers is formed. In the spacer layer, the germanium content may be made equal with a value on the side of the surface of the buffer layer 8, and the thickness may be within a range from 1 nm where the controllability for epitaxial growth is favorable to 50 nm where carriers are supplied to the channel layer. The channel layer 9c is put to a state undergoing compressive strain by making the germanium content higher than the spacer layer 9b. For example, the channel layer undergoes the compressive strain by defining the germanium content of the channel layer to 50% relative to the germanium content of 30% in the spacer layer 9b, and the valence band changes. As a result, the energy to the holes of the valence band in the channel layer is lowered to form a quantum well structure, so that carriers supplied from the carrier supply layer 9a are stored in the well layer to form two-dimensional hole gases. The thickness of the channel layer may be 1 nm or more where the controllability for epitaxial growth is favorable. A cap layer 9d forming a barrier layer for the carriers and comprising single-crystal silicon for protecting the silicon-germanium layer is formed on the channel layer. The thickness for the cap layer is suitably from 1 nm, where the controllability for epitaxial growth is favorable, to 50 nm at which carrier can be controlled in the channel layer for the control from the gate electrode. In the embodiment shown in FIG. 5, the carrier supply layer 9a is present between the channel layer 9c and the buffer layer 8, but the carrier supply layer 9a may be on the side of the upper surface relative to the channel layer 9c. FIG. 6 shows an enlarged view for an intrinsic region for a pMODFET of this case. The spacer layer 9b, the channel layer 9c, the second spacer layer 9e, the carrier supply layer 9a and the cap layer 9d may be grown successively from the side of the buffer layer 8.

Figure 3C:
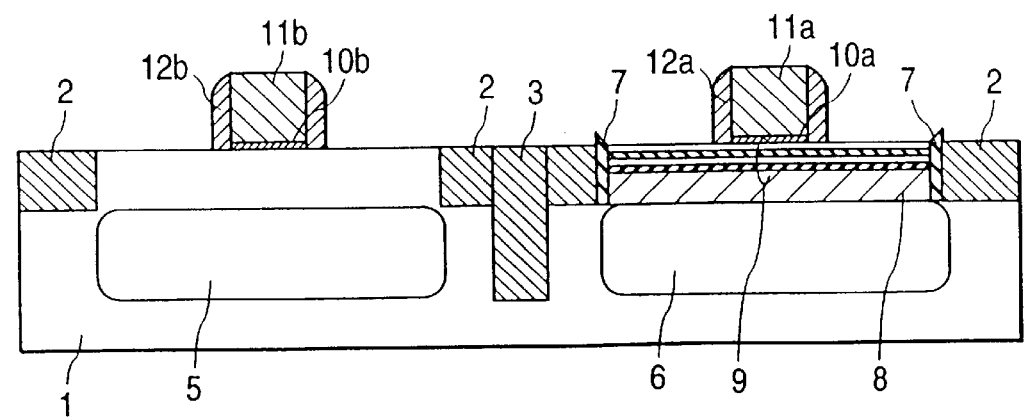

After forming the multi-layered film 9 comprising single-crystal silicon and single-crystal silicon-germanium by selective epitaxial growth to the intrinsic region for the pMODFET, the gate insulation film 10 and the gate electrode 11 are deposited over the entire surface, the gate and the electrode 11 are anisotropically etched to form gate—source and gate—drain isolation insulation film 12 to the side wall of the gate electrode (refer to FIG. 3(c)).

Finally, a source 13 and a drain 14 of an nMOSFET are formed by selectively ion implanting an n-type dopant to the region of the nMOSFET. In the same manner, a structure as shown in FIG. 1 can be obtained wherein a source 15 and a drain 16 are formed by selectively ion implanting a p-type dopant to the region of the pMODFET in the same manner.

Figure 7:
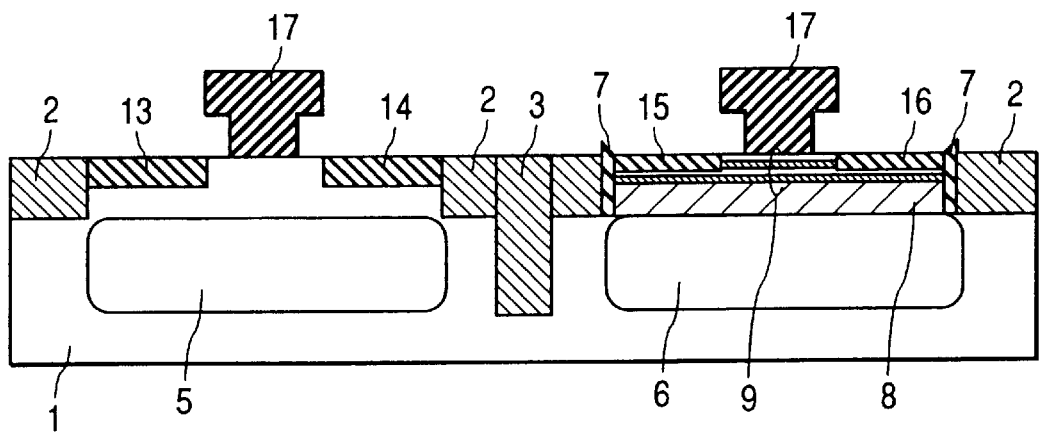
FIG. 7 is a cross sectional view illustrating a structure of a first embodiment of a semiconductor device according to the present invention in which a gate is formed by Schottky junction.

The gate structure may not be the MOS structure as described above. FIG. 7 shows a cross sectional view of a semiconductor device in which nFET and a pMODFET each having a Schottky gate are mounted together on one identical substrate. After forming a multi-layered film 9 comprising single-crystal silicon and single-crystal silicon-germanium by selective epitaxial growth to an intrinsic region for the pMODFET, resist is coated over the entire surface and an opening of the resist is formed in the gate region. An electrode 17 is formed only to the gate portion by vapor depositing a metal as the gate electrode and removing the resist. For the gate structure, not only the MOS structure or a Schottky structure for both of n-type and p-type transistors can be used, and the gate structures can be selected independently of each other.

Since the nMOSFET and the pMODFET can be formed on one identical substrate in this embodiment, the mutual conductance of the p-type transistor can be balanced with that of the n-type transistor without increasing the size of the device, the parasitic capacitance can be decreased and the operation speed can be increased. Further, the high speed performance can be balanced between the n-type and p-type transistors, which facilitates the design for the circuit constituted with both of the transistors to improve the performance of the system. Further, since the carriers are not scattered by impurity and interface states in the channel layer, the circuit noise can be reduced for the pMODFET. Further, since there is no step between the nMOSFET and the pMODFET, the size for both of the devices can be reduced further to improve the circuit performance. Further, since there is no step, the transistors can be integrated easily, so that the power consumption can be reduced. Accordingly, it is possible to attain a circuit of high speed operation, low capacitance and reduced noise, which is effective for increasing the operation speed and improving the performance of the system using the circuit.

<Embodiment 2>

Figure 8:
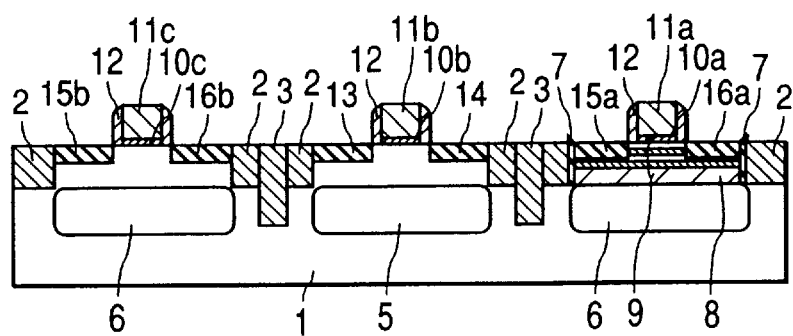
FIG. 8 is a cross sectional view illustrating a second embodiment of a semiconductor device according to the present invention.

FIG. 8 is a cross sectional structural view illustrating a second embodiment of a semiconductor device according to the present invention, which is an example forming a pMODFET and cMOSFETs on one identical substrate.

A pMODFET formed on a silicon substrate 1 comprises an n-well 6, a buffer layer 8, a multi-layered film 9 comprising single-crystal silicon and single crystal silicon-germanium, a gate insulation film 10a, a gate electrode 11a, a source 15a and a drain 16a. On the other hand, in cMOSFETs, an nMOSFET comprises a p-well 5, a gate insulation film 10b, a gate electrode 11b, a source 13 and a drain 14, while a pMOSFET comprises an n-well 6, a gate insulation film 10c, a gate electrode 11c, a source 15b and a drain 16b.

For pMOSFET and pMODFET, substantially all the steps can be made in common except for the formation of the buffer layer 8 and the multi-layered film 9 comprising single-crystal silicon and single-crystal silicon-germanium. This enables a complementary circuit by using the pMOSFET for the portion not particularly requiring high speed operation or reduction of parasitic resistance, and applying the pMODFET only for a portion requiring high speed operation and combining the same with nMOSFET. The system to which such a constitution is applicable can include, for example, high frequency IC or high speed processor IC for mobile communication use.

According to this embodiment, since a high speed pMODFET can be used in accordance with the portion applied in the system, the performance of the system can be improved in addition to the effects of Embodiment 1.

<Embodiment 3>

Figure 9:
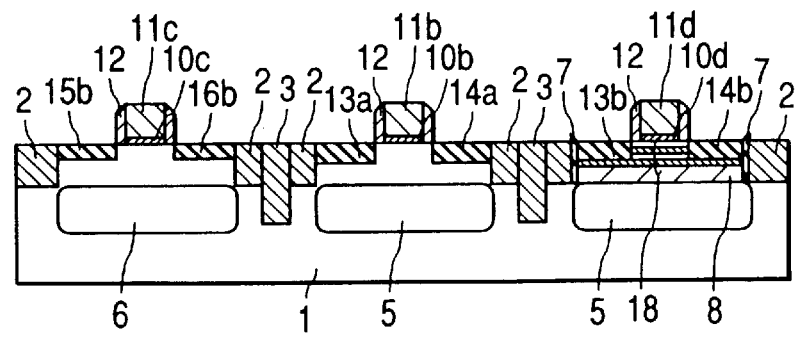
FIG. 9 is a cross sectional view illustrating a third embodiment of a semiconductor device according to the present invention.

FIG. 9 is a cross sectional structural view illustrating a third embodiment of a semiconductor device according to the present invention, which is an example of forming nMODFET and cMOSFETs on one identical substrate.

Like the pMODFET explained in Embodiment 1, in the nMODFET formed on a silicon substrate 1, after forming a p-well 5, a buffer layer 8 and a multi-layered film 18 comprising single-crystal silicon and single-crystal silicon-germanium are formed selectively only in the opening of a field insulation film 2. Conditions for selective epitaxial growth are substantially identical with those in Embodiment 1.

Figure 10:
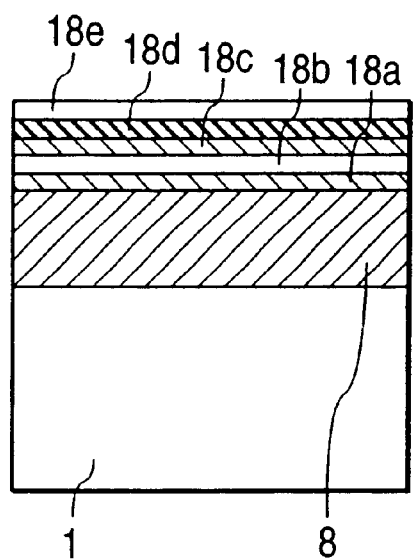
FIG. 10 is a fragmentary enlarged cross sectional view illustrating an intrinsic region of nMOSFET of the semiconductor device shown in FIG. 9.
Figure 11:
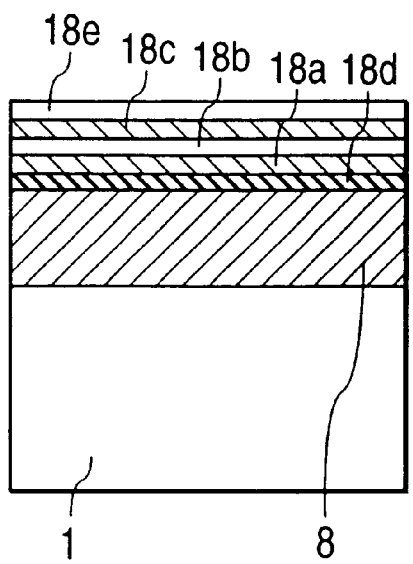
FIG. 11 is a fragmentary enlarged cross sectional view illustrating an intrinsic region of nMOSFET of the semiconductor device shown in FIG. 9.

FIG. 10 shows an enlarged view of an intrinsic region for the nMODFET. A spacer layer 18*a* comprising single-crystal silicon-germanium having the same germanium content as that of the surface of the buffer layer is formed on the buffer layer 8 in order to confirm carriers. In the spacer layer, the germanium content may be made equal with a value on the side of the surface of the buffer layer 8, and the thickness may be at 1 nm at which controllability for epitaxial growth is favorable. Then, a single-crystal silicon layer 18*b* as a channel layer is formed. Since epitaxial growth is conducted by the buffer layer 8 on a virtual substrate having the lattice constant of silicon-germanium, the channel layer 18*b* comprising single-crystal silicon is grown in a state undergoing tensile strain. For example, the channel layer undergoes tensile strain by being grown on a spacer layer 18*a* with the germanium content of 30%, and the conductive band changes. As a result, energy to electrons of the conduction band in the channel layer is lowered to form a quantum well structure, so that carriers are stored in the well layer to form a two dimensional electron gas. The thickness of the channel layer may be at 1 nm or more where the controllability of epitaxial growth is favorable. For forming the carrier barrier layer, after forming a second spacer layer 18*c* comprising single-crystal silicon-germanium having the same germanium content as that on the surface of the buffer layer, a carrier supply layer 18*d* containing an n-type dopant is formed. In the carrier supply layer 18*d*, the germanium content may be equal with the value on the side of the surface of the buffer layer and the concentration of the dopant may be $1 \times 10^{20}$ cm−3 or less. Also the thickness is preferably 1 nm or more at which controllability for the epitaxial growth is favorable. A cap layer 18*e* comprising single-crystal silicon serving as a barrier layer for the carriers, and for protecting the silicon-germanium layer, is formed on the uppermost surface of the multi-layered film. The thickness of the cap layer is preferably from 1 nm at which the controllability for the epitaxial growth is favorable, to 50 nm, at which carriers in the channel layer can be controlled by the gate electrode. In the embodiment shown in FIG. 10, the carrier supply layer 18*d* is on the side nearer to the surface than the channel layer 18*b*, but the carrier supply layer 18*d* may be present between the channel layer 18*b* and the buffer layer 8. FIG. 11 shows an enlarged view of an intrinsic region for the nMODFET in such a case. The carrier supply layer 18*d*, the spacer 18*a*, the channel layer 18*b*, the second spacer layer 18*c* and the cap layer 18*e* may be grown in this order from the side of the buffer layer 8.

After forming the multi-layered film 18 comprising single-crystal silicon and single-crystal silicon-germanium, a gate insulation film 10*d* and a gate electrode 11*d* are formed and an n-type dopant is ion implanted to a portion of the source 13*b* and the drain 14*b*, to form the nMODFET. Meanwhile, in the cMOSFETs, the nMOSFET comprises a p-well 5, a gate insulation film 10*b*, a gate electrode 11*b*, a source 13*a* and a drain 14*a*, while the pMOSFET comprises an n-well 6, a gate insulation film 10*c*, a gate electrode 11*c*, a source 15*b* and a drain 16*b*.

In the nMOSFET and the nMODFET, substantially all of the fabrication steps can be applied in common except for forming the buffer layer 8 and the multi-layered film 18 comprising single-crystal silicon and single-crystal silicon-germanium. This can apply the nMODFET to a portion of the system which particularly requires high operation speed. The system to which the above-mentioned constitution is applicable can include high frequency IC and high speed processor IC for mobile communication.

According to this embodiment, since the nMODFET can be used to a portion of the system requiring high speed operation, the performance of the system can be improved.

<Embodiment 4>

Figure 12:
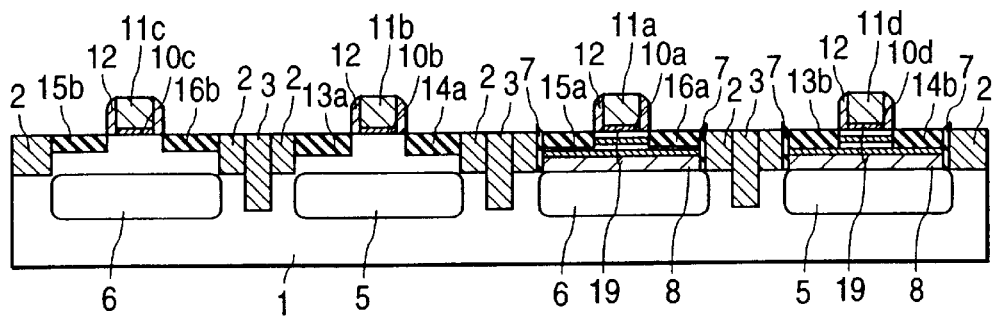
FIG. 12 is a cross sectional view illustrating a fourth embodiment of a semiconductor device according to the present invention.

FIG. 12 is a cross sectional structural view illustrating a fourth embodiment of a semiconductor device according to the present invention, which is an example of forming cMODFET and cMOSFET on one identical substrate.

Like the nMODFET and the pMODFET explained in the Embodiments 1 and 3, a p-well 5 and an n-well 6 are formed respectively on a silicon substrate 1, openings are formed to a field insulation film 2, and a silicon nitride film 7 is formed to each side wall. A buffer layer 8 comprising single-crystal silicon-germanium is simultaneously formed selectively to each of the openings for the nMODFET and the pMODFET, on which a multi-layered film 19 comprising single-crystal silicon and single-crystal silicon-germanium is selectively formed. The conditions for selective epitaxial growth are substantially identical with those in the Embodiment 1.

Figure 13:
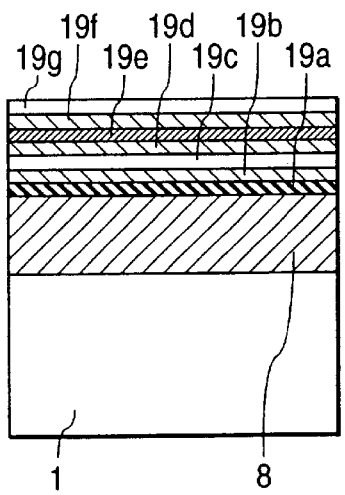
FIG. 13 is a fragmentary enlarged cross sectional view illustrating an intrinsic region of nMOSFET and pMODFET of the semiconductor device shown in FIG. 12.

FIG. 13 shows an enlarged view of an intrinsic region for the nMODFET and the pMODFET. A spacer layer 19*a* comprising a single-crystal silicon-germanium having the same germanium content as that on the surface of the buffer layer is formed on the buffer layer 8 for confining carriers. In the spacer layer, the germanium content may be substantially identical with the value on the surface of the buffer layer 8 and the thickness may be 1 nm or more at which the controllability for the epitaxial growth is favorable. Then, a carrier supply layer 19*b* containing an n-type dopant is formed. In the carrier supply layer 19*b*, the germanium content may be substantially identical with the value on the surface of the buffer layer and the concentration of the dopant may be $1 \times 10^{20}$ cm−3 or less, in order to suppress diffusion to the channel layer. Also the thickness may be 1 nm or more at which the controllability or epitaxial growth is favorable. After forming a second spacer layer 19*c* comprising single-crystal silicon-germanium having the same germanium content as that on the surface of the buffer layer for forming the carrier barrier layer, a single-crystal silicon layer 19*d* as an n-channel layer is formed. Since epitaxial growth is conducted by the buffer layer 8 on the virtual substrate with the lattice constant of silicon-germanium, the n-channel 19*d* comprising single-crystal silicon grows in a state undergoing tensile strain. For example, the n-channel layer undergoes tensile strain by growing on the spacer layer 19*c* with germanium content of 30% to change the conduction band. As a result, since energy to electrons in the conduction band in the n-channel layer is lowered to form a quantum well structure, n-type carriers are stored in the well layer to contribute to the transistor operation. The thickness for the n-channel layer may be 1 nm or more at which controllability for the epitaxial growth is favorable. A p-channel layer 19*e* comprising single-crystal silicon-germanium with higher germanium content than that of the buffer layer is formed on the n-channel. Since the p-channel layer 19*e* undergoes compressive strain by increased germanium content and energy to holes in the valence band is lowered, p-type carriers are stored in the well layer, which operates as a p-channel. A third spacer layer 19*f* comprising single-crystal silicon-germanium as a barrier layer for p-type carriers is formed on the p-channel layer 19e, and a cap 19g comprising single-crystal silicon for protecting the silicon-germanium layer is formed at the uppermost surface. The thickness of the cap layer is preferably from 1 nm, at which the controllability of epitaxial growth is favorable, to 50 nm, at which carriers in the channel layer can be controlled by the gate electrode.

After forming the multi-layered film 19 comprising single-crystal silicon and single-crystal silicon-germanium, a gate insulation film 10 and a gate electrode 11 are formed to each of the portions of the cMODFET and the cMOSFET, and an n-type dopant is ion implanted selectively to the portions of the nMOSFET and an nMODFET to form an n-type source 13 and an n-type drain 14. In the same manner, a p-type dopant is ion implanted selectively to the portions for the pMOSFET and pMODFET to form a p-type source 15 and a p-type drain 16. In the nMOSFET and the nMODFET, and in the pMOSFET and the pMODFET, the respective steps can substantially be applied in common, except for forming the buffer layer 8 and the multi-layered film 19 comprising single-crystal silicon and single-crystal silicon-germanium. This can form a circuit comprising nMODFET and pMODFET to a portion of a system which particularly requires high operation speed. The system to which the above-mentioned constitution is applicable can include high frequency IC and high speed processor IC for mobile communication.

According to this embodiment, since the cMODFET can be used to a portion of the system requiring high speed operation, the performance of the system can be improved.

<Embodiment 5>

Figure 14:
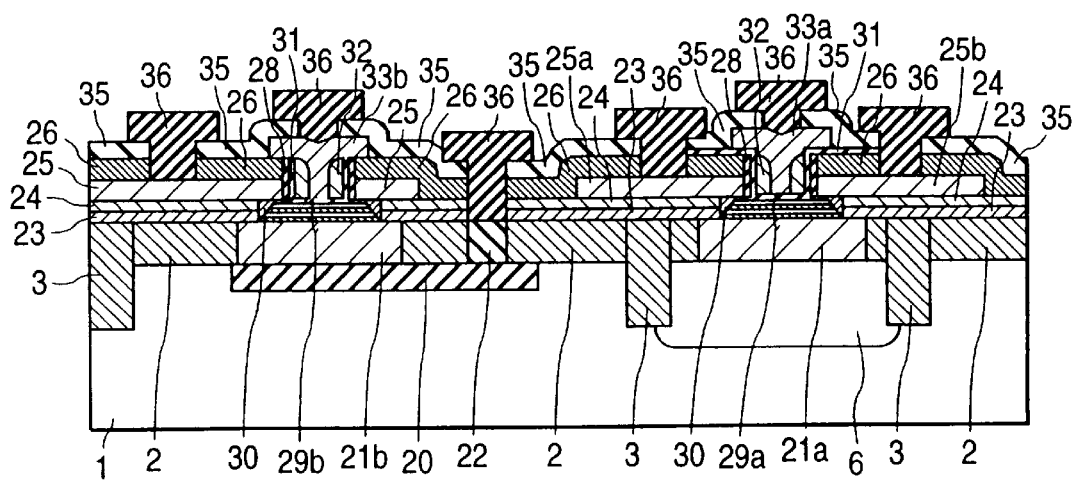
FIG. 14 is a cross sectional view illustrating a fifth embodiment of a semiconductor device according to the present invention.

FIG. 14 is a cross sectional structural view illustrating a fifth embodiment of a semiconductor device according to the present invention, which is an example of forming a pMODFET and an NPN-type silicon-germanium heterojunction bipolar transistor (SiGeHBT) on one identical substrate.

A pMODFET formed on a silicon substrate 1 comprises an n-well 6, a buffer layer 21a, a multi-layered film 29a comprising single-crystal silicon and single-crystal silicon-germanium, a gate insulation film 31, a gate electrode 33a, a source 25a and a drain 25b. On the other hand, an NPN-type SiGeHBT comprises a high concentration n-type buried layer 20, a low concentration collector 21b, a base 29b and an emitter 34.

A method of manufacturing a semiconductor device of the structure shown in FIG. 14 is explained with reference to FIGS. 15, 16 and 17.

Figure 15A:
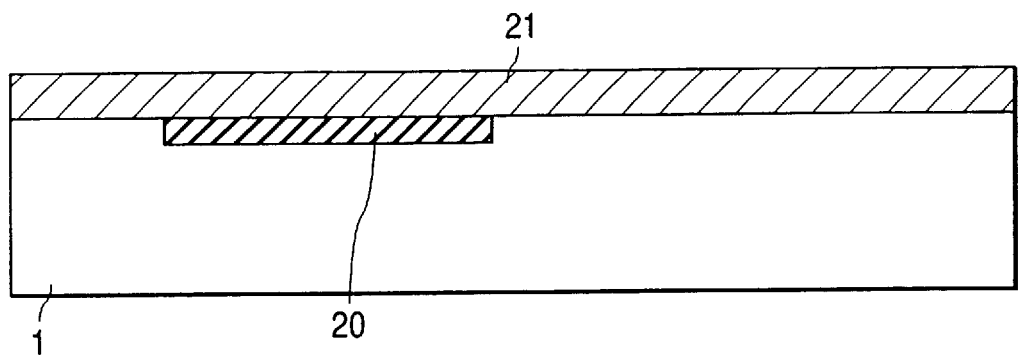
FIG. 15 is an enlarged cross sectional view illustrating a manufacturing method of the semiconductor device according to the present invention shown in FIG. 14 in the order of steps.
Figure 15B:
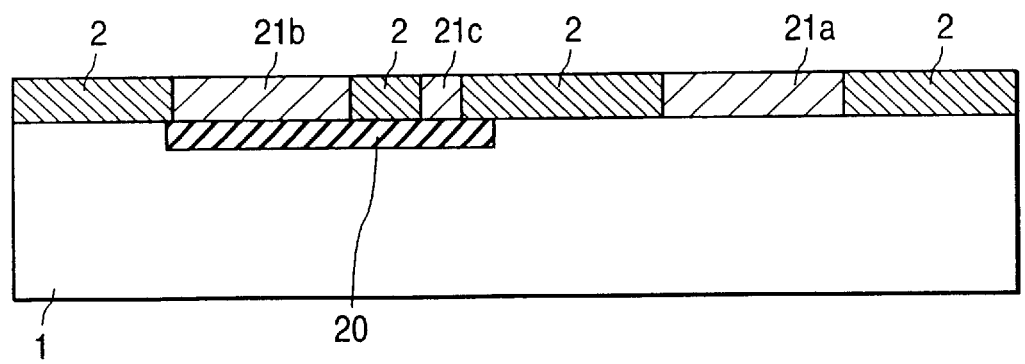
Figure 15C:
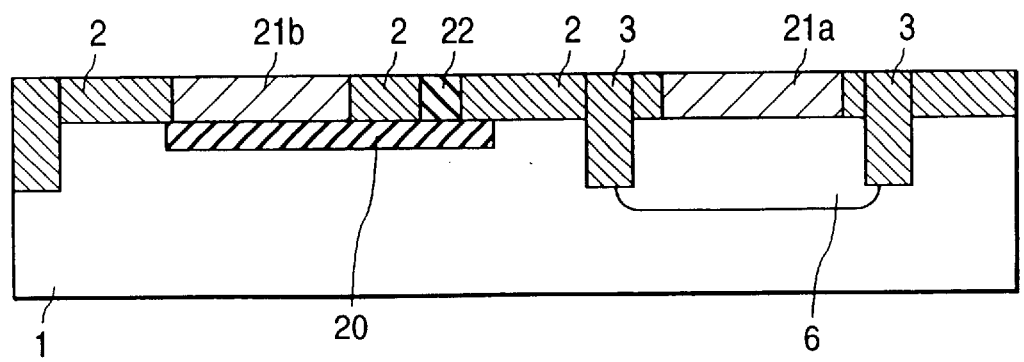

At first, after forming a high concentration n-type buried layer 20 selectively to a region for forming an NPN-type SiGeHBT on the silicon substrate 1 selectively, a single-crystal silicon layer 21 is epitaxially grown over the entire surface (refer to FIG. 15(a)). The single-crystal silicon layer 21 may be a single-crystal silicon-germanium layer, which is substantially identical with other embodiments.

Then, in the single-crystal silicon layer 21, portions other than a buffer region 21a of the pMODFET, and a low concentration collector region 21b and a collector pull-up region 21c of the NPN-type SiGeHBT are etched. A field insulation film 2 is formed by depositing an insulation film and polishing the insulation film until the surface of the single-crystal silicon layer 21 is exposed by a CMP method (refer to FIG. 15(b)). The method of forming the field insulation film 2 can be conducted by another method, such as, for example, by LOCOS of forming a silicon nitride film selectively to the portions for the buffer region 21a of the pMODFET and the low concentration collector region 21b and the collector pull-up region 21c of the HBT, and oxidizing other regions. Further, an insulation film may be deposited over the entire surface of the silicon substrate 1 before deposition of the single-crystal silicon layer 21 and portions for the buffer region 21a of the pMODFET and the low concentration collector region 21b and the collector pull-up region 21c of the NPN-type SiGeHBT, by selective epitaxial growth to the openings disposed partially. Further, by depositing the single-crystal silicon layer 21 not selectively over the entire surface of the field insulation film 2 having the openings, a single-crystal silicon layer is grown in the opening of the field insulation film 2 and a polycrystalline silicon layer is deposited on the field insulation film 2. The buffer region 21a of the pMODFET and the low concentration collector region 21b and the collector pull-up region 21c of the HBT can also be formed selectively by polishing the polycrystalline silicon layer deposited on the field insulation film 2 by a CMP method to expose the field insulation film 2. The method of forming the field insulation film 2 and the single-crystal silicon layer 21 is also substantially identical with other embodiments.

Then, a groove is formed between each of the devices by an isotropic etching, and an insulation film or a multi-layered film comprising an insulation film and a polycrystalline silicon layer is buried only in the inside of the groove, to form a device isolation region 3. An n-type dopant ion implanted to the region of the pMODFET to form an n-well 6, and an n-dopant is implanted at high concentration also to the collector pull-up portion to form a high concentration n-type collector pull-up layer 22 (refer to FIG. 15(c)).

Figure 16A:
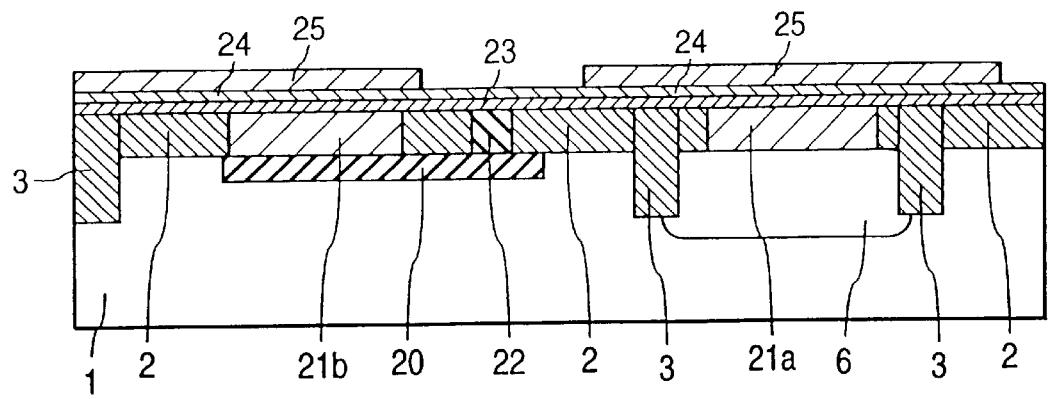
FIG. 16 is an enlarged cross sectional view illustrating the steps after FIG. 15 successively.
Figure 16B:
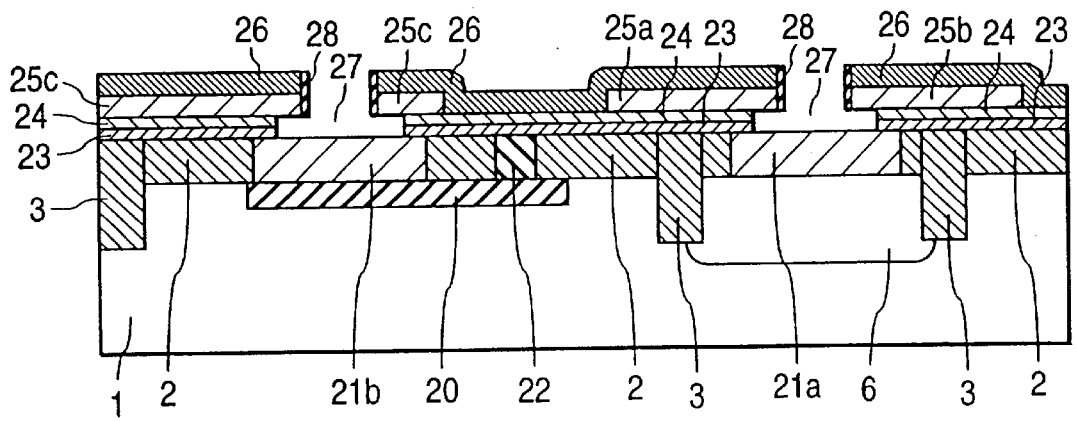
Figure 17A:
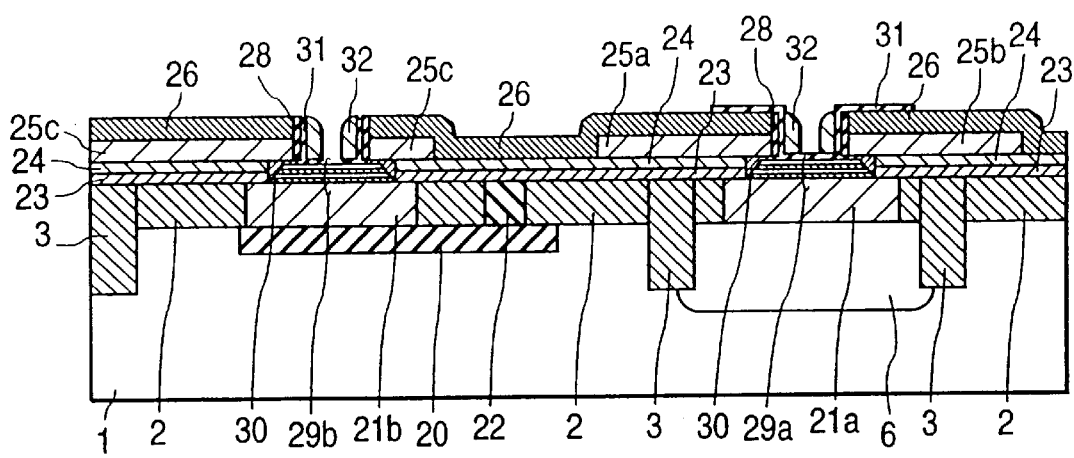
FIG. 17 is an enlarged cross sectional view illustrating the steps after FIG. 16 successively.

Then, after depositing a first insulation film 23 and a second insulation film 24 over the entire surface, a high concentration p-type polycrystalline silicon 25 as a base lead electrode of the HBT and source-drain lead electrodes of the pMODFET are formed selectively (refer to FIG. 16(a)).

An insulation film 26 is formed over the entire surface so as to cover the high concentration p-type polycrystalline silicon 25, and openings 27 are formed to the insulation film 26 and the high concentration p-type polycrystalline silicon 25 in the emitter portion of the HBT and the gate portion of the pMODFET. An insulation film 28 is formed to the side wall for each opening 27, and two layers of the insulation films 24 and 23 are etched by isotropic etching to form an overhang of the high concentration polycrystalline silicon layer 25 (refer to FIG. 16(b)).

Figure 16C:
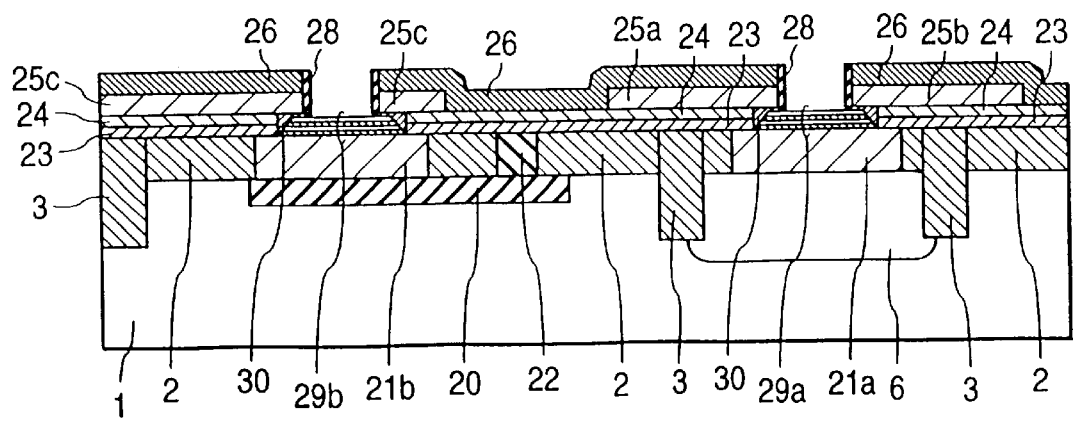

A multi-layered film 29 comprising single-crystal silicon and single-crystal silicon-germanium is epitaxially grown selectively to the opening 27 to form an intrinsic base layer 29b in the region of the HBT, while a carrier supply layer and a channel layer are formed in the region of the pMODFET and, simultaneously, the polycrystalline silicon amid polycrystalline silicon-germanium grown from below the overhang of the high concentration p-type polycrystalline silicon layer 25 are grown to automatically join the high concentration p-type polycrystalline silicon layer 25 amid the multi-layered film 29 comprising the single-crystal silicon amid single-crystal silicon-germanium automatically (refer to FIG. 16(c)).

Figure 18:
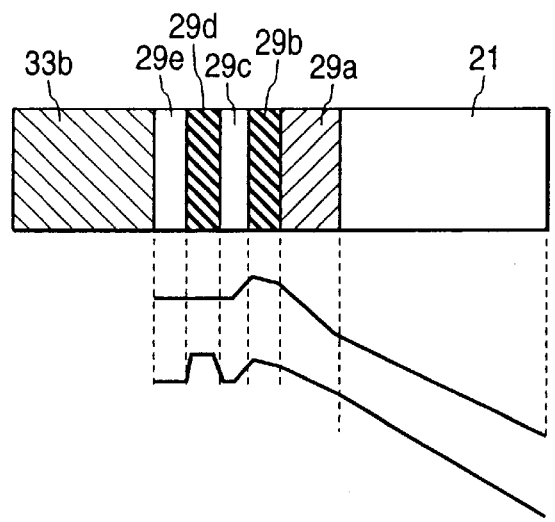
FIG. 18 is an enlarged cross sectional view for a portion showing an intrinsic region of an NPN type SiGeHBT of the semiconductor device shown in FIG. 14.

FIG. 18 shows an enlarged view for the layer structure of the multi-layered film 29 comprising single-crystal silicon and single-crystal silicon-germanium. A spacer layer 29a comprising single-crystal silicon-germanium and a p-type carrier supply layer 29b is formed on a buffer layer 21 comprising single-crystal silicon, to form a base layer of the HBT. The germanium content is changed in the carrier supply layer 29b for reducing the base transit time and improving the early voltage in the HBT. For example, the germanium content may be 0% on the side of the surface, the germanium content is increased toward the buffer layer 21, and may be 20% at the boundary with the buffer layer 21. In the spacer layer 29a, the germanium content is suitably decreased toward the boundary to the buffer layer 21. Further, the thickness for the carrier supply layer 29b as the intrinsic base layer may be 20 nm or less in order to attain the high speed operation in the HBT, and the lower limit may be 5 nm for forming the single-crystal silicon-germanium layer with the inclined content at a good controllability. Further, for decreasing the base resistance of the HBT, the concentration of the dopant contained in the carrier supply layer 29b may be $1 \times 10^{19}$ cm−3 or more, with the upper limit being $1 \times 10^{20}$ cm−3, at which diffusion of the dopant is remarkable. A spacer layer 29c comprising single-crystal silicon or single-crystal silicon-germanium forming the carrier barrier layer, and the emitter layer, are formed on the carrier supply layer 29b. When the spacer 29c is formed of the single-crystal silicon-germanium layer, the germanium content may be made less than that of the carrier supply layer 29b. Further, the thickness of the spacer layer 29c may be 5 nm or more in order to suppress the diffusion of the dopant from the carrier supply layer. Then, a p-type channel layer 29d comprising single-crystal silicon-germanium is formed and, finally, a cap layer 29e comprising single-crystal silicon is formed as a protection film. The layer structure of the multi-layered film comprising single-crystal silicon and single-crystal silicon-germanium when the HBT and the pMODFET are formed on one identical substrate is substantially identical with other embodiments.

After covering the surface of the multi-layered film 29 comprising single-crystal silicon amid the single-crystal silicon-germanium layer with an insulation film 31, an insulation film 32 is formed selectively to the side wall of the opening. The insulation film 31 is etched in the opening of the HBT for forming all emitter region, but the insulation film 31 is used as the gate insulation film ill the opening of the pMODFET (refer to FIG. 17(a)).

Figure 17B:
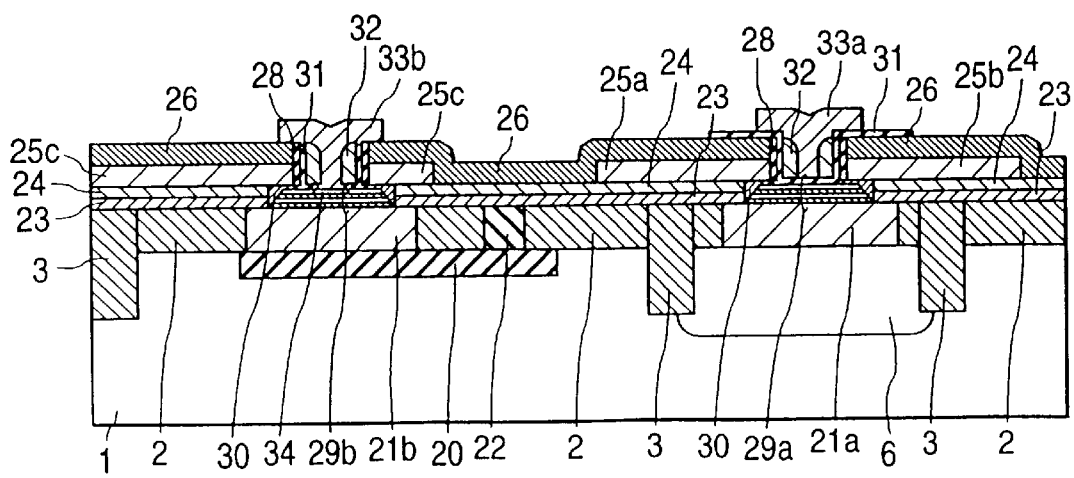

A high concentration n-type single-crystal silicon 33 as an emitter amid a gate electrode is formed to the opening, and an n-type dopant is diffused from the high concentration n-type polycrystalline silicon 33 into the multi-layered film 29 comprising the single-crystal silicon amid single-crystal silicon-germanium layer only in the region of the HBT, for example, by annealing at 900 degrees C. for 30 see, to form an emitter region 34 (refer to FIG. 17(b)).

Figure 19:
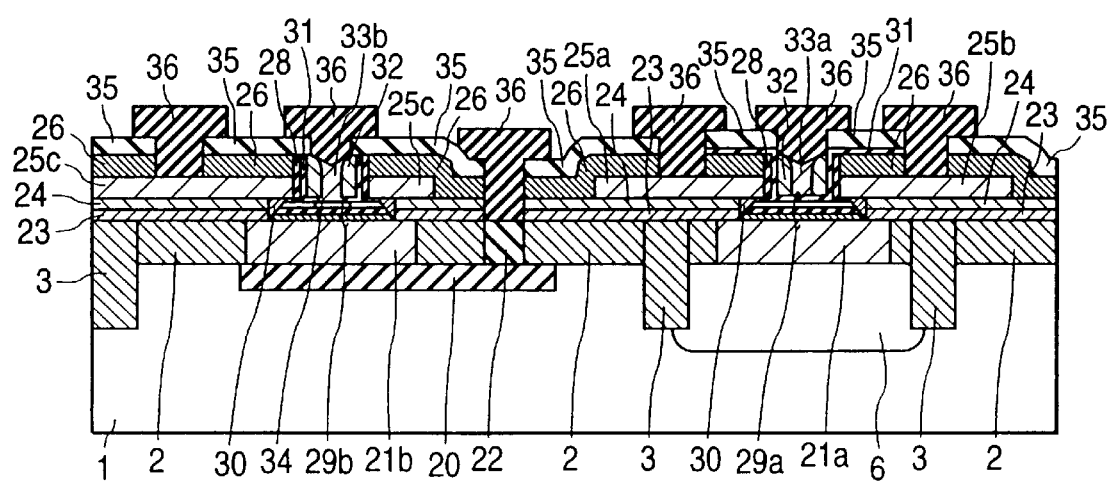
FIG. 19 is a cross sectional view illustrating a structure of a fifth embodiment of a semiconductor device according to the present invention in which an overlap region is eliminated.

When a high concentration n-type polycrystalline silicon layer 33 is formed selectively by using mask formation by lithography and anisotropic etching, an overlap region remains as an overhang by a margin for mask alignment also to the outside of the opening. It is necessary to remove the overlap region for improving the performance of the transistor, since the portion increases the gate/source and gate/drain capacitance, particularly, in the pMODFET. FIG. 19 shows a cross sectional view of an example of not forming the overlap region of the high concentration n-type polycrystalline silicon layer. After depositing a high concentration n-type polycrystalline silicon layer 33 over the entire surface, when the high concentration n-type polycrystalline silicon layer 33 is removed by anisotropic etching, the high concentration n-type polycrystalline silicon layer 33 remains in a region where a step is present, such as in the opening in a state where a flat portion, such as a field region, is removed. Accordingly, when the inner diameter of the opening in a state of forming the insulation film 32 of the side wall is less than about twice the thickness of the high concentration n-type polycrystalline silicon layer 33, the bottom of the opening is not removed by anisotropic etching, and no overlap region is formed.

Figure 20:
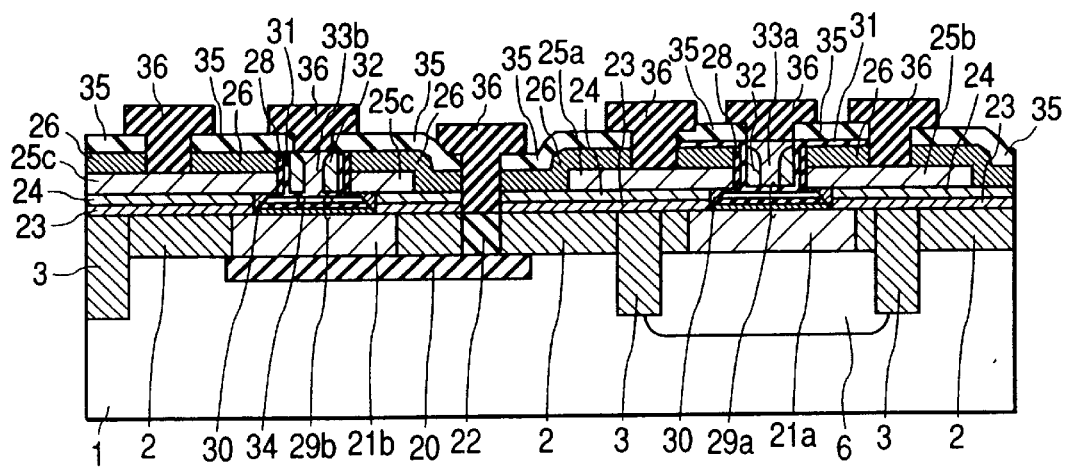
FIG. 20 is a cross sectional view illustrating a structure of a fifth embodiment of a semiconductor device according to the present invention in which an overlap region is eliminated.

Further, the embodiment of FIG. 20 shows a cross sectional view for an example of removing the overlap region by using CMP. After depositing a high concentration n-type polycrystalline silicon layer 33 over the entire surface, when the high concentration n-type polycrystalline silicon layer 33 is polished until an insulation film 26 is exposed by the CMP method, the high concentration n-type polycrystalline silicon layer 33 in the portion other than the intrinsic region can be removed without forming an overlap region.

The method of selectively forming the high concentration n-type polycrystalline silicon layer 33 without forming the overlap region as has been described above is substantially identical to other embodiments.

Finally, when an insulation film 35 is deposited over the entire surface and an opening is formed at each of electrode take-out positions to form an electrode 36, the structure shown in FIG. 14 is obtained.

In this embodiment, since the NPN-type SiGeHBT and the pMODFET can be formed on one identical substrate, high speed operation of the bipolar transistor by the SiGe base and the high speed operation of the FET by the distorted SiGe channel can be made compatible in a system using the bipolar transistor and the FET together in one identical system. Further, since no step is formed between the NPN-type SiGeHBT and the pMODFET, integration of transistors is enabled and the interconnection length can be decreased, so that the electric power consumption by the circuit using the semiconductor device can be decreased. Further, since most of fabrication steps can be applied in common for forming the NPN-type SiGeHBT and the cMODFET, it is possible to reduce the manufacturing cost of semiconductor devices in which both of the transistors are mounted together. As described above, a semiconductor device, which is effective to high speed operation and high performance of the entire system, can be realized at a reduced cost.

<Embodiment 6>

Figure 21:
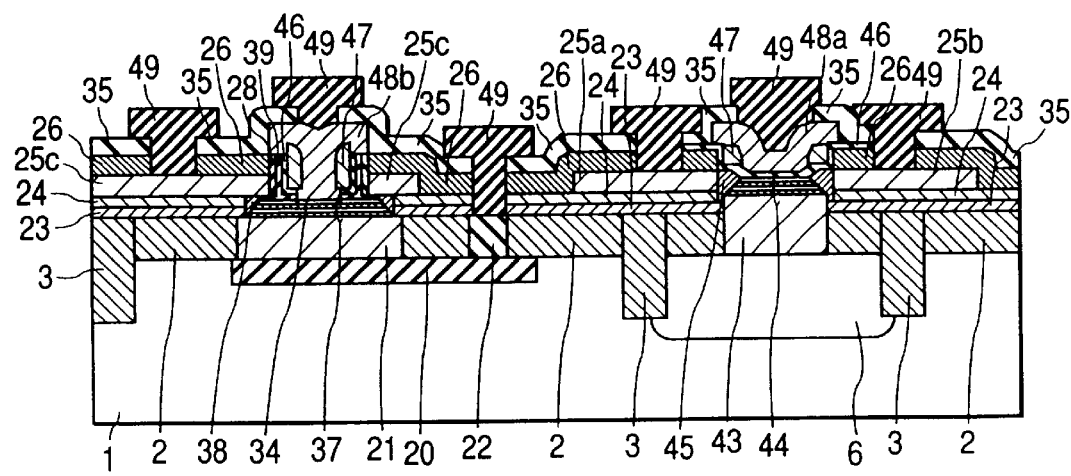
FIG. 21 is a cross sectional view illustrating a sixth embodiment of a semiconductor device according to the present invention.

FIG. 21 is a cross sectional structural view illustrating a sixth embodiment of a semiconductor device according to the present invention, which is an example of forming a pMODFET and an NPN-type SiGeHBT on one identical substrate.

Like Embodiment 5, a pMODFET formed on a silicon substrate 1 comprises an n-well 6, a buffer layer 43, a multi-layered film 44 comprising single-crystal silicon and single-crystal silicon-germanium, a gate insulation film 46, a gate electrode 48a source 25a and a drain 25b. On the other hand, an NPN-type SiGeHBT comprises a high concentration n-type buried type layer 20, a low concentration collector 21, a base 37 and an emitter 34.

This is different from the Embodiment 5 in that the buffer layer 43 of the pMODFET and the low concentration collector 21 of the HBT are formed by separate steps, which can facilitate the design for the intrinsic region in each of the devices.

A method of manufacturing a semiconductor device of the structure shown in FIG. 21 is explained hereinbelow with reference to FIG. 22, FIG. 23 and FIG. 24.

As in Embodiment 5, a high concentration n-type buried layer 20 is formed selectively to a region for forming an NPN-type SiGeHBT on a silicon substrate 1, and a field insulation film 2 and a single crystal region 21 are formed selectively on the silicon substrate 1. This is different from the Embodiment 5 in that the single crystal region 21 is not formed to the region of forming the intrinsic region of the pMODFET. Then, a device isolation region 3 is formed between each of the devices and the n-well 6 is formed to the region for the pMODFET, and a high concentration n-type collector pull-up layer 22 is formed to a collector pull-up portion of the HBT respectively by way of ion implantation (refer to FIG. 22(a)).

Figure 22A:
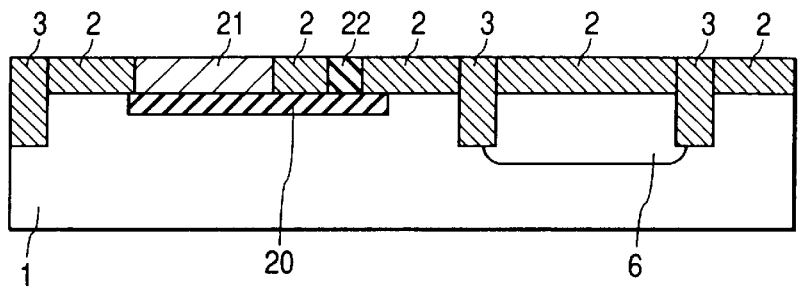
FIG. 22 is an enlarged cross sectional view illustrating a manufacturing method of the semiconductor device according to the present invention shown in FIG. 21 in the order of steps.
Figure 22B:
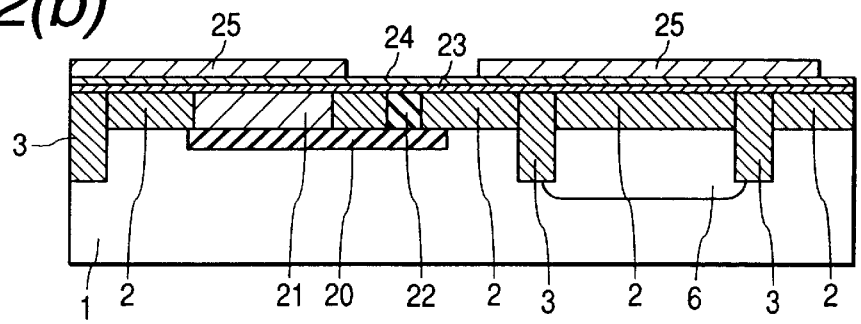
Figure 22C:
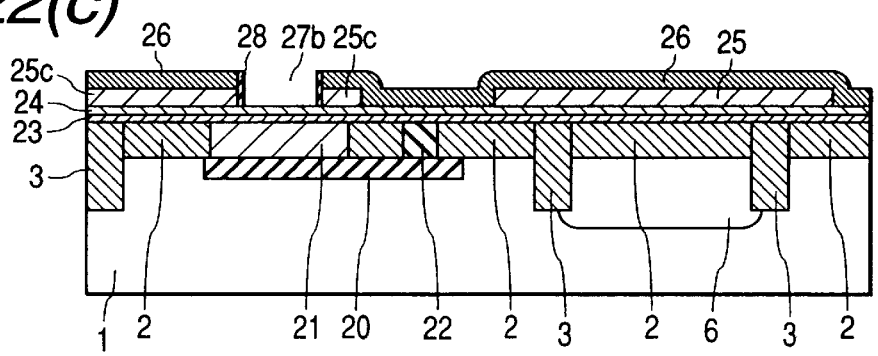
Figure 23A:
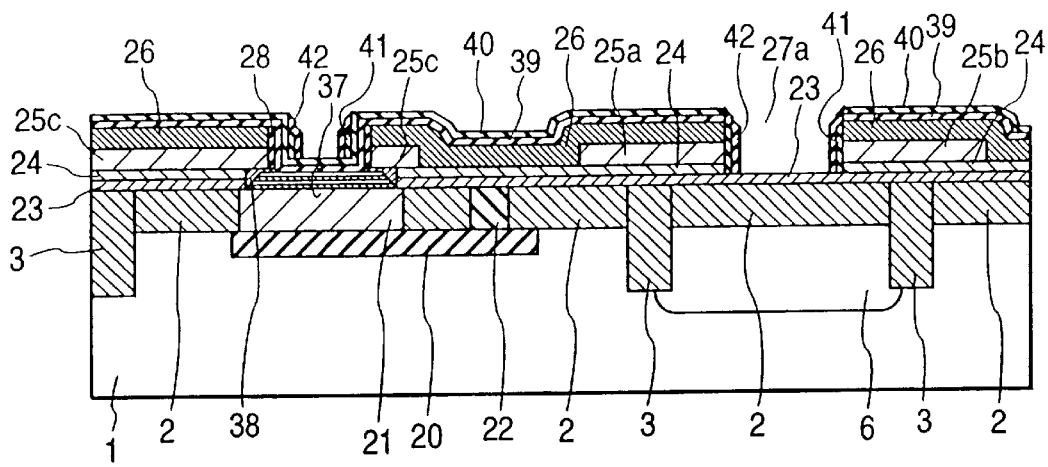
FIG. 23 is an enlarged cross sectional view illustrating the steps after FIG. 22 successively.
Figure 23B:
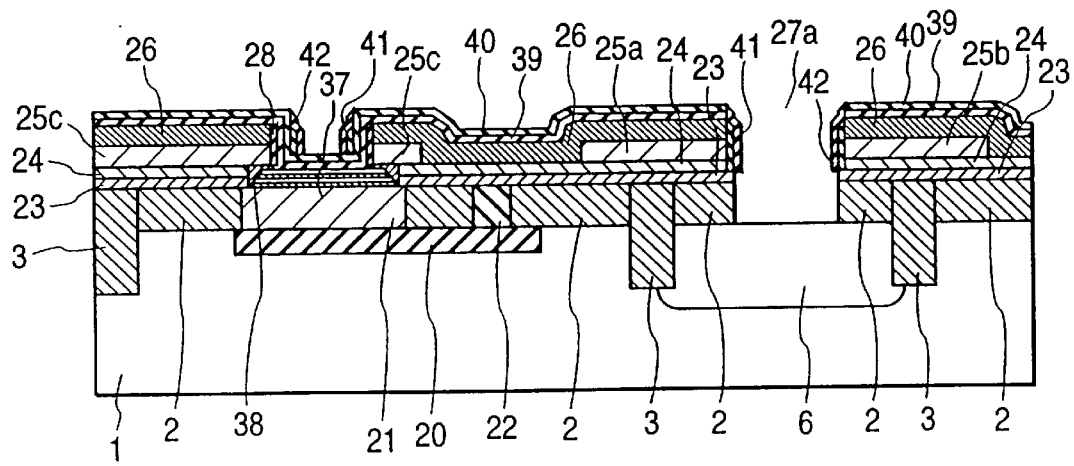
Figure 23C:
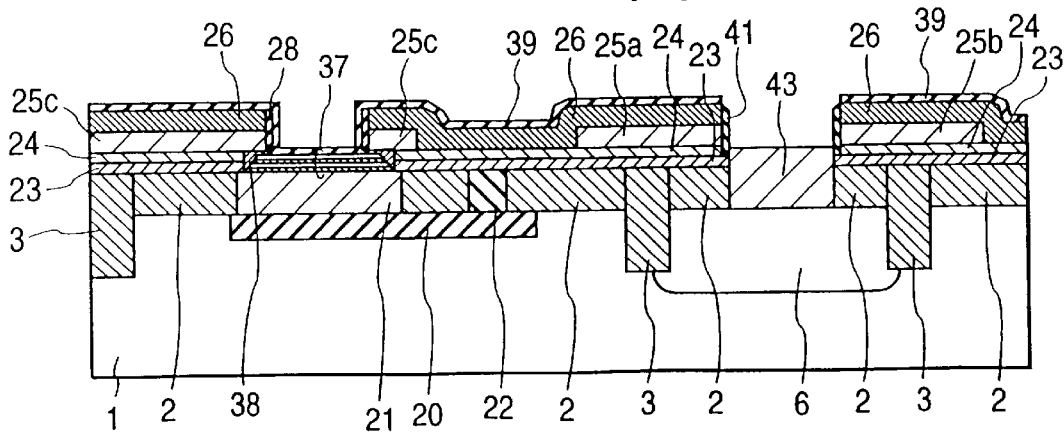

After forming a first insulation film 23 and a second insulation film 24 over the entire surface, a high concentration p-type polycrystalline silicon 25 as a base lead electrode for the HBT and a source-drain electrode for the pMODFET is selectively formed (refer to FIG. 22(b)).

Then, an insulation film 26 is formed over the entire surface so as to cover the high concentration p-type polycrystalline silicon 25, and an opening is formed to the insulation film 26 and the high concentration p-type polycrystalline silicon in the emitter region of the HBT, and an insulation film 28 is formed on the side wall (refer to FIG. 22c)).

Figure 22D:
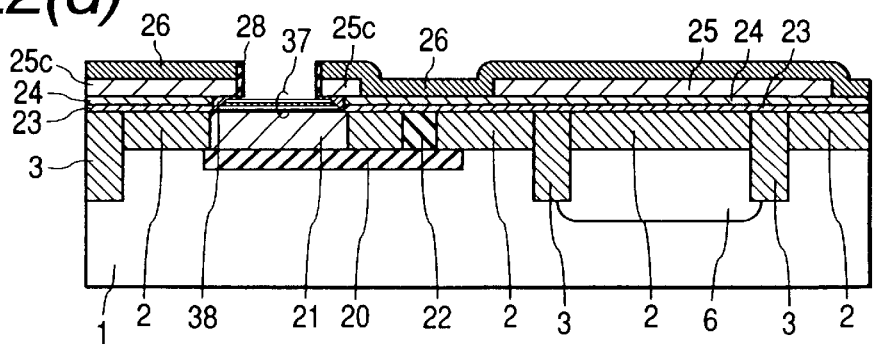

The two layers of the insulation film 24 and 23 are etched by isotropic etching to form an overhang of the high concentration polycrystalline silicon layer 25c, and a multi-layered film 37 comprising single-crystal silicon and single-crystal silicon-germanium is epitaxially grown selectively to the opening 27b, while a carrier supply layer and a channel layer are formed in the region of the pMODFET and, simultaneously, polycrystalline silicon and polycrystalline silicon-germanium 38 are grown from below the overhang of the high concentration p-type polycrystalline silicon layer 25c to automatically join the high concentration p-type polycrystalline silicon layer 25c and the intrinsic base formed in the multi-layered film 37 (refer to FIG. 22(d)).

Figure 25:
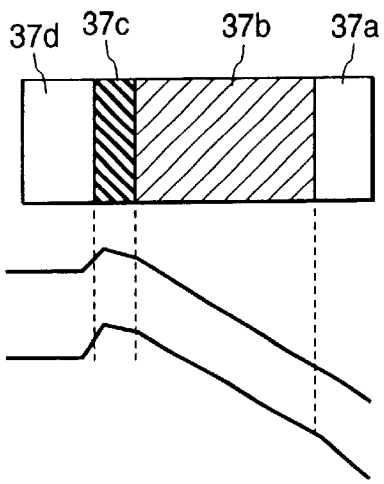
FIG. 25 is an enlarged cross sectional view for a portion showing an intrinsic region of an NPN type SiGeHBT of the semiconductor device shown in FIG. 21.

The layer structure of the multi-layered film 37 comprising single-crystal silicon and single-crystal silicon-germanium is shown in FIG. 25. A low concentration collector layer 37a comprising single-crystal silicon-germanium, with the germanium content being decreased toward a low concentration collector layer, is formed on the side of the collector so that energy barrier in the conduction band is not generated. At the germanium content, for example, of 20%, the germanium content in the low concentration collector layer 37a is preferably changed from 20% to 0% from the surface toward the low concentration collector layer 21, and the thickness may be 5 nm or more for forming the grading of the germanium content at a favorable controllability. Then, a second low concentration collector layer 37b comprising single-crystal silicon-germanium is formed for preventing the formation of the energy barrier due to the difference of the band gap near the base-collector boundary. In order not to give the effect of the energy barrier on electrodes passing through the depletion layer, the thickness may be 30 nm, for example, at a uniform germanium content of 20%. Then, in the intrinsic base layer 27c to be formed, the germanium content is changed for reducing the base transit time and improving the early voltage in the HBT. For instance, an internal electric field for accelerating the carriers is generated in the intrinsic base 37c by making the germanium content at 0% on the side of the surface and 20% at the boundary to the second low concentration collector layer 37b. Further, the thickness of the intrinsic base layer 37 may be 30 nm or less in order to attain high speed operation of the HBT, and the lower limit may be 5 nm in order to form the single-crystal silicon-germanium layer with inclined content with good controllability. Further, for decreasing the base resistance, the concentration of the dopant contained in the intrinsic base layer 37c may be $1 \times 10^9$ cm-3 or more, and the upper limit may be $1 \times 10^{20}$ cm-3 at which the diffusion of the dopant is remarkable. A single-crystal silicon layer 37d finally forming the emitter is formed on the intrinsic base layer 37c by diffusion of the n-type dopant. The thickness of the single-crystal silicon layer 37d may be within a range from 5 nm to 30 nm so that emitter diffusion is conducted at a favorable controllability and low concentration layer of high resistance does not remain finally on the emitter-base boundary. The profile for the germanium content and the doping concentration can optionally be adopted for the multi-layered film 37 so long as it comprises single-crystal silicon and single-crystal silicon-germanium, which is substantially identical in other embodiments.

Then, insulation films 39 and 40 as a mask material for selective growth in the pMODFET are deposited over the entire surface, and an opening 27a is formed to the insulation films 40, 39 amid 26, the high concentration polycrystalline silicon layer 25 and the insulation film 24 in the region of the pMODFET. Preferably, the insulation film 39 is made of a silicon oxide film and the insulation film 40 is made of a silicon nitride film. Then, insulation films 41 and 42 are further formed to the side wall of the opening (refer to FIG. 23(a)). Preferably, the insulation film 41 is made of silicon oxide film, and the insulation film 42 is made of a silicon nitride film. Since all the portions other than the bottom of the opening 27a are covered with the silicon nitride film in this step, the insulation film 23 amid the field insulation film 2 are opened to expose the surface of the silicon substrate 1 (refer to FIG. 23(b).

Figure 26A:
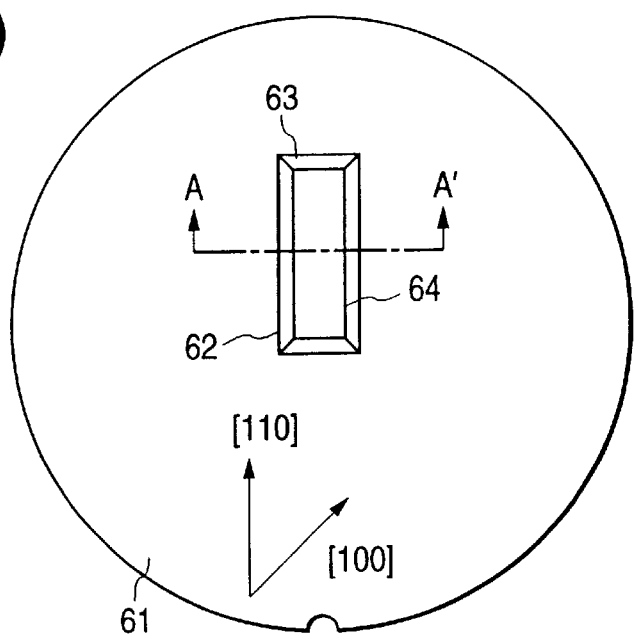
FIG. 26 is a surface plan view and an enlarged cross sectional view illustrating the shape of a single crystal layer formed in an opening of an insulation film with each side being directed to [110] direction.
Figure 26B:
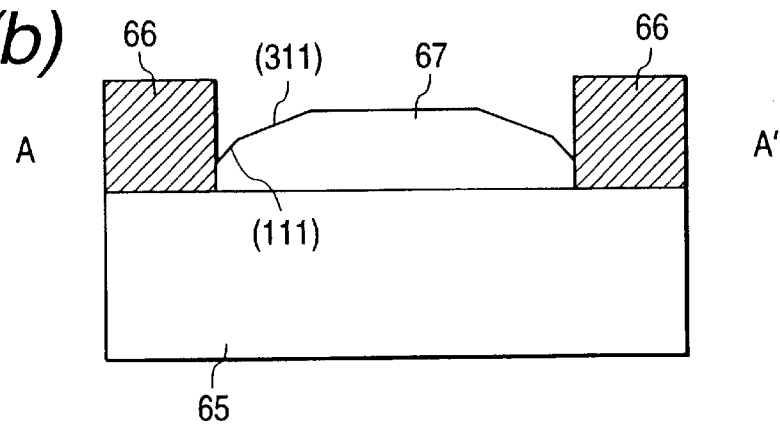
Figure 27A:
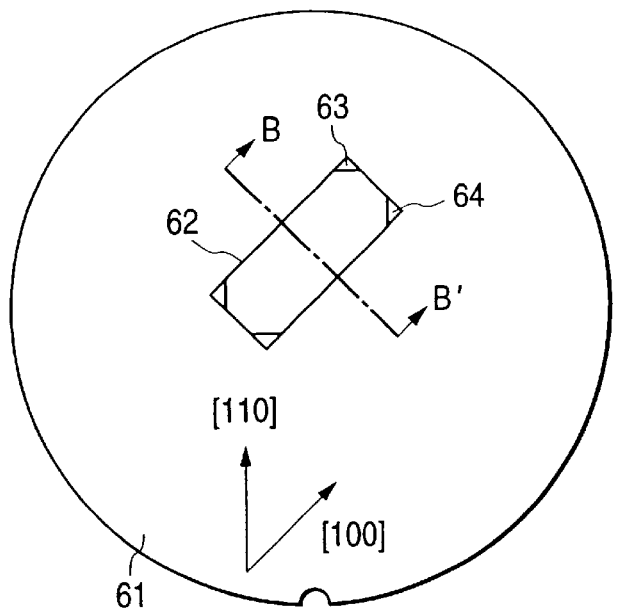
FIG. 27 is a surface plan view and an enlarged cross sectional view illustrating the shape of a single crystal layer formed in an opening of an insulation film with each side being directed to [100] direction
Figure 27B:
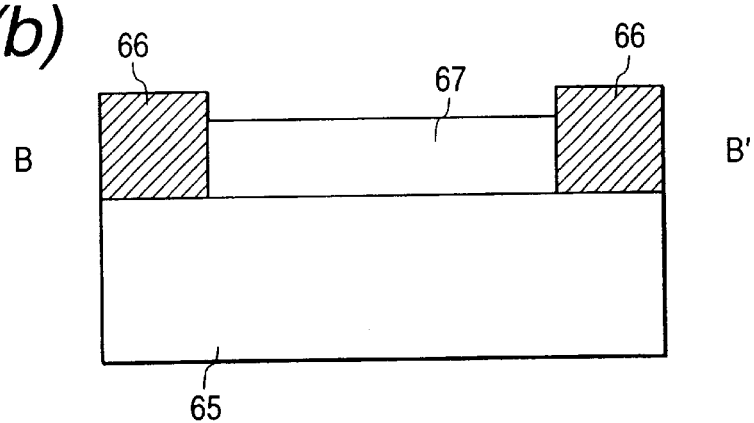

Since the single-crystal silicon layer is exposed only at the bottom of the opening 27a, a buffer layer 43 of the pMODFET comprising single-crystal silicon-germanium is formed by selective epitaxial growth. When a silicon nitride film is formed on the side wall of the opening for suppressing occurrence of facets hike that in the Embodiment 1, since the silicon nitride film is deposited also to the side wall of the source-drain lead electrode 25, the silicon nitride film has to be removed after epitaxial growth of the buffer layer in order to connect the source and the drain. However, when the silicon nitride film is removed, damages are caused to the surface of the buffer layer 43 comprising single-crystal silicon-germanium to greatly deteriorate the performance of the pMODFET formed on the surface thereof Accordingly, a method of suppressing the generation of the facets without using the silicon nitride film on the side wall is adopted. FIG. 26 and FIG. 27 show a relation between the shape of a single crystal layer 67 epitaxially grown in the opening of a silicon oxide film formed on the silicon substrate 61 amid the crystal orientation of the opening. As shown in FIG. 26(a), when the opening is formed with the side being directed to [110] orientation in the in-plane crystal orientation of the silicon substrate 61, reconstruction of surface atoms occurs at the boundary between the silicon oxide film 66 amid the silicon substrate 65, and on the surface of the single crystal layer 67, (111) and (311) planes having more stable surface state than (100) as the in plane orientation of the substrate are formed. As a result, assuming that an ideal rectangular opening is formed, facets 63, 64 are formed from each side of the opening. As shown in FIG. 27, on the other hand, when the side of the opening is directed to [100] orientation, since rearrangement of the surface atom less occurs, the facet is not generated at each side, but small facet planes 63 and 64 are generated only at the corners of the opening. Accordingly, in most regions in the opening, the single crystal layer 67 grows so as to be in contact with the silicon oxide film 66. Utilizing this characteristic, even in a case of using a silicon oxide film as the field insulation film 2, the buffer layer 43 grows in contact with the field insulation film 2 in the opening by directing the side of the opening to [100] orientation to greatly reduce the effect of facets (refer to FIG. 23(c)).

Figure 24A:
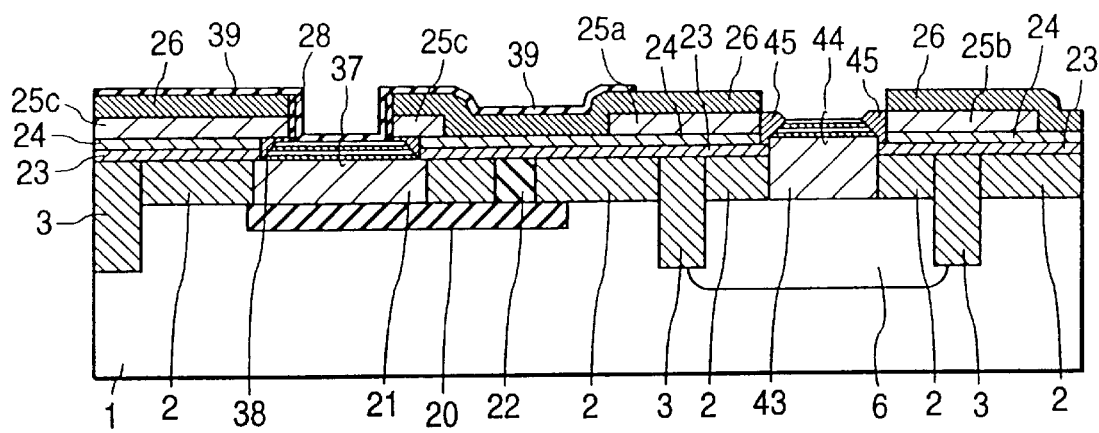
FIG. 24 is an enlarged cross sectional view illustrating the steps after FIG. 23 successively.
Figure 24B:
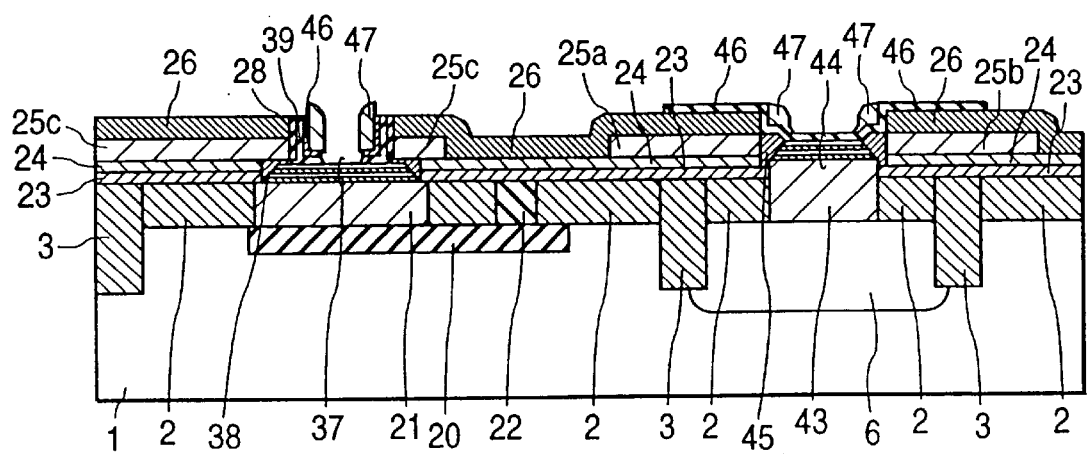
Figure 24C:
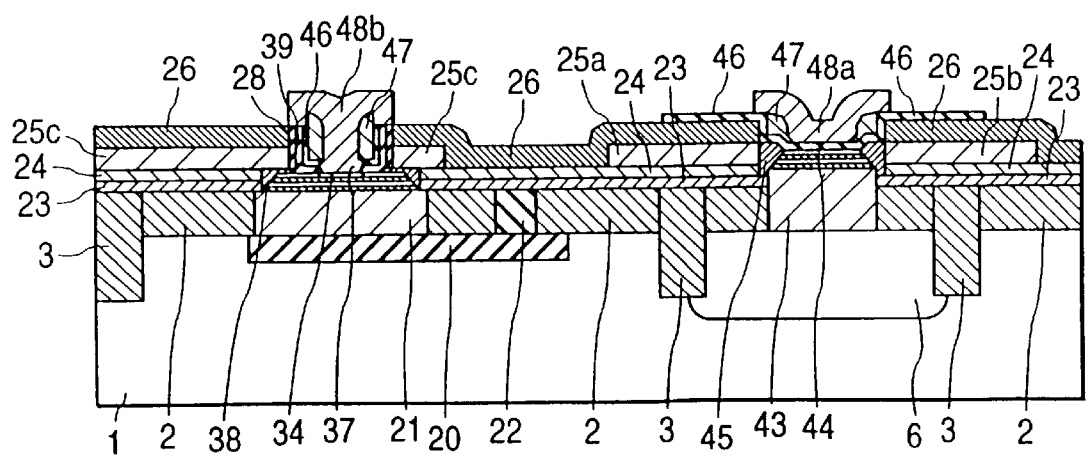

The insulation film 39 as the mask material for the selective growth is removed only in the region of the pMODFET, and the multi-layered film 44 comprising single-crystal silicon and single-crystal silicon-germanium amid polycrystalline silicon and polycrystalline silicon-germanium simultaneously are formed, to the source-drain lead electrodes 25a amid 25b and a channel layer in a self-aligned manner (refer to FIG. 24(*a*)). The structure of the multi-layered film 44 comprising single-crystal silicon and single-crystal silicon-germanium is substantially identical with that in the Embodiment 1.

After depositing a gate insulation film 46 and forming an insulation film 47 on the side wall of the opening, insulation films 39 amid 46 covering the bottom of the opening are removed only in the HBT region to expose the single-crystal silicon cap layer (refer to FIG. 24(*b*)).

When high concentration n-type polycrystalline silicon layer is deposited only to the periphery of the openings of the HBT and the pMODFET and annealing is applied, the n-type dopant is diffused only iii the HBT region to form au emitter region 34 (refer to FIG. 24(*c*)). Removal of the overlap portion is substantially identical with that iii the Embodiment 5.

Finally, the entire surface is covered with an insulation film 35 and, when each of the electrodes is opened to form an electrode 49, the structure as shown in FIG. 21 is obtained. In this structure, since the intrinsic region for each of the MODFET region and the bipolar region is formed independently by epitaxial growth, the MODFET to be mounted together with the HBT is not restricted only to the pMODFET but this is applicable also to an nMODFET. This is substantially identical in other embodiments in which the buffer layer is formed independently of the low concentration collector layer.

In this embodiment, since the buffer layer can be formed independently of the low concentration collector layer of the HBT, optimal design for the layer structure is possible for each of the pMODFET and the HBT, in addition to the effect in Embodiment 5 and, as a result, the system using this semiconductor device can be increased for the operation speed and the performance.

<Embodiment 7>

Figure 28:
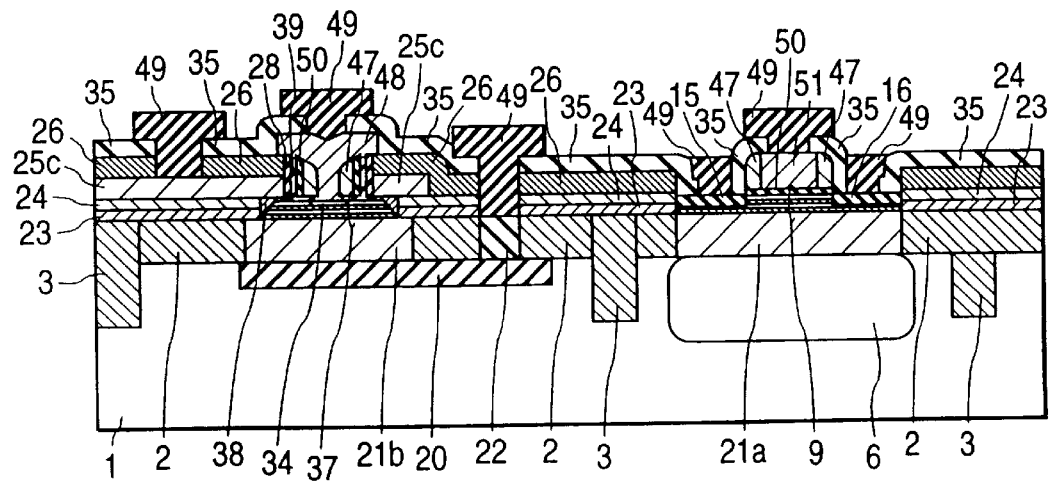
FIG. 28 is a cross sectional view illustrating a seventh embodiment of a semiconductor device according to the present invention.
Figure 29A:
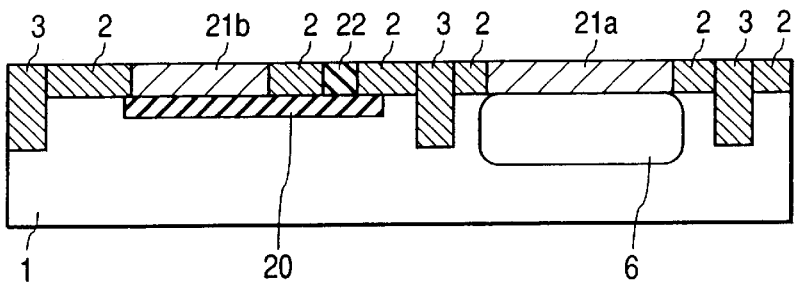
FIG. 29 is an enlarged cross sectional view illustrating a manufacturing method of the semiconductor device according to the present invention shown in FIG. 28 in the order of steps.
Figure 29B:
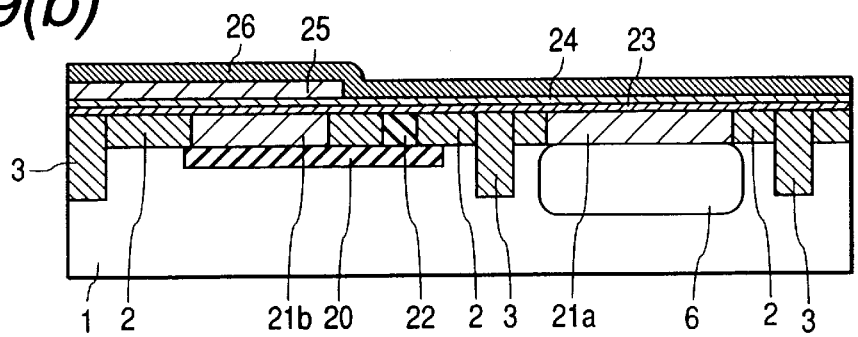
Figure 29C:
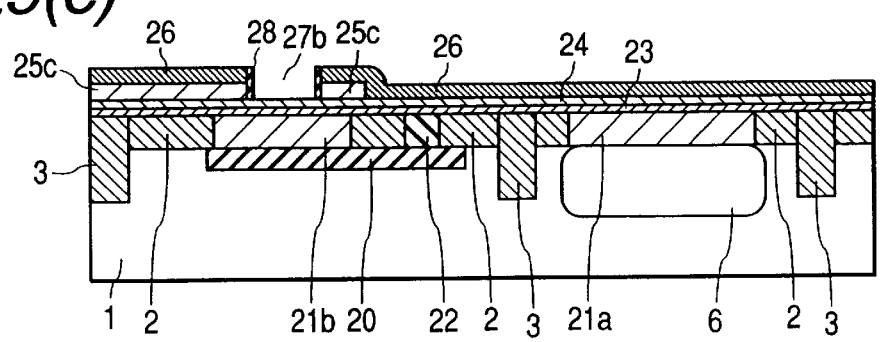
Figure 29D:
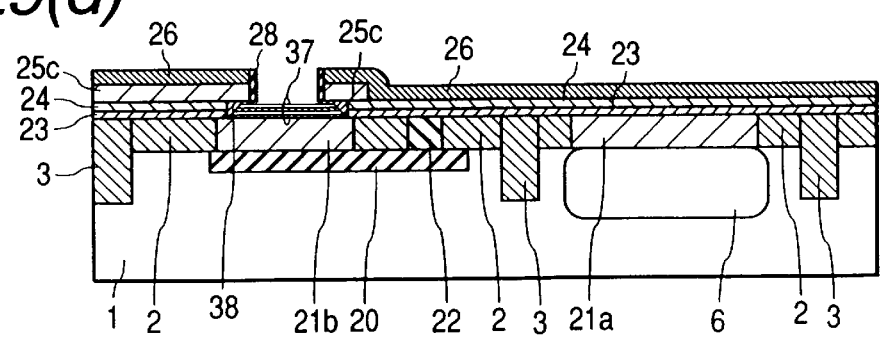

FIG. 28 is a cross sectional structural view illustrating a seventh embodiment of a semiconductor device according to the present invention, which is an example of forming a pMODFET and an NPN-type SiGeHBT on one identical substrate.

As in Embodiment 5, a pMODFET formed on a silicon substrate 1 comprises an n-well 6, a buffer layer 21a, a multi-layered film 9 comprising single-crystal silicon and single-crystal silicon-germanium, a gate insulation film 50, a gate electrode 51, a source 15 and a drain 16. On the other hand, an NPN-type SiGeHBT comprises a high concentration n-type buried layer 20, a low concentration collector 21b, a base 37 and an emitter 34.

This is different from the Embodiment 5 in that the source and the drain of the pMODFET are formed by mask alignment, by which the number of fabrication steps can be reduced.

A method of manufacturing the semiconductor device of the structure shown in FIG. 28 is to be explained with reference to FIG. 29 and FIG. 30.

As in the Embodiment 5, a high concentration n-type buried layer 20 is formed selectively to a region for forming an HBT on a silicon substrate 1, and a filed insulation film 2 and a single crystal region 21 are formed selectively on the silicon substrate 1. Then, a device isolation region 3 is formed between each of the devices, and an n-well 6 is formed to the region of a pMODFET and a high concentration n-collector pull-up layer 22 is formed to a collector pull-up portion of an HBT respectively by ion implantation (refer to FIG. 29(*a*)).

After depositing the first insulation film 23 and a second insulation film 24 over the entire surface, a high concentration p-type polycrystalline silicon 25 as a base lead electrode of the HBT is formed selectively and an insulation film 26 is formed over the entire surface so as to cover the high concentration p-type polycrystalline silicon 25 (refer to FIG. 29(*b*)).

Openings are formed to the insulation film 26 and the high concentration p-type polycrystalline silicon 25 in the emitter portion of the HBT and an insulation film 28 is formed on the side wall (refer to FIG. 29(*c*)).

The two layers of the insulation film 24 and 23 are etched by isotropic etching to form an overhang of the high concentration polycrystalline silicon layer 25c, a multi-layered film 37 comprising single-crystal silicon and single-crystal silicon-germanium is epitaxially grown selectively to the opening 27b and, simultaneously, the polycrystalline silicon and polycrystalline silicon-germanium 38 grown from below the overhang of the high concentration p-type polycrystalline silicon layer 25c grow to automatically connect the high concentration p-type polycrystalline silicon layer 25c and an intrinsic base formed in the multi-layered film 37 (refer to FIG. 29(*d*)). The layered structure of the multi-layered film 37 comprising single-crystal silicon and single-crystal silicon-germanium is substantially identical with that in the Embodiment 6.

Then, an insulation film 39 as a mask for selective growth in the pMODFET is deposited over the entire surface, and an opening 27a for the insulation films 39, 26, 24 and 23 is formed in the region of the pMODFET. Since the buffer layer 21 as the single crystal layer is exposed to the bottom of time opening, a multi-layered film 9 comprising single-crystal silicon and single-crystal silicon-germanium is selectively grown epitaxially (refer to FIG. 30(*a*)). In this case, the structure of the multi-layered film 9 comprising single-crystal silicon and single-crystal silicon-germanium is substantially identical with that in the Embodiment 1.

Figure 30A:
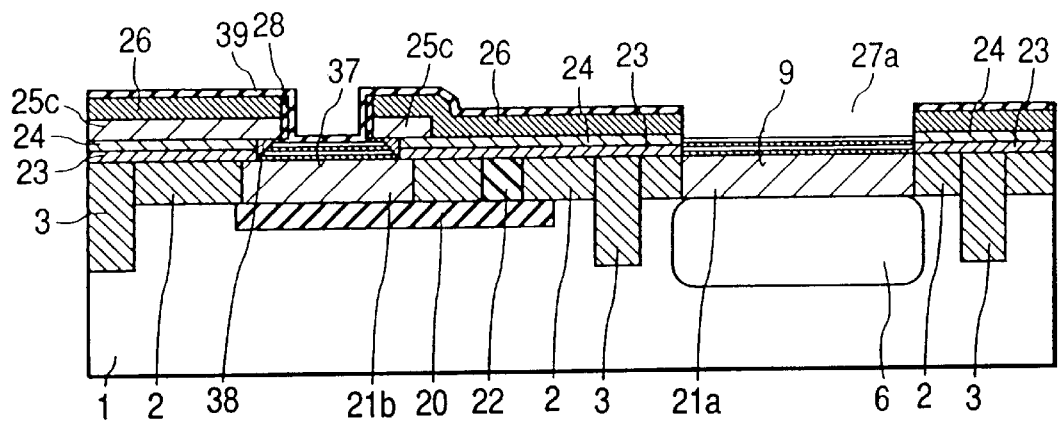
FIG. 30 is an enlarged cross sectional view illustrating the steps after FIG. 29 successively.
Figure 30B:
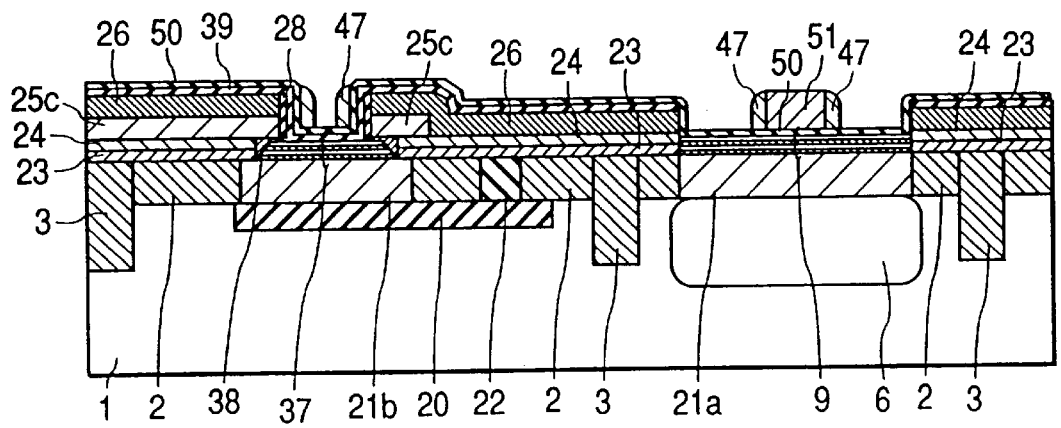
Figure 30C:
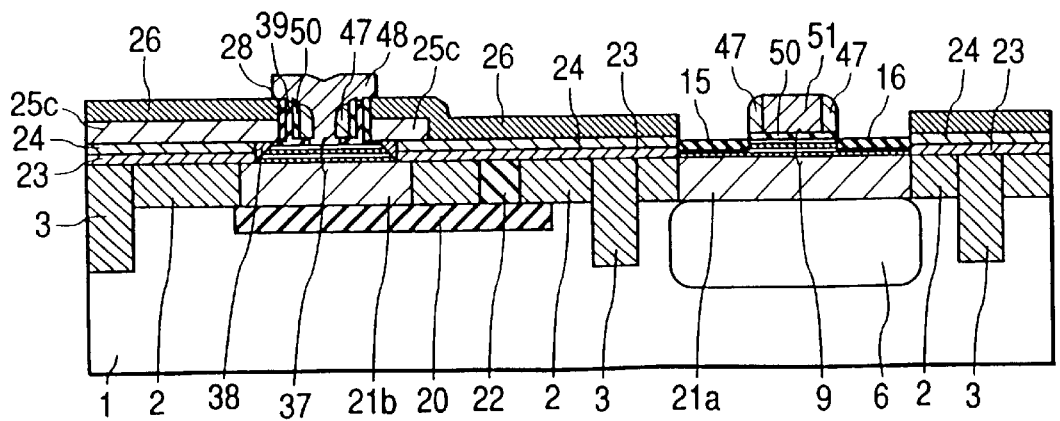

After depositing a gate insulation film 50 and a gate 51, and fabricating the gate 51, an insulation film 47 is formed to the opening of the HBT and the side wall of the gate of the pMODFET (refer to FIG. 30(*b*)).

The insulation films 50 and 39 are removed by isotropic etching to expose the single crystal silicon cap at the bottom of the opening in the HBT, and an emitter electrode comprising a high concentration n-type polycrystalline silicon is formed selectively. Further, in the pMODFET, a p-type source 15 and an n-type drain 16 are formed by selectively ion implanting a p-type dopant. In this case, formation of the emitter region 34 by emitter annealing amid activation of the source amid drain can be applied in common (refer to FIG. 30(*c*)).

Finally, when the entire surface is covered with an insulation film 35, and each of the electrode portions is opened to form an electrode, the structure shown in FIG. 28 is obtained.

According to the present invention, since the pMODFET and the HBT can be mounted together while drastically reducing the number of fabrication steps, in addition to the effect of the Embodiment 5, the cost of high speed and high performance systems can be reduced by using this circuit.

<Embodiment 8>

Figure 31:
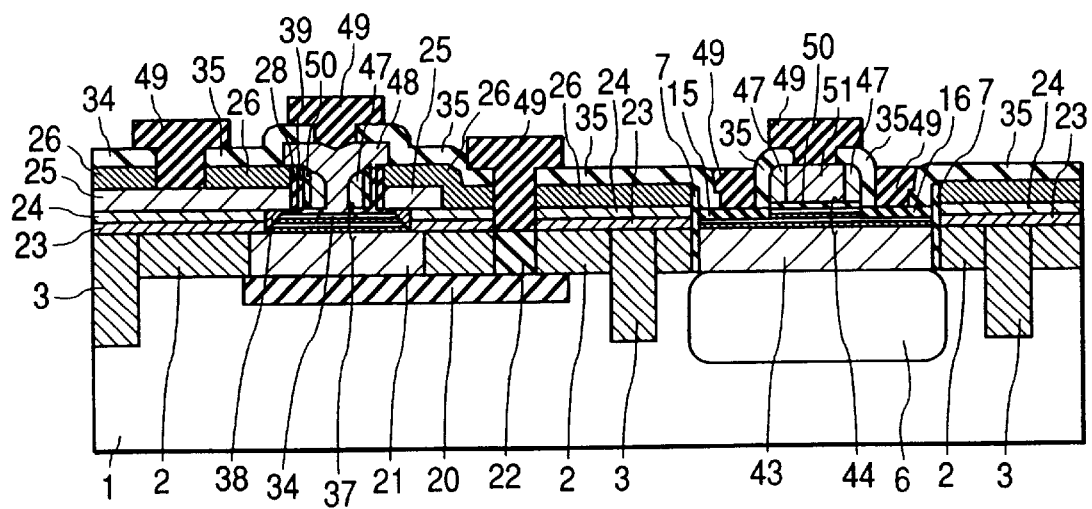
FIG. 31 is a cross sectional view illustrating an eighth embodiment of a semiconductor device according to the present invention.

FIG. 31 is a cross sectional structural view showing an eighth embodiment of a semiconductor device according to the present invention, which is an example of forming a pMODFET and an NPN-type SiGeHBT on one identical substrate.

As in Embodiment 6, a pMODFET formed on a silicon substrate 1 comprises an n-well 6, a buffer layer 43, a multi-layered film 44 comprising single-crystal silicon and single-crystal silicon-germanium, a gate insulation film 50, a gate electrode 51, a source 15 and a drain 16. On the other hand, an NPN-type SiGeHBT comprises a high concentration n-type buried layer 20, a low concentration collector 21, a base 37, and an emitter 34.

This is different from the Embodiment 6 in that the source and the drain of the pMODFET are formed by mask alignment by which the number of fabrication steps can be decreased.

Figure 32A:
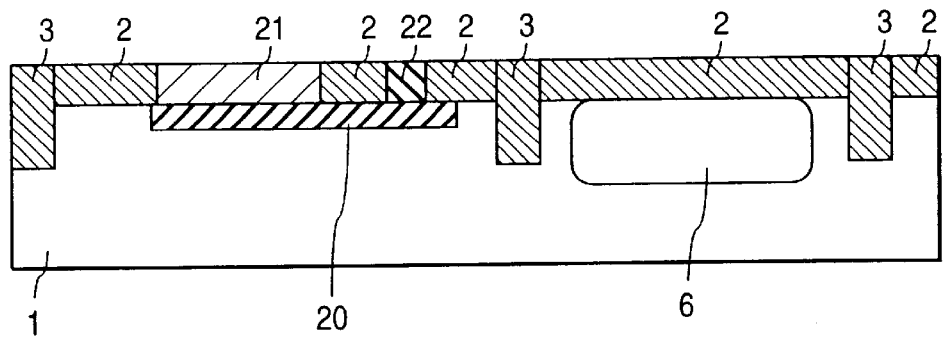
FIG. 32 is an enlarged cross sectional view illustrating a manufacturing method of the semiconductor device according to the present invention shown in FIG. 31 in the order of steps.
Figure 32B:
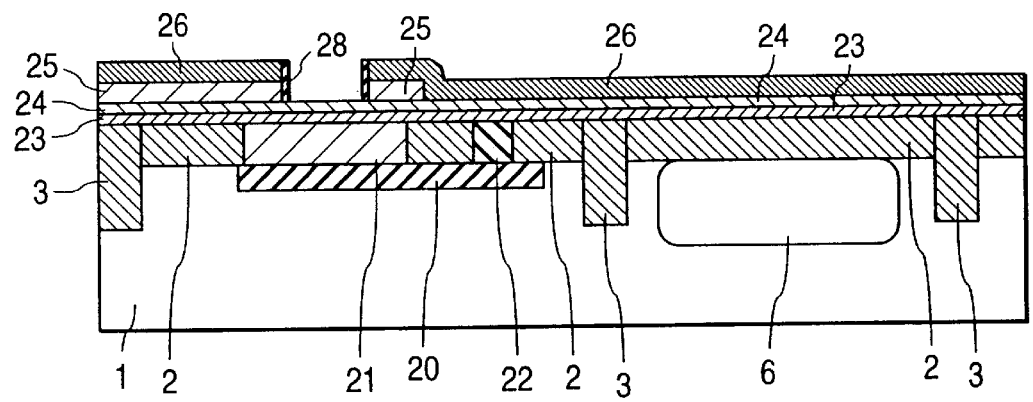
Figure 32C:
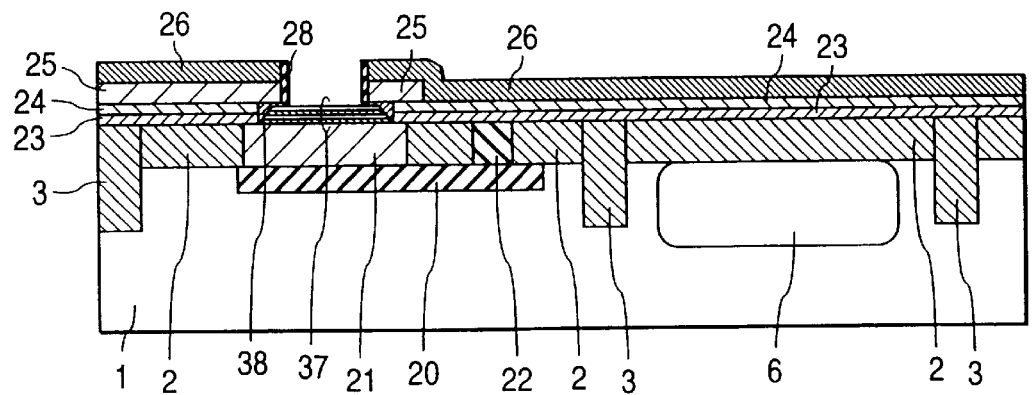
Figure 33A:
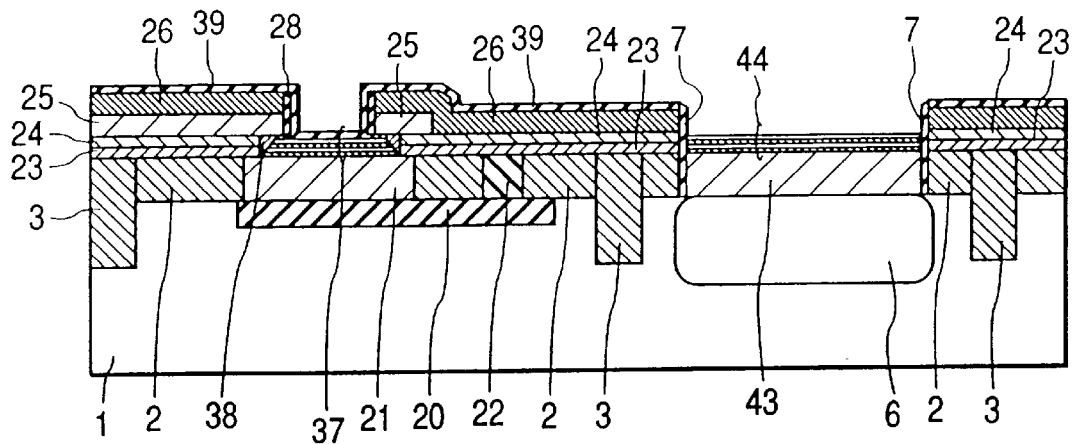
FIG. 33 is an enlarged cross sectional view illustrating the steps after FIG. 32 successively.

A method of manufacturing the semiconductor device of the structure shown in FIG. 31 is explained hereinbelow with reference to FIG. 32 and FIG. 33.

As in the Embodiment 6, a high concentration n-type buried layer 20 is formed selectively to a region for forming an NPN-type SiGeHBT on the silicon substrate 1, and a field insulation film 2 and a single crystal region 21 are formed selectively on the silicon substrate 1. The single crystal region 21 is formed only in the region for the HBT. Then, a device isolation region 3 is formed between each of devices, and an n-well 6 is formed in the region of the pMODFET and a high concentration n-type collector pull-up layer 22 is formed to a collector pull-up portion of the HBT respectively by ion implantation (refer to FIG. 32(a)).

After depositing a first insulation film 23 and a second insulation film 24 over the entire surface, a high concentration p-type polycrystalline silicon 25 forming a base lead-out electrode of the NPN-type SiGeHBT is formed selectively, and the entire surface is covered with an insulation film 26. The insulation film 26 and the high concentration p-type polycrystalline silicon 25 are opened in the emitter portion of the NPN-type SiGeHBT, and an insulation film 28 is formed on the side wall (refer to FIG. 32(b)).

Two layers of insulation films 24 and 23 are etched by anisotropic etching to form an overhang of the high concentration polycrystalline silicon layer 25. A multi-layered film 37 comprising single-crystal silicon and single-crystal silicon-germanium is epitaxially grown selectively to the opening 27 and, simultaneously, polycrystalline silicon and polycrystalline silicon-germanium 38 grown from below the overhang of the high concentration p-type polycrystalline silicon layer 25 to automatically connect the high concentration p-type polycrystalline silicon layer 25 and the multi-layered film 37 intrinsic base formed in the multi-layered film 37 (refer to FIG. 32(c)). The layered structure of the multi-layered film 37 comprising single-crystal silicon and single-crystal silicon-germanium is substantially identical with that in the Embodiment 6.

Then, an insulation film 39 as a mask material for selective growth for the pMODFET is deposited over the entire surface and the insulation film 39, 26, 24, 23, and the field insulation film 2 are anisotropically etched in the region of the pMODFET. This is different from the Embodiment 6, since the source amid the drain of the pMODFET are not connected with the electrodes in a self-aligned manner in this embodiment, an insulation film 7 comprising the silicon nitride film can be formed to the side wall of the opening of the insulation film. Accordingly, when a buffer layer 43 and a multi-layered film 44 comprising single-crystal silicon amid single-crystal silicon-germanium are selectively grown epitaxially to time opening, generation of facets can be prevented (refer to FIG. 33(a)).

Figure 33B:
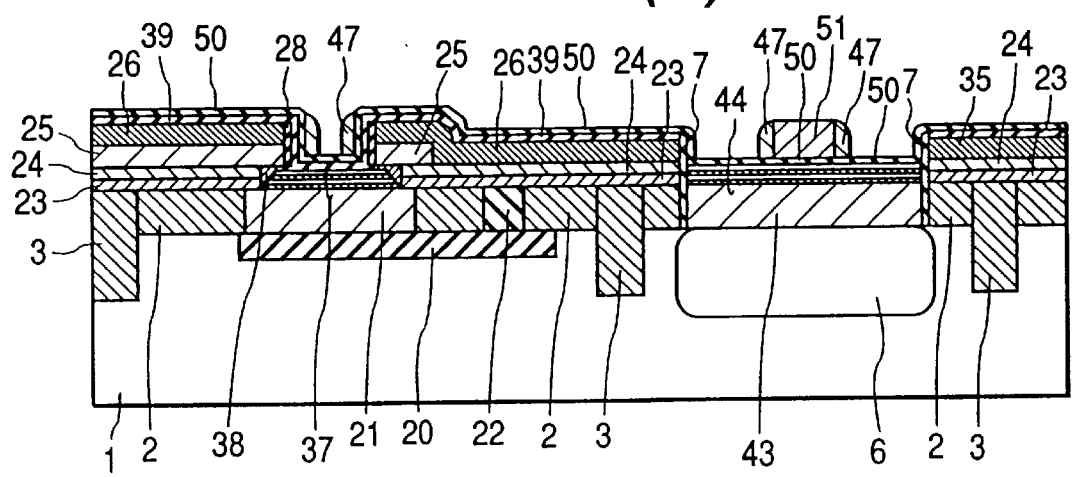
Figure 33C:
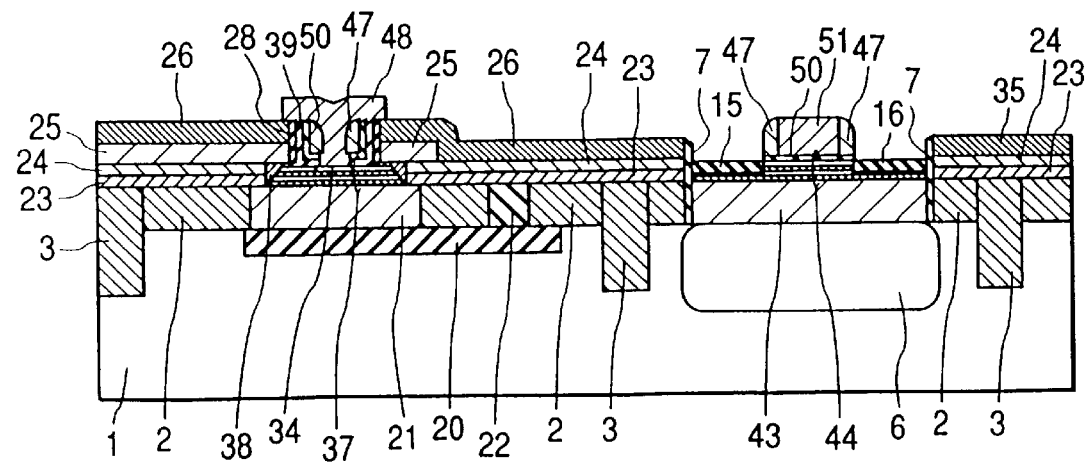

After depositing a gate insulation film 50 amid a gate electrode 51 amid fabricating the gate electrode 51, an insulation film 47 is formed to time opening of the HBT amid the side wall of time gate of time pMODFET (refer to FIG. 33(b)).

The insulation films 50 and 39 are removed by isotropic etching to expose the single-crystal silicon cap at time bottom of the opening of the HBT, and an emitter electrode 48 comprising a high concentration n-type polycrystalline silicon is formed selectively. Further, in the pMODFET, a p-type source 15 and p-type drain 16 are formed by ion implanting a p-type dopant selectively, in this case, formation of the emitter region 34 by emitter annealing and activation of the source-drain can be applied in common (refer to FIG. 33(c)).

Finally, when the entire surface is covered with an insulation film 35 and each of the electrode portions is opened to form an electrode 49, the structure as shown in FIG. 31 is obtained. In this structure, since the intrinsic region for each of the MODFET region and the bipolar region is grown independently by epitaxial growth as in the Embodiment 7, the MODFET mounted together with the HBT is not restricted only to the pMODFET, but is also applicable to an nMODFET.

In this embodiment, since the buffer layer can be formed independently of the low concentration collector layer of the HBT, in addition to the effect of the Embodiment 5, optimal design for the layer structure is possible for each of the pMODFET and the HBT and, as a result, the system using this semiconductor device can be increased in the operation speed and improved in the performance. Further, since the MODFET and the HBT can be mounted together while greatly reducing the number of fabrication steps, the cost of the system using this circuit can be reduced.

<Embodiment 9>

Figure 34:
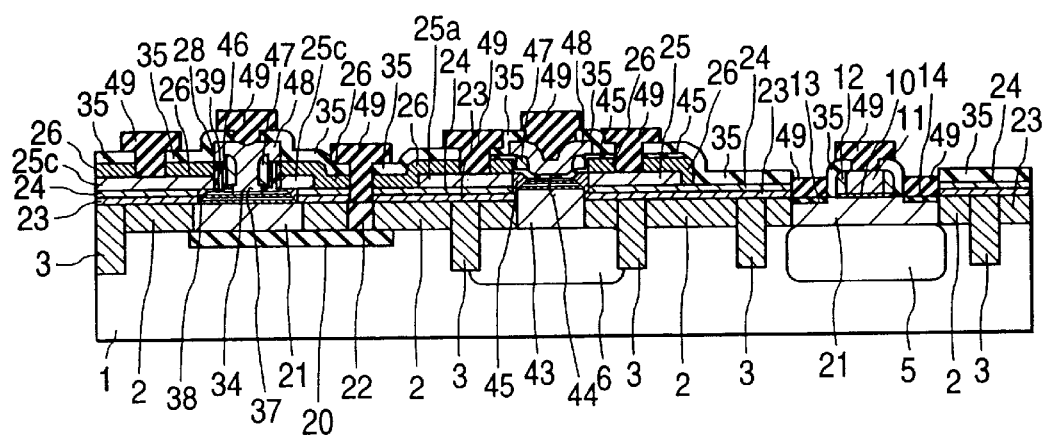
FIG. 34 is a cross sectional view illustrating a ninth embodiment of a semiconductor device according to the present invention.

FIG. 34 is a cross sectional structural view of a ninth embodiment of a semiconductor device according to the present invention, which is an example of forming a pMODFET, an nMOSFET and an NPN-type SiGeHBT on one identical substrate.

As in Embodiment 6, a pMODFET formed on a silicon substrate 1 comprises an n-well 6, a buffer layer 43, a multi-layered film 44 comprising single-crystal silicon and single-crystal silicon-germanium, a gate insulation film 46, a gate electrode 48, a source 25a and a drain 25b. On the other hand, an nMOSFET comprises a p-well 5, a gate oxide film 10, a gate electrode 11, a source 13 and a drain 14. Further, an NPN-type SiGeHBT comprises a high concentration n-type buried layer 20, a low concentration collector 21, a base 37 and an emitter 34.

In this structure, since the buffer layer 43 of the pMODFET is formed by epitaxial growth independently of each of the intrinsic portions of the nMOSFET region and the bipolar region, the performance of the pMODFET can be improved without deteriorating the performance of the nMOSFET.

According to this embodiment, since a device in which a high speed and high performance complementary FET, with a balanced n-type and p-type and an NPN bipolar transistor, mounted together can be attained, the system using this circuit can improved performance, reduce consumption power, and reduce cost.

<Embodiment 10>

Figure 35:
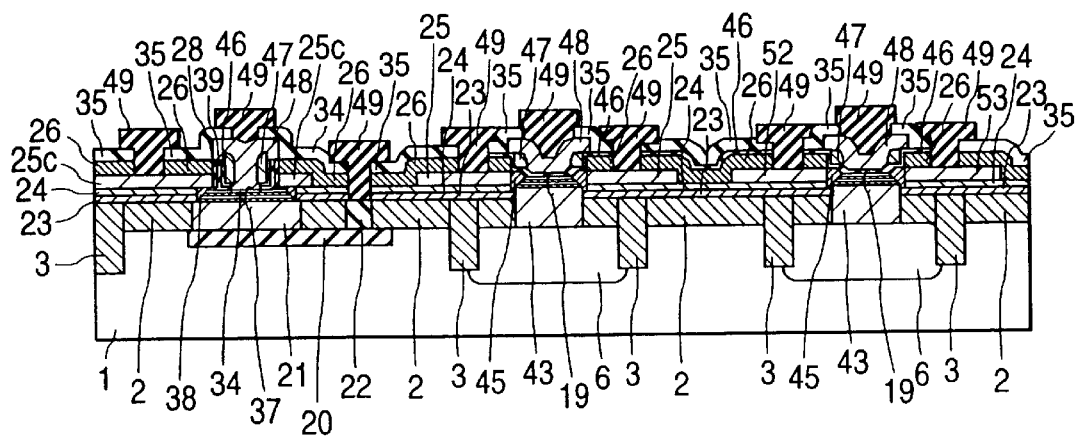
FIG. 35 is a cross sectional view illustrating a tenth embodiment of a semiconductor device according to the present invention.

FIG. 35 is a cross sectional structural view of a tenth embodiment of a semiconductor device according to the present invention, which is an example of forming a pMODFET, an nMODFET and an NPN-type SiGeHBT on one identical substrate.

This is different from the Embodiment 9 in that an n-type FET is constituted with an nMODFET. Since intrinsic regions for an nMODFET and a pMODFET are selectively grown epitaxially independently of a low concentration collector layer of an HBT, an optimal multi-layered film for improving the performance of each of the devices can be attained. Further, since channels for the nMODFET and the pMODFET are formed in the multi-layered film 19 comprising common single-crystal silicon and single-crystal silicon-germanium, and the film constitution at the periphery is also used in common with the HBT, the number of fabrication steps can be decreased drastically.

According to this embodiment, since the high speed nMODFET and the pMODFET can be mounted together, with no step, on one identical substrate, the system using this circuit can be improved in the performance, reduced in the electric power consumption and reduced in the cost.

<Embodiment 11>

Figure 36:
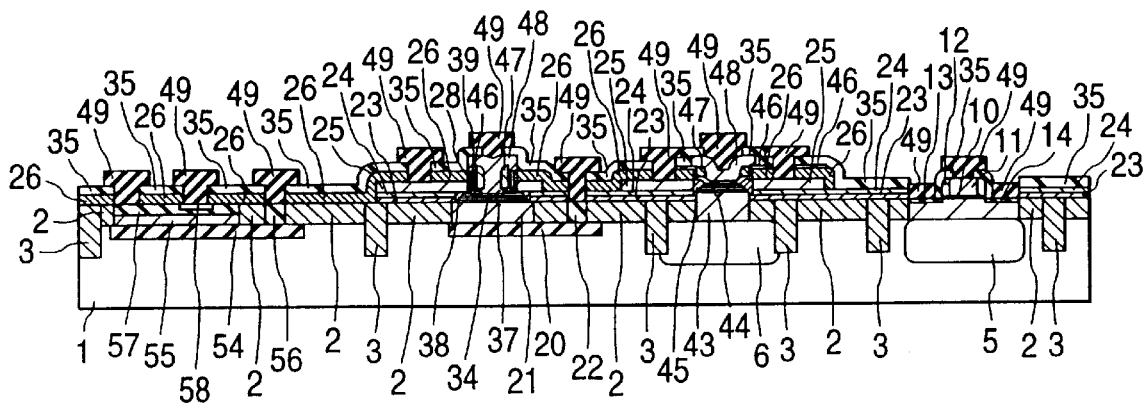
FIG. 36 is a cross sectional view illustrating an eleventh embodiment of a semiconductor device according to the present invention.

FIG. 36 is a cross sectional structural view of an eleventh embodiment of a semiconductor device according to the present invention, which is an example of forming a pMODFET, an nMOSFET and an NPN-type SiGeHBT on one identical substrate.

A complementary type structure can be obtained for both of FET and bipolar transistor by forming a PNP-type bipolar transistor comprising a high concentration p-type buried layer 54, a low concentration p-type collector layer 55, an intrinsic base layer 57 and an emitter layer 58 with no step, on one identical substrate, with an nMODFET, a pMODFET and an NPN-type SiGeHBT formed in the same manner as in other embodiments.

According to this embodiment, since a complementary circuit can be attained also for bipolar transistors in addition to complementary FET balanced for high speed performance and current value, the system using this circuit can be improved in the performance, reduced in the electric power consumption and reduced in the cost.

<Embodiment 12>

Figure 37:
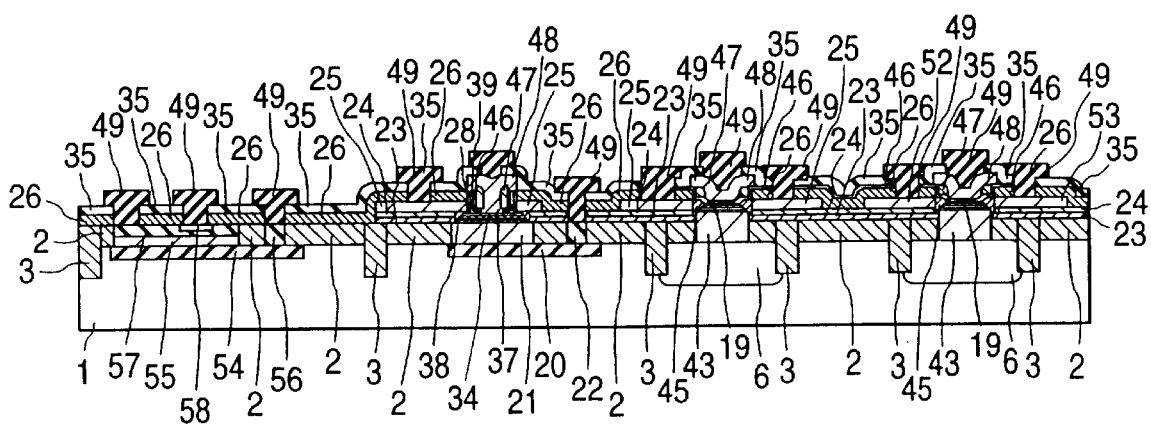
FIG. 37 is a cross sectional view illustrating a twelfth embodiment of a semiconductor device according to the present invention.

FIG. 37 is a cross sectional structural view showing a twelfth embodiment of a semiconductor device according to the present invention, wherein a complementary bipolar transistor with no step is present, which is an example of mounting a cMODFET on the identical substrate. This is different from the Embodiment 11 in that the n-type FET is constituted with the nMODFET. This can increase the operation speed of FET by MODFET and increase the operation speed of the bipolar transistor by SiGeHBT, as well as reduce the electric power consumption by adopting the complementary type constitution for both of them.

According to this embodiment, since the complementary FET and the complementary bipolar transistor can be attained while maintaining high speed performance, the system using this circuit can be improved in the performance, reduced in the electric power consumption and reduced in the cost.

<Embodiment 13>

Figure 38A:
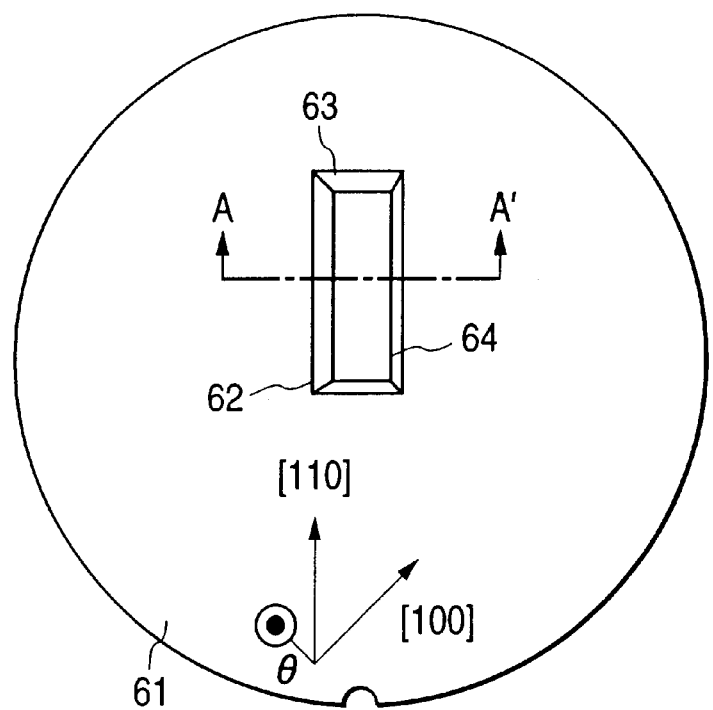
FIG. 38 is a surface plan view and an enlarged cross sectional view illustrating the shape of a single crystal layer formed in an opening of an insulation film with each side being directed to [110] direction, on a slightly inclined substrate.
Figure 38B:
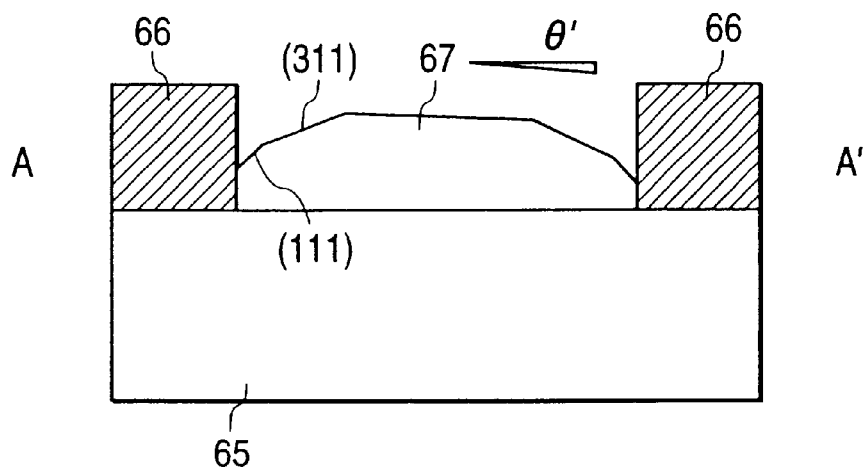
Figure 39A:
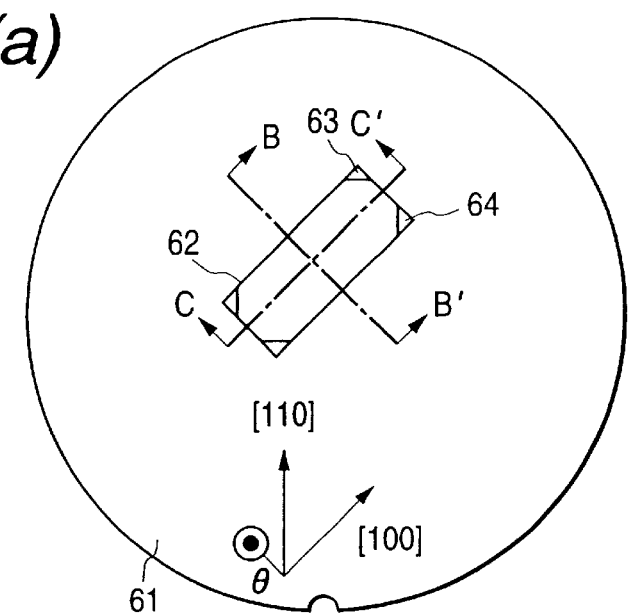
FIG. 39 is a surface plan view and an enlarged cross sectional view illustrating the shape of a single crystal layer formed in an opening of an insulation film with each side being directed to [100] direction, on a slightly inclined substrate.
Figure 39B:
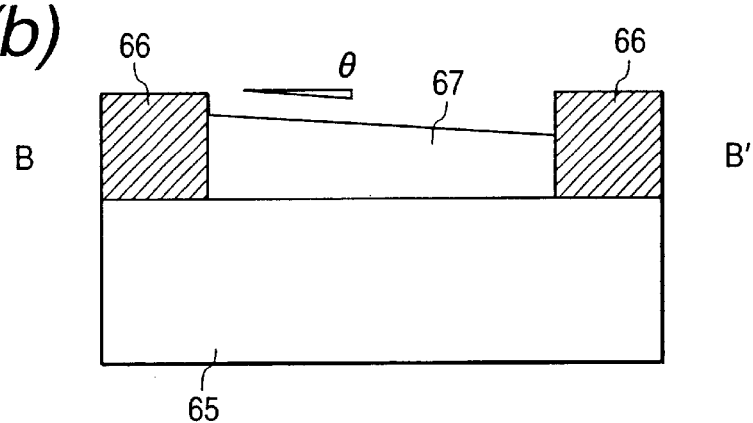
Figure 39C:
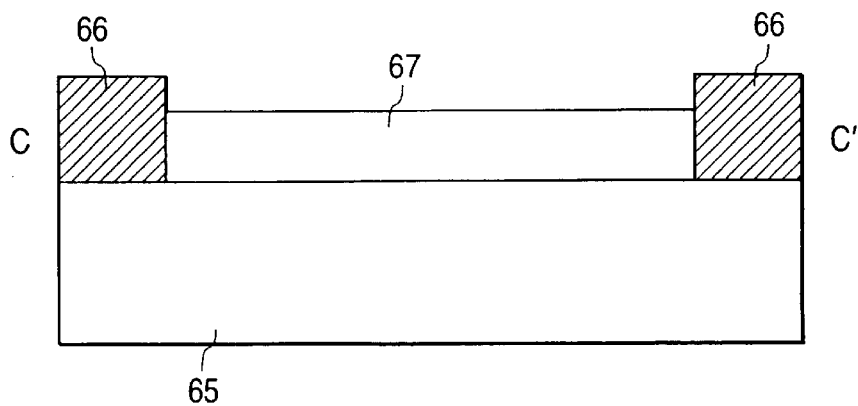

FIG. 38 and FIG. 39 are plan views and a cross sectional structural views illustrating a thirteenth embodiment of a semiconductor device according to the present invention, which is an example of epitaxially growing a single crystal layer selectively to an opening in a silicon oxide film formed on an inclined substrate.

Figure 40:
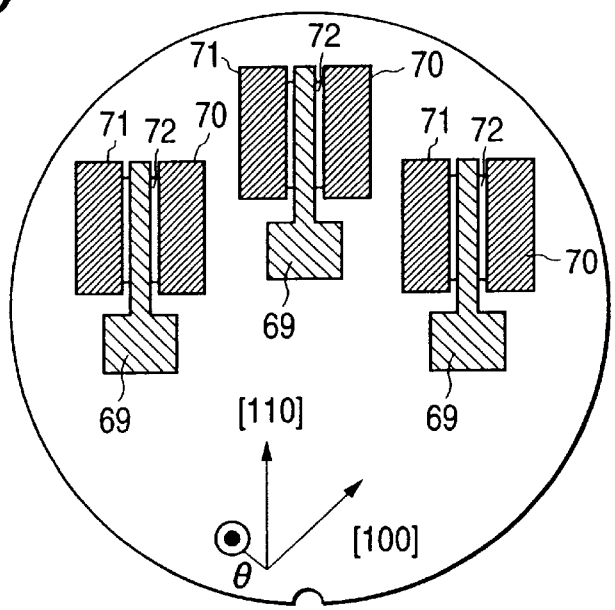
FIG. 40 is a plan view for explaining the arrangement of MODFET formed in an opening of an insulation film with each side being directed to [110] direction, on a slightly inclined substrate.

In epitaxial growth, since the growing proceeds by the movement of molecules of source gas reaching a surface of a substrate along the surface, and decomposition at active sites on the substrate surface, it is important that the growing proceeding active sites are arranged uniformly in order to conduct uniform epitaxial growth over the entire substrate. For this purpose, a method of forming a step at the order of atoms to the surface by displacing the crystal orientation of the substrate by a small angle referred to as an off angle, and proceeding the growing along the step to conduct uniform epitaxial growth, is adopted. However, when selective epitaxial growth is applied to the opening formed on the substrate, since the step at the order of the atom layer is not supplied at the periphery of the opening, the surface of the epitaxial grown layer approaches the original crystal orientation. As a result, the shape of the selectively grown single crystal layer becomes asymmetric, depending on the direction and the amount of the off angle of the crystal plane. For example, as shown in FIG. 38, taking the [100] orientation as the plane orientation of the substrate and taking an off angle $\theta$ in [010] direction, when the opening in the silicon oxide film 66 is formed in a state wherein each side is directed to the [110] orientation within the plane of the substrate 61, the single crystal layer formed by selective epitaxial growth is inclined by an angle of $\theta'$, where $\theta'<\theta$. Further, as shown in FIG. 39, when a single crystal layer is epitaxially grown selectively to the opening formed in a state with each side being directed to [100] orientation, the surface of the single crystal layer is inclined by the same angle as the off angle as viewed along B–B' in the drawing, and is in symmetry as viewed along C–C' in the drawing. When a channel layer and source drain are formed in the single crystal layer formed to the opening by utilizing the asymmetric property, a source or drain in which the parasitic capacitance is intended to be lowered may be formed in the direction of increasing the film thickness. When it is intended to take a balance between them, the source and drain may be formed in a direction perpendicular to the inclination of the single crystal layer. For example, as shown in FIG. 40, by aligning the direction of the opening to the plane orientation of the substrate, since the thickness of the intrinsic region for the MODFET formed by selective epitaxial growth on the side of the drain is increased, the parasitic capacitance can be reduced compared with that in the source. Depending on the circuit structure, if it is intended to reduce the parasitic capacitance in the source, the source and the drain may be replaced with each other. Further, if it is intended to control the relation of the parasitic capacitance between the source and the drain parasitic capacitance on each of the transistors in the circuit, the position to the substrate can be determined for each of the transistors.

In this embodiment, since the parasitic capacitance of the source or the drain can be reduced by utilizing the asymmetricity of the selective growth, the circuit using the FET can be increased in the operation speed.

<Embodiment 14>

Figure 41:
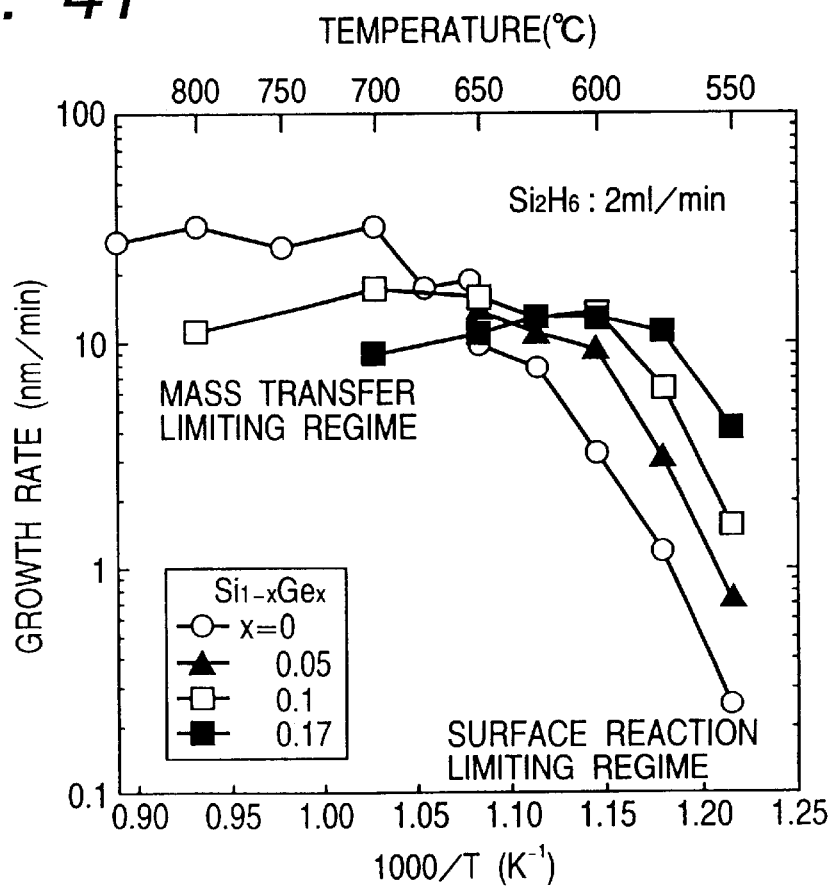
FIG. 41 is a characteristic graph illustrating a relation between a growth rate and a growth temperature of single-crystal silicon and single-crystal silicon-germanium illustrating a fourteenth embodiment of a semiconductor device according to the present invention.

FIG. 41 is a characteristic graph illustrating the dependence of the epitaxial growth rate on the growth temperature in a fourteenth embodiment of a semiconductor device according to the present invention.

For example, when epitaxial growth is conducted by supplying a disilane ($Si_2H_6$) gas at a flow rate of 2 ml/min as a source gas of single-crystal silicon, while the growth rate greatly changes depending on the growing temperature in the lower temperature region, the temperature dependency decreases in the higher temperature region. The low temperature area is referred to as a surface reaction limiting regime in which growth rate is limited by the dissociation of hydrogen from the surface having an activation energy depending on the growth temperature. The activation energy depends on the flow rate of germane ($GeH_4$) as a source gas for germanium, but the growth rate does not change even if the entire gas flow rate is changed, providing that the growth temperature and the gas flow ratio are constant and the entire gas flow rate is not reduced extremely.

On the other hand, the high temperature area is referred to as a mass transfer limiting regime, the growth rate changes depending on the amount of the gas supply even when the temperature is constant. Selective epitaxial gas is possible by controlling the gas flow rate in the surface reaction limiting regime or in the mass transfer limiting regime, but the shape of the epitaxial layer differs greatly.

Figure 42:
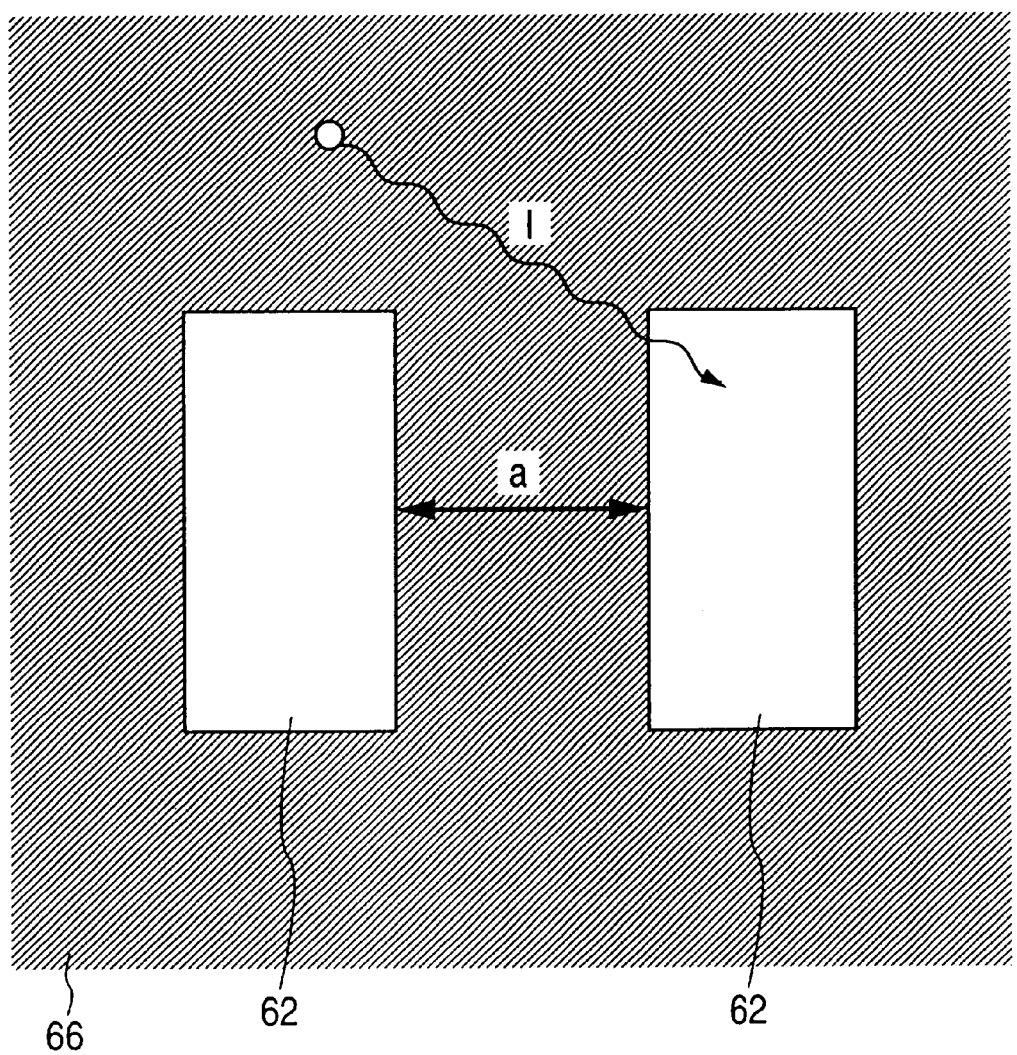
FIG. 42 is a plan view for explaining the dependence of selective growth on the shape of the opening in the present invention.

As shown in FIG. 42, it is assumed that there are a plurality of openings 62 in the silicon oxide film 66 and they are spaced by distance a from each other. Upon selective epitaxial growth to the opening 62, epitaxial growth proceeds when the material gas molecules reaching the surface move therealong and decompose at active sites. Epitaxial growth proceeds when selective growth is conducted in the mass transfer limiting regime, so that if the moving distance of the starting gas is larger than the distance a between each of the openings, the number of starting gas molecules supplied to the openings varies depending on the place. Specifically, the number of the source gas molecules supplied is greatest in a place at the periphery of the open where there is no other open near at hand, so that the epitaxial layer is thickened thereat. On the contrary, the epitaxial layer is thinned at the center of the opening, or at a place where other openings are present densely at the periphery.

Figure 43A:
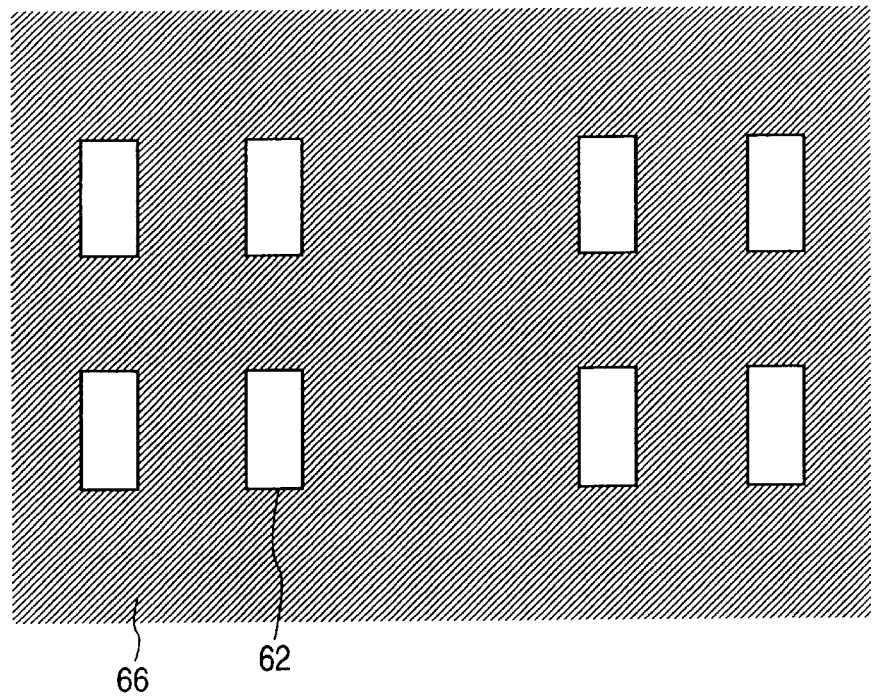
FIG. 43 is a plan view for explaining the dependence of selective growth on the shape of the opening in the present invention.
Figure 43B:
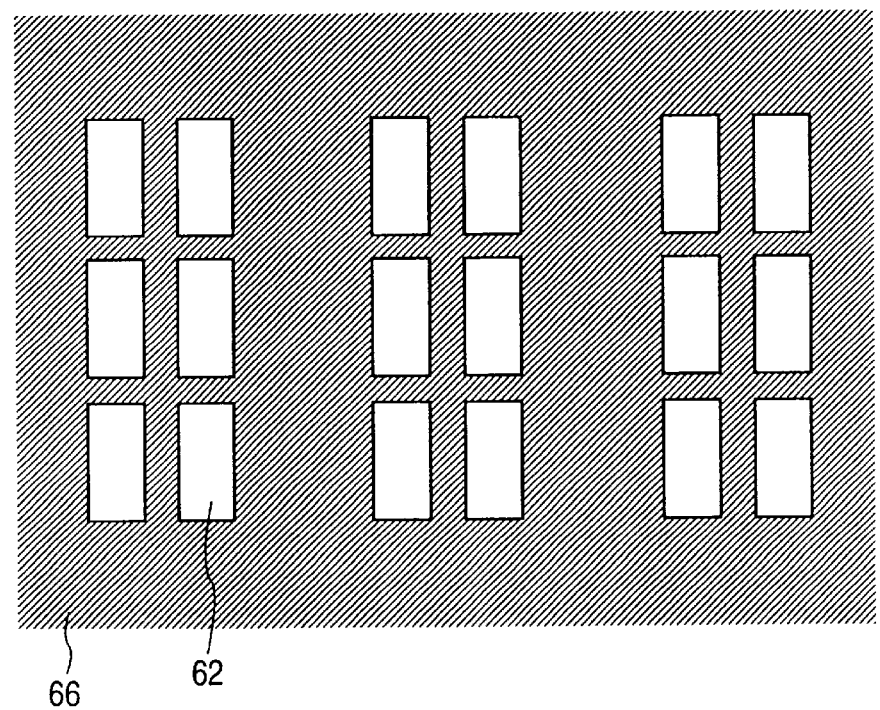

For example, in the pattern shown in FIG. 43, when the distance between the openings is larger than the average moving distance of the starting molecules, and the size of the opening itself is smaller enough than the average moving distance of the starting molecule, as shown in (a), the thickness of the epitaxial layer in each of the openings is made uniform. However, as shown in (b), when the openings are present densely, such that the distance between the openings is equal with or less than the average moving distance of the starting molecules, or if the size of the opening itself is larger than the average moving distance of the starting molecules, the thickness of the epitaxial layer may change depending on the place. On the other hand, when growing is conducted in the surface reaction limiting regime, the thickness is identical so long as the growth temperature is constant at a region containing both of the openings. However, it is assumed that there is no effect of the facet. Accordingly, since the growth rate is determined depending on the reaction at the surface also in the pattern, for example, as shown in FIG. 43(b), where the degree of denseness or the size of the openings are different, the film thickness is constant everywhere so long as the growth temperature is identical.

According to this embodiment, since a uniform epitaxial layer can be formed by conducting selective epitaxial growth in the surface reaction limiting regime, even if the shape and the denseness of the openings forming the transistors are changed, scattering in the performance of the transistors can be reduced. Further, since there is no adverse effect even when the openings are arranged densely in the pattern, the transistors can be integrated, and the circuit using the transistors can be reduced in the electric consumption power and improved in the performance.

<Embodiment 15>

Figure 44:
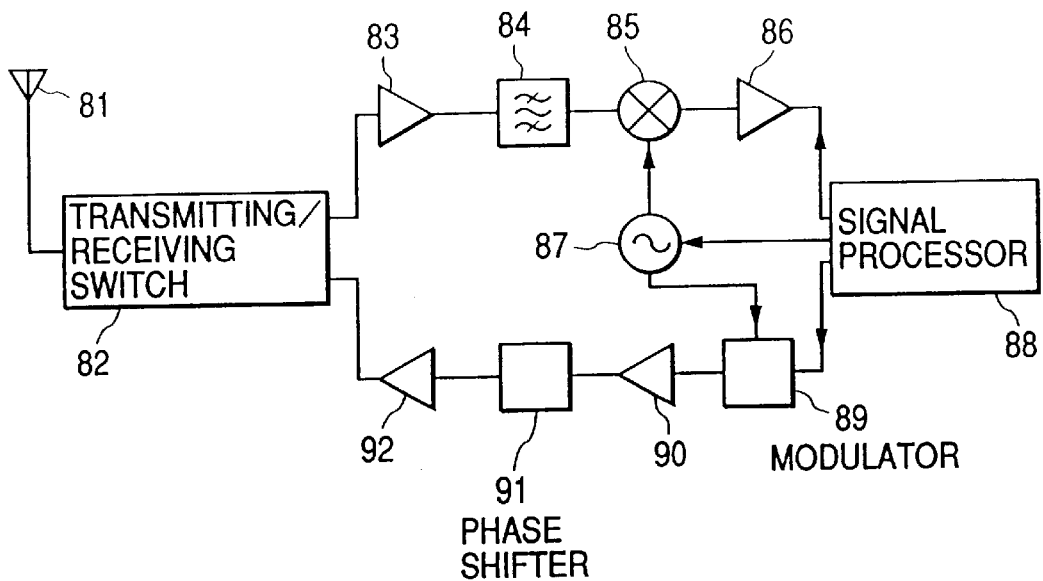
FIG. 44 is a block diagram of a mobile communication system illustrating a fifteenth embodiment of a semiconductor device according to the present invention.
Figure 45:
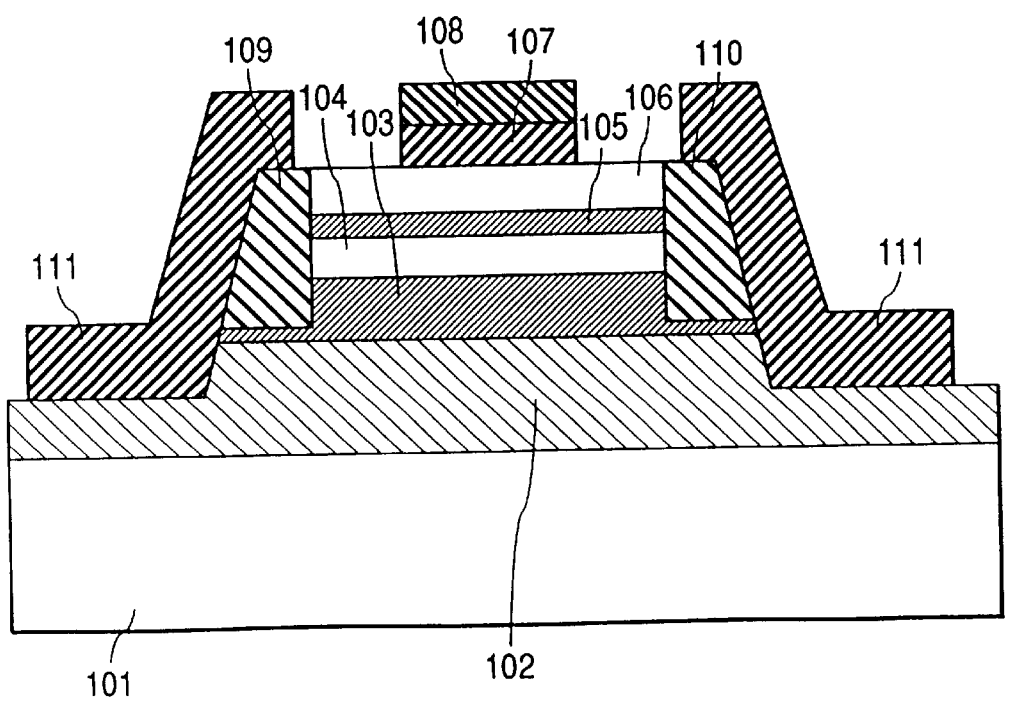
FIG. 45 is a cross sectional view illustrating an existent pMODFET in which p-channel is formed in a multi-layered film comprising single-crystal silicon and single-crystal silicon-germanium.
Figure 46:
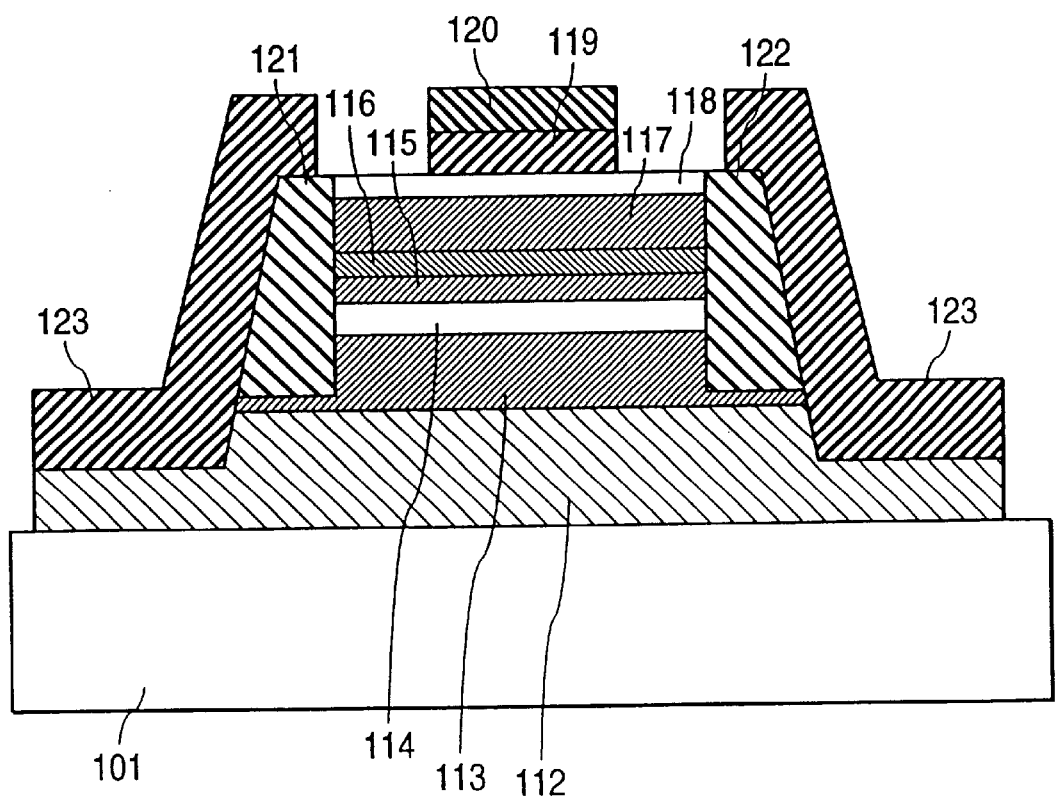
FIG. 46 is a cross sectional view illustrating an existent nMODFET in which n-channel is formed in a multi-layered film comprising single-crystal silicon and single-crystal silicon-germanium.
Figure 47:
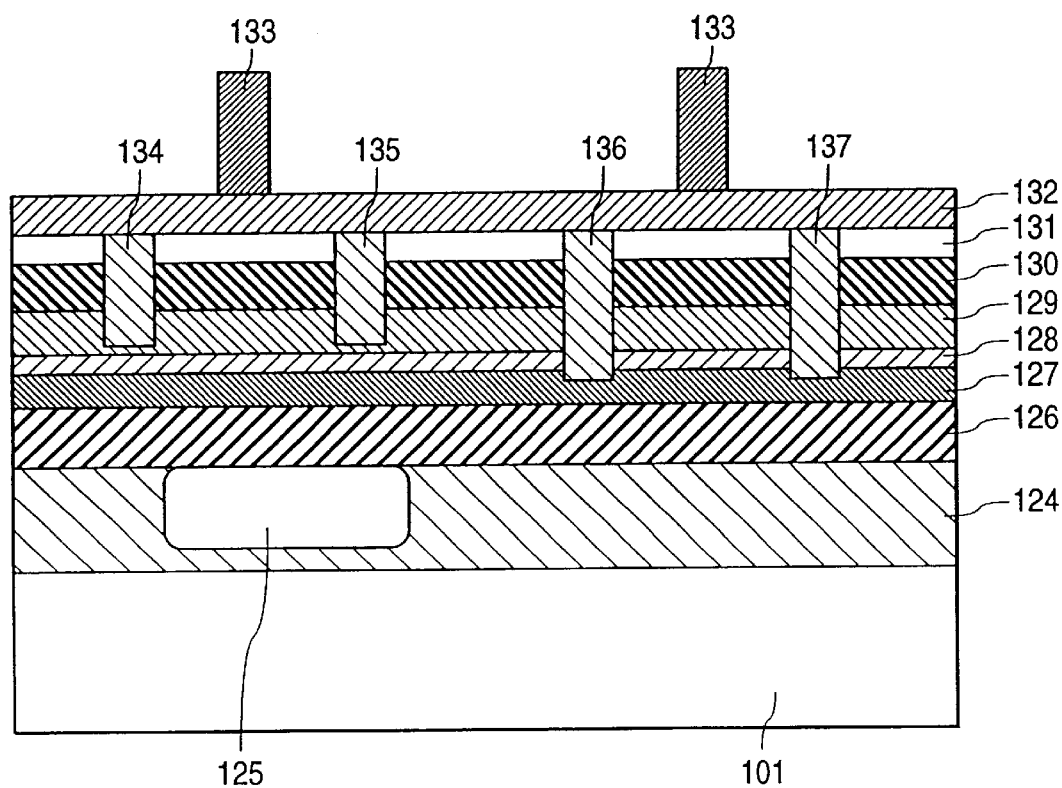
FIG. 47 is a cross sectional view illustrating an existent cMODFET in which n-channel and p-channel are formed in a multi-layered film comprising single-crystal silicon and single-crystal silicon-germanium.
Figure 48:
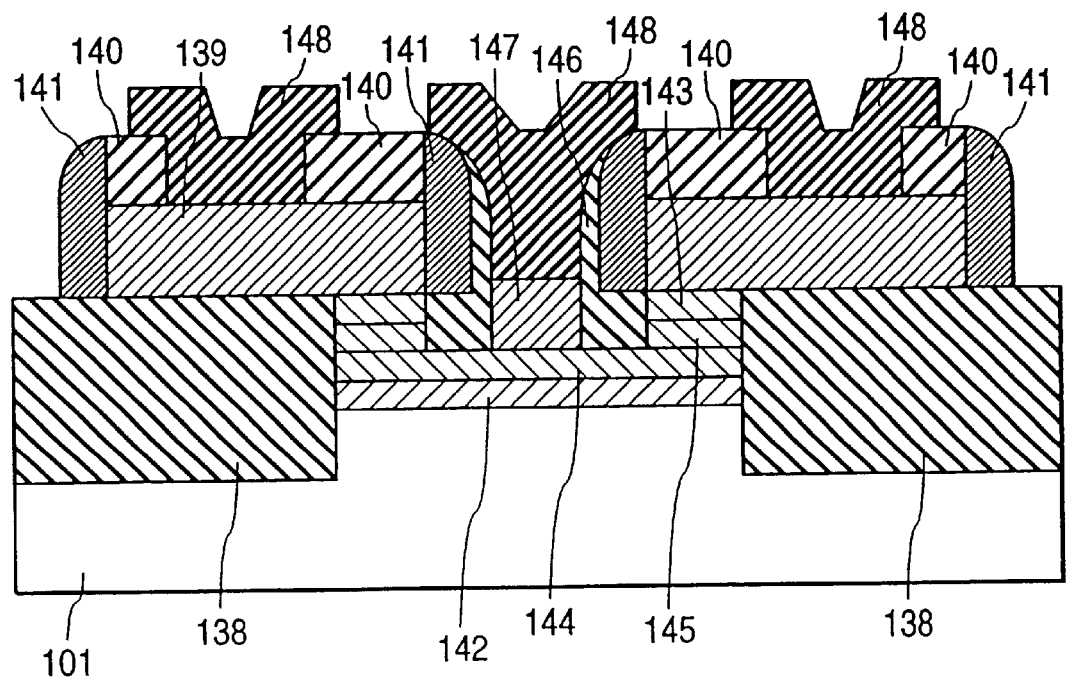
FIG. 48 is a cross sectional view illustrating an existent FET using a single-crystal silicon-germanium layer formed by selective growth as n-channel.
Figure 49A:
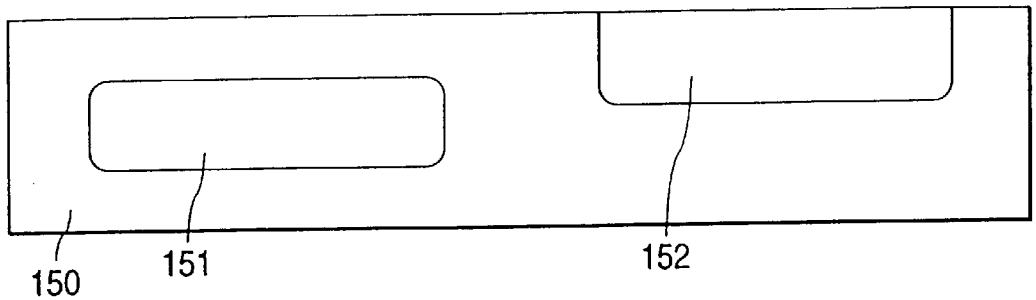
FIG. 49 is an enlarged cross sectional view illustrating a method of manufacturing an existent semiconductor device in which pMODFET and silicon MOSFET are formed on one identical substrate.
Figure 49B:
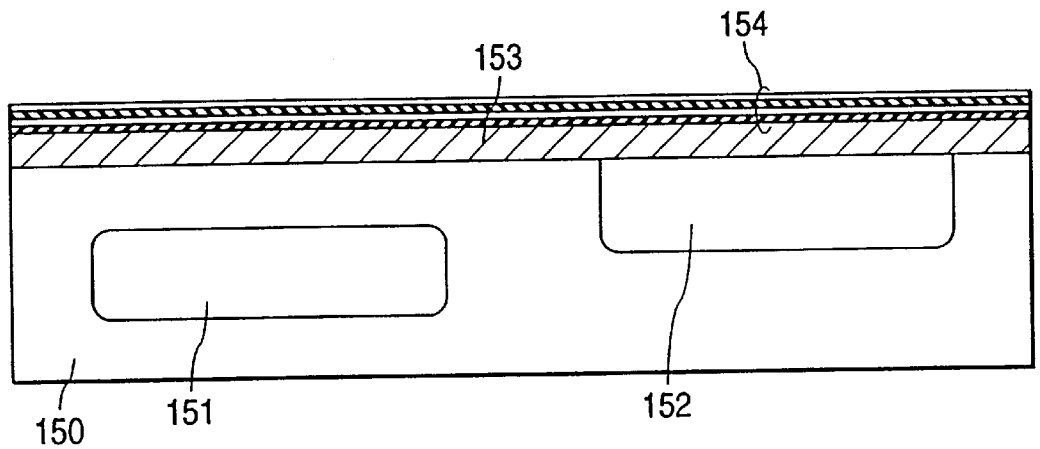
Figure 49C:
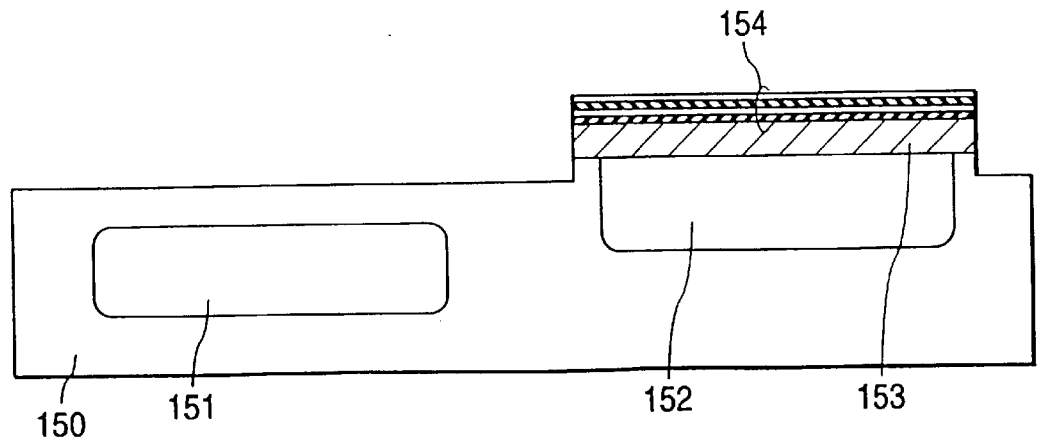
Figure 50A:
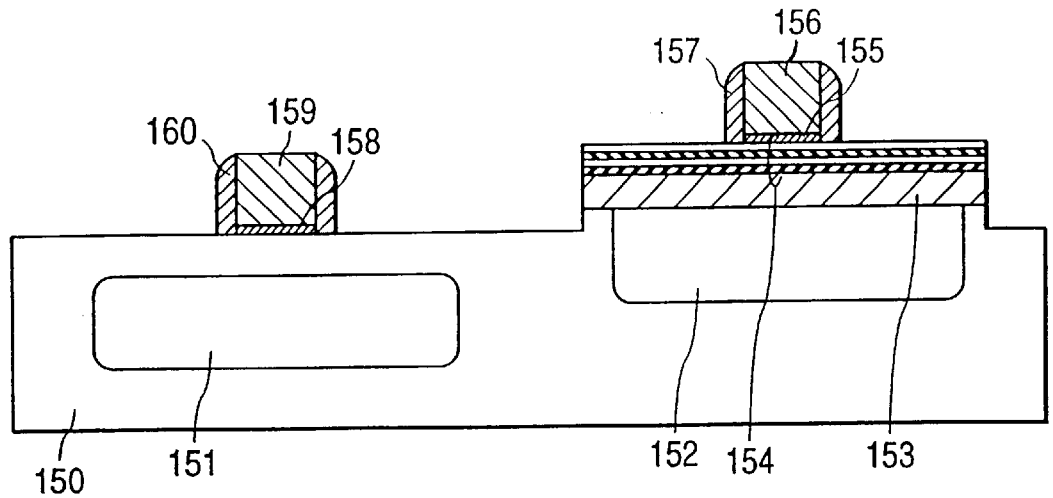
FIG. 50 is an enlarged cross sectional view illustrating steps after FIG. 49 sequentially.
Figure 50B:
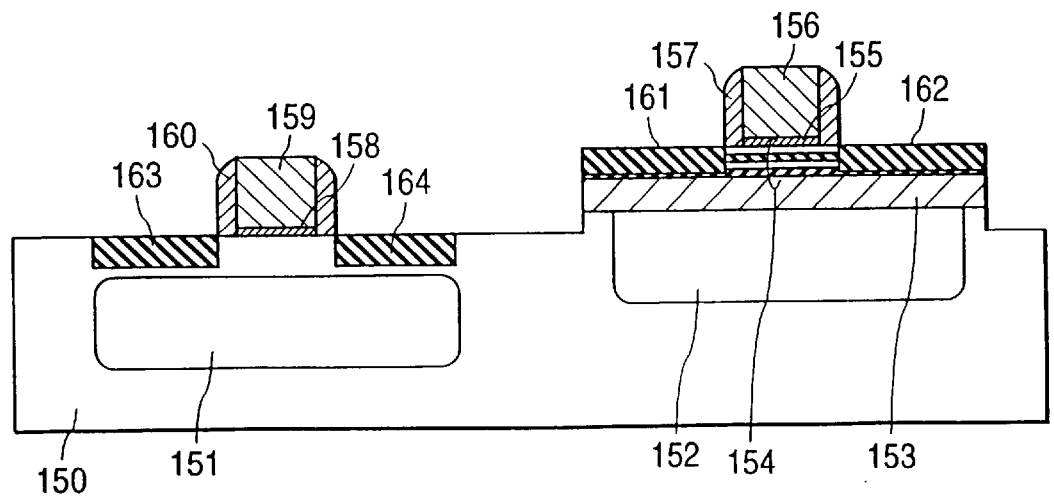
Figure 51A:
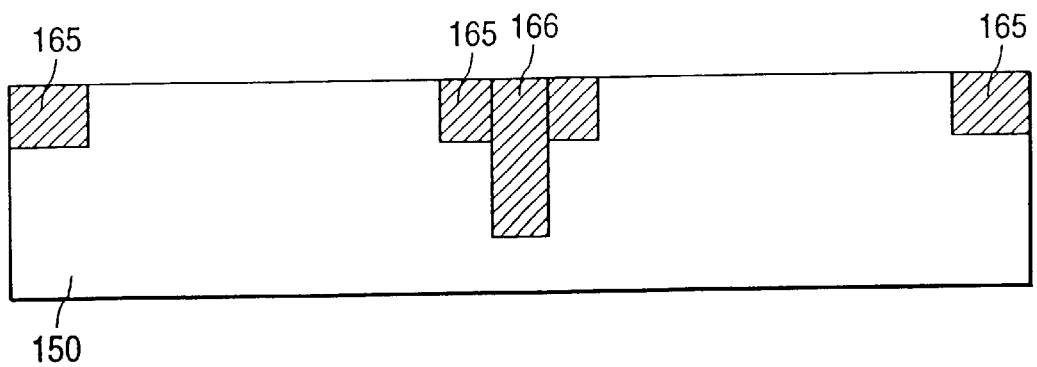
FIG. 51 is an enlarged cross sectional view illustrating a second manufacturing method of an existent semiconductor device in which pMODFET and silicon MOSFET are formed on one identical substrate.
Figure 51B:
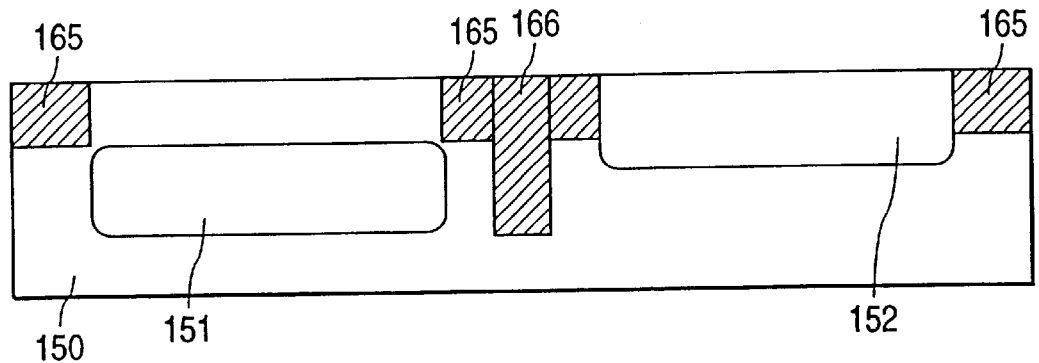
Figure 51C:
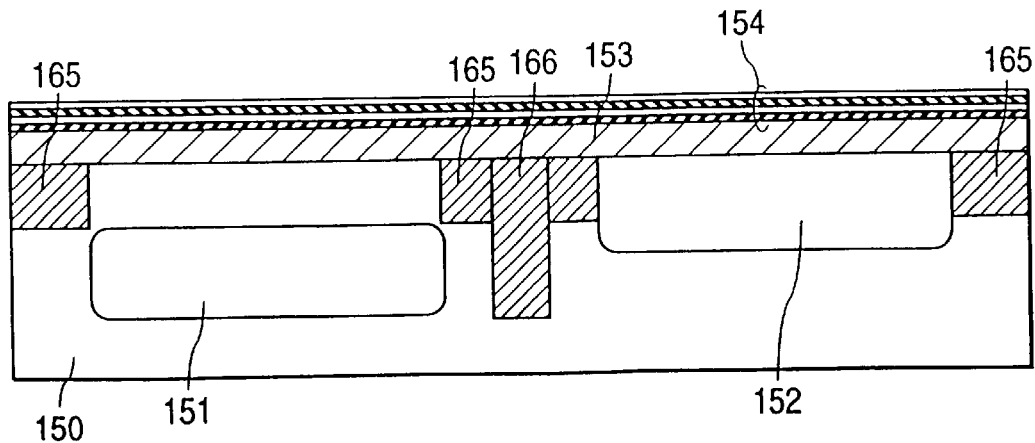
Figure 52A:
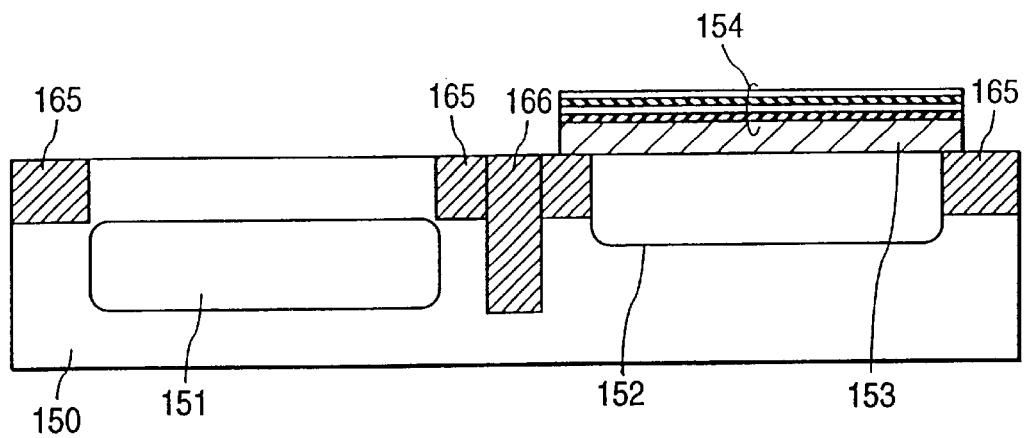
FIG. 52 is an enlarged cross sectional view illustrating steps after FIG. 51 sequentially.
Figure 52B:
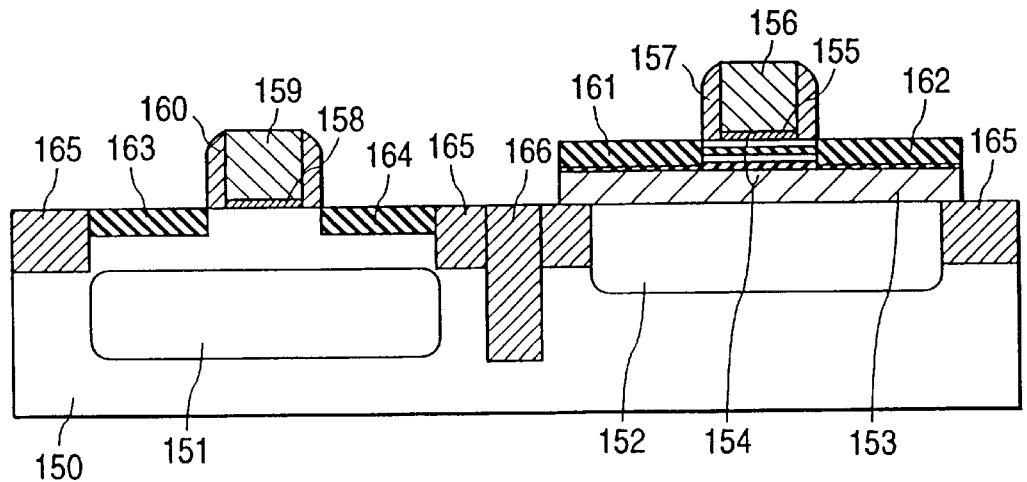

FIG. 44 is a block diagram of a wireless communication equipment device showing a fifteenth embodiment of a semiconductor device according to the present invention.

In a usual wireless communication equipment device, signals received on an antenna 81 are inputted by way of a transmitting/receiving switch 82 into a preamplifier 83, and then amplified. For the output from the preamplifier, only the signals in a received frequency band are selected by a filter 84 and inputted to a mixer 85. Signals converted to an intermediate frequency (IF) by the mixer 85 are amplified in an IF amplifier 86 and then outputted to a signal processor 88.

On the other hand, in a transmitting system, signals modulated by a modulator 89 are passed through a filter or driver amplifier 90, and a phase shifter 91, and amplified by a power amplifier 92, and transmitted from the antenna 81.

When the MODFET of the present invention is applied to the system described above, the entire system can be improved in the performance and reduced in the cost by applying the MODFET to a portion particularly requiring high speed operation, such as the preamplifier 83, and using the MOSFET to a different portion, such as the signal processor 88.

According to the present invention, a buffer layer or a multi-layered film comprising the buffer layer and single-crystal silicon and single-crystal silicon-germanium of a MODFET, is formed selectively in a groove formed in a semiconductor substrate, and the MODFET can easily be mounted together with other device(s) formed in other regions of one identical semiconductor substrate, with no effect between each of the devices, so that the performance of a circuit using such devices can be improved. Further, since there is no step between each of the devices when the MODFET is mounted together with other device(s), each of the devices can be fabricated in a reduced size, and the distance between the devices can be decreased to enable high degree of integration.

Further, since the step and the distance between each of the devices is small, the interconnection length can be shortened to enable reduction in electric power consumption. Further, when the devices are mounted together, since the processes for forming the MODFET and each of the devices in the present invention can be applied in common, the cost for forming a system can be reduced.

Accordingly, when the semiconductor device according to the present invention is used to the circuit or system particularly requiring high speed operation or reduced noises, the performance for the entire circuit or the system can be improved.

Those of ordinary skill in the art will recognize that many modifications and variations of the present invention may be implemented. The foregoing description and the following claims are intended to cover all such modifications and variations.

What is claimed is:

1. A semiconductor device having a first region and a second region, comprising:
   a silicon substrate;
   a MOSFET formed in said first region; and
   a MODFET formed in said second region; and
   a field insulation film formed between said first region and said second region;
   wherein said MOSFET is formed on said silicon substrate, and wherein a groove us formed by a side of said field insulation film and aim upper surface of said silicon substrate in said second region, and wherein an intrinsic region of said MODFET is formed on said silicon substrate in said second region and in said groove, and wherein said MODFET is formed on said intrinsic region, and wherein an upper surface of said silicon substrate in said first region is higher than the upper surface in said second region.

2. The semiconductor device of claim 1, wherein a height of the upper surface of said first region is approximately equal to a height of an upper surface of the intrinsic region.

3. The semiconductor device of claim 2, wherein a silicon nitride film is formed between said field insulation film and said intrinsic region.

4. The semiconductor device of claim 1, wherein the intrinsic region comprises: a multi-layered film, comprising: a buffer layer; a single-crystal silicon layer laminated on the buffer layer; amid a single-crystal silicon-germanium layer laminated on the buffer layer.

5. The semiconductor device of claim 4 wherein said MODFET comprises a P-type MODFET, and wherein time multi-layered film comprises:
- a carrier supply layer comprising a said single-crystal silicon-germanium layer;
- a spacer layer comprising a single-crystal silicon-germanium;
- a channel layer comprising an undoped single-crystal silicon-germanium; and
- a cap layer comprising a said single-crystal silicon layer.

6. The semiconductor device of claim 4 wherein the channel layer comprises a single-crystal silicon-germanium undergoing compressive strain.

7. A semiconductor device, comprising:
- a single semiconductor substrate having thereon a surface region;
- at least one non-MODFET transistor; amid
- a P-type MODFET, wherein said P-type MODFET amid said at least one non-MODFET transistor, are formed on said single semiconductor substrate, wherein an intrinsic region of said P-type MODFET is formed in a groove in said surface region, and wherein said P-type MODFET comprises:
  a multi-layered film, comprising:
  - a buffer layer;
  - a single-crystal silicon layer laminated on the buffer layer;
  - a single-crystal silicon-germanium layer laminated on the buffer layer;
  - a first spacer layer comprising said single crystal silicon-germanium layer;
  - a channel layer comprising an undoped single-crystal silicon-germanium;
  - a second spacer layer comprising a single-crystal silicon-germanium;
  - a carrier supply layer comprising a single-crystal silicon-germanium; and
  - a cap layer comprising said single-crystal silicon layer.

8. The semiconductor device of claim 7, wherein the channel layer comprises a single-crystal silicon-germanium undergoing compressive strain.

* * * * *